US012784839B2

(12) United States Patent
Tokutomi et al.

(10) Patent No.: US 12,784,839 B2
(45) Date of Patent: Nov. 3, 2026

(54) MEMORY SYSTEM

(71) Applicant: Kioxia Corporation, Tokyo (JP)

(72) Inventors: Tsukasa Tokutomi, Kamakura (JP); Masanobu Shirakawa, Chigasaki (JP); Kengo Kurose, Tokyo (JP); Marie Takada, Yokohama (JP); Ryo Yamaki, Yokohama (JP); Kiyotaka Iwasaki, Yokohama (JP); Yoshihisa Kojima, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 122 days.

(21) Appl. No.: 18/815,516

(22) Filed: Aug. 26, 2024

(65) Prior Publication Data

US 2024/0420778 A1 Dec. 19, 2024

Related U.S. Application Data

(63) Continuation of application No. 17/452,463, filed on Oct. 27, 2021, now Pat. No. 12,094,541, which is a (Continued)

(30) Foreign Application Priority Data

Sep. 14, 2018 (JP) ................................ 2018-172736

(51) Int. Cl.
*G11C 16/26* (2006.01)
*G06F 3/06* (2006.01)
(Continued)

(52) U.S. Cl.
CPC ........... *G11C 16/26* (2013.01); *G06F 3/0604* (2013.01); *G06F 3/0659* (2013.01);
(Continued)

(58) Field of Classification Search
CPC ................ G11C 16/26; G11C 11/5671; G11C 16/0483; G11C 29/52; G11C 16/08;
(Continued)

(56) References Cited

U.S. PATENT DOCUMENTS 8,621,266 B2 12/2013 Kang
8,624,266 B2 1/2014 Harada
(Continued)

FOREIGN PATENT DOCUMENTS

JP 2015-133161 7/2015
WO WO 2018/003050 A1 1/2018

*Primary Examiner* — Viet Q Nguyen
(74) *Attorney, Agent, or Firm* — Oblon, McClelland, Maier & Neustadt, L.L.P.

(57) ABSTRACT

According to one embodiment, a memory system includes a nonvolatile memory and a memory controller. The memory controller is configured: to store, in a buffer, a data set read from a cell unit, and an expected data set generated by an error correction on the data set; to count a number of first and second memory cells corresponding to a first and a second combination of data in the data set and the expected data set, respectively, among the memory cells in the cell unit; to calculate a shift amount of a read voltage used in a read operation from the cell unit, based on the number of the first and second memory cells; and to apply the shift amount to a next read operation from the first cell unit.

13 Claims, 41 Drawing Sheets

Related U.S. Application Data continuation of application No. 16/298,125, filed on Mar. 11, 2019, now Pat. No. 11,195,585.

(51) Int. Cl.

| | |
|---|---|
| ***G06F 11/10*** | (2006.01) |
| ***G11C 11/56*** | (2006.01) |
| ***G11C 16/04*** | (2006.01) |
| ***G11C 29/52*** | (2006.01) |
| *G11C 16/08* | (2006.01) |
| *H10B 43/27* | (2023.01) |
| *H10B 43/35* | (2023.01) |

(52) U.S. Cl.

CPC ........ *G06F 3/0679* (2013.01); *G06F 11/1068* (2013.01); *G11C 11/5671* (2013.01); *G11C 16/0483* (2013.01); *G11C 29/52* (2013.01); *G11C 16/08* (2013.01); *H10B 43/27* (2023.02); *H10B 43/35* (2023.02)

(58) Field of Classification Search

CPC .... G06F 3/0604; G06F 3/0659; G06F 3/0679; G06F 11/1068; H10B 43/35; H10B 43/27

USPC .......................................................... 711/103

See application file for complete search history.

(56) References Cited

U.S. PATENT DOCUMENTS

| | | | | |
|---|---|---|---|---|
| 9,047,974 | B2 | 6/2015 | Huang | |
| 9,256,522 | B1 | 2/2016 | Tang | |
| 9,595,318 | B2 | 3/2017 | Hyun | |
| 9,761,308 | B1 | 9/2017 | Cometti | |
| 9,966,147 | B1 | 5/2018 | Lien | |
| 10,055,294 | B2 | 8/2018 | Hyun | |
| 10,803,930 | B2 * | 10/2020 | Kiyooka | G11C 16/26 |
| 10,866,860 | B2 * | 12/2020 | Kurose | G11C 11/5642 |
| 11,099,931 | B2 * | 8/2021 | Kurose | G06F 11/1068 |
| 11,195,585 | B2 * | 12/2021 | Tokutomi | G06F 3/0659 |
| 11,410,725 | B2 * | 8/2022 | Shirakawa | G11C 11/5628 |
| 11,609,814 | B2 | 3/2023 | Kurose | |
| 11,636,914 | B2 | 4/2023 | Takada | |
| 11,698,834 | B2 | 7/2023 | Kurose | |
| 12,062,400 | B2 * | 8/2024 | Shimada | G11C 11/5642 |
| 12,094,541 | B2 * | 9/2024 | Tokutomi | G06F 3/0679 |
| 12,117,902 | B2 * | 10/2024 | Kurose | G11C 16/0483 |
| 12,366,966 | B2 * | 7/2025 | Nakagawa | G06F 3/0613 |
| 2009/0003058 | A1 | 1/2009 | Kang | |
| 2009/0003073 | A1 | 1/2009 | Rizel | |
| 2009/0267128 | A1 | 10/2009 | Maejima | |
| 2009/0268522 | A1 | 10/2009 | Maejima | |
| 2009/0300271 | A1 | 12/2009 | Yang | |
| 2010/0207195 | A1 | 8/2010 | Fukuzumi et al. | |
| 2011/0284946 | A1 | 11/2011 | Kiyotoshi | |
| 2012/0008386 | A1 | 1/2012 | Chilappagari | |
| 2012/0144267 | A1 | 6/2012 | Yeh et al. | |
| 2013/0132652 | A1 | 5/2013 | Wood | |
| 2013/0318420 | A1 | 11/2013 | Seol | |
| 2014/0043903 | A1 | 2/2014 | Ok | |
| 2014/0068365 | A1 | 3/2014 | Chen | |
| 2014/0169102 | A1 | 6/2014 | Sun | |
| 2014/0173172 | A1 | 6/2014 | Yang | |
| 2014/0204671 | A1 | 7/2014 | Sharon | |
| 2015/0019934 | A1 | 1/2015 | Chae | |
| 2015/0074492 | A1 | 3/2015 | Shono | |
| 2015/0085573 | A1 | 3/2015 | Sharon | |
| 2015/0262688 | A1 | 9/2015 | Minagawa | |
| 2015/0279474 | A1 | 10/2015 | Shimura | |
| 2017/0148510 | A1 | 5/2017 | Bazarsky | |
| 2017/0271031 | A1 | 9/2017 | Sharon | |
| 2017/0300252 | A1 | 10/2017 | Yim et al. | |
| 2018/0090212 | A1 | 3/2018 | Konno et al. | |
| 2018/0261296 | A1 | 9/2018 | Choi | |
| 2018/0268919 | A1 | 9/2018 | Lee | |
| 2019/0267054 | A1 | 8/2019 | Thalaimalaivanaraj | |
| 2019/0267099 | A1 | 8/2019 | Yoo | |
| 2019/0325969 | A1 | 10/2019 | Hong | |
| 2019/0391865 | A1 | 12/2019 | Cadloni | |
| 2020/0075118 | A1 | 3/2020 | Chew | |
| 2023/0093199 | A1 | 3/2023 | Roy | |
| 2023/0259287 | A1 * | 8/2023 | Takada | G11C 16/08 711/103 |
| 2023/0395198 | A1 | 12/2023 | Strauss | |

* cited by examiner

| Page | Data | | | |
|---|---|---|---|---|
| Upper | 1 | 0 | 0 | 1 |
| Lower | 1 | 1 | 0 | 0 |

| CH | Chip | BLK | WL | SU | Shift amount (DAC value) | | |
|---|---|---|---|---|---|---|---|
| | | | | | AR | BR | CR |
| 0 | 0 | 0 | 0 | 0 | +8 | +2 | −7 |
| 0 | 0 | 0 | 0 | 1 | +7 | +1 | −6 |
| 0 | 0 | 0 | 0 | 2 | +5 | −1 | −8 |
| 0 | 0 | 0 | 0 | 3 | +8 | +2 | −5 |
| 0 | 0 | 0 | 1 | 0 | 0 | 0 | 0 |
| 0 | 0 | 0 | 1 | 1 | 0 | 0 | 0 |
| 0 | 0 | 0 | 1 | 2 | 0 | 0 | 0 |
| 0 | 0 | 0 | 1 | 3 | 0 | 0 | 0 |
| ⋮ | ⋮ | ⋮ | ⋮ | ⋮ | ⋮ | ⋮ | ⋮ |
| 0 | 0 | 1 | 0 | 0 | 0 | 0 | 0 |
| ⋮ | ⋮ | ⋮ | ⋮ | ⋮ | ⋮ | ⋮ | ⋮ |
| 0 | 1 | 0 | 0 | 0 | 0 | 0 | 0 |
| ⋮ | ⋮ | ⋮ | ⋮ | ⋮ | ⋮ | ⋮ | ⋮ |
| 1 | 0 | 0 | 0 | 0 | 0 | 0 | 0 |
| ⋮ | ⋮ | ⋮ | ⋮ | ⋮ | ⋮ | ⋮ | ⋮ |

| Chip | BLK | WL | SU | Shift amount (DAC value) | | | Priority patrol flag | | Patrol count value |
|---|---|---|---|---|---|---|---|---|---|
| | | | | AR | BR | CR | Lower page | Upper page | |
| 0 | 0 | 0 | 0 | +8 | +2 | −7 | | ○ | 1 |
| 0 | 0 | 0 | 1 | +7 | +1 | −6 | | | |
| 0 | 0 | 0 | 2 | +5 | −1 | −8 | | | |
| 0 | 0 | 0 | 3 | +8 | +2 | −5 | | | |
| 0 | 0 | 1 | 0 | 0 | 0 | 0 | | | |
| 0 | 0 | 1 | 1 | 0 | 0 | 0 | | | |
| 0 | 0 | 1 | 2 | 0 | 0 | 0 | | | |
| 0 | 0 | 1 | 3 | 0 | 0 | 0 | | | |
| ⋮ | ⋮ | ⋮ | ⋮ | ⋮ | ⋮ | ⋮ | | | |
| 0 | 1 | 0 | 0 | 0 | 0 | 0 | | | |
| ⋮ | ⋮ | ⋮ | ⋮ | ⋮ | ⋮ | ⋮ | | | |
| 1 | 0 | 0 | 0 | 0 | 0 | 0 | | | |
| ⋮ | ⋮ | ⋮ | ⋮ | ⋮ | ⋮ | ⋮ | | | |

F I G. 15

| Page | Data | | | | | | | |
|---|---|---|---|---|---|---|---|---|
| Upper | 1 | 1 | 1 | 0 | 0 | 0 | 0 | 1 |
| Middle | 1 | 1 | 0 | 0 | 1 | 1 | 0 | 0 |
| Lower | 1 | 0 | 0 | 0 | 0 | 1 | 1 | 1 |

| Page | Data | | | | | | | | | | | | | | | |
|---|---|---|---|---|---|---|---|---|---|---|---|---|---|---|---|---|
| Top | 1 | 1 | 1 | 1 | 1 | 0 | 0 | 0 | 0 | 0 | 1 | 1 | 0 | 0 | 0 | 1 |
| Upper | 1 | 1 | 0 | 0 | 0 | 0 | 0 | 0 | 1 | 1 | 1 | 1 | 1 | 1 | 0 | 0 |
| Middle | 1 | 1 | 1 | 0 | 0 | 0 | 0 | 1 | 1 | 0 | 0 | 0 | 0 | 1 | 1 | 1 |
| Lower | 1 | 0 | 0 | 0 | 1 | 1 | 0 | 0 | 0 | 0 | 0 | 1 | 1 | 1 | 1 | 1 |

MEMORY SYSTEM

CROSS-REFERENCE TO RELATED APPLICATIONS

This application is a continuation of and claims benefit under 35 U.S.C. § 120 to U.S. patent Ser. No. 17/452,463, filed Oct. 27, 2021, which is a continuation of and claims benefit under 35 U.S.C. § 120 to U.S. application Ser. No. 16/298,125, filed Mar. 11, 2019, now U.S. Pat. No. 11,195,585, which is based upon and claims the benefit of priority under 35 U.S.C. § 119 from Japanese Patent Application No. 2018-172736, filed Sep. 14, 2018, the entire contents of which are incorporated herein by reference.

FIELD

Embodiments described herein relate generally to a memory system.

BACKGROUND

There is known a memory system including a NAND flash memory as a semiconductor memory device, and a memory controller which controls the semiconductor memory device.

BRIEF DESCRIPTION OF THE DRAWINGS

FIG. 15 schematically illustrates a history table stored in a memory controller for the memory system according to a second modification of the first embodiment.

DETAILED DESCRIPTION

Figure 1:
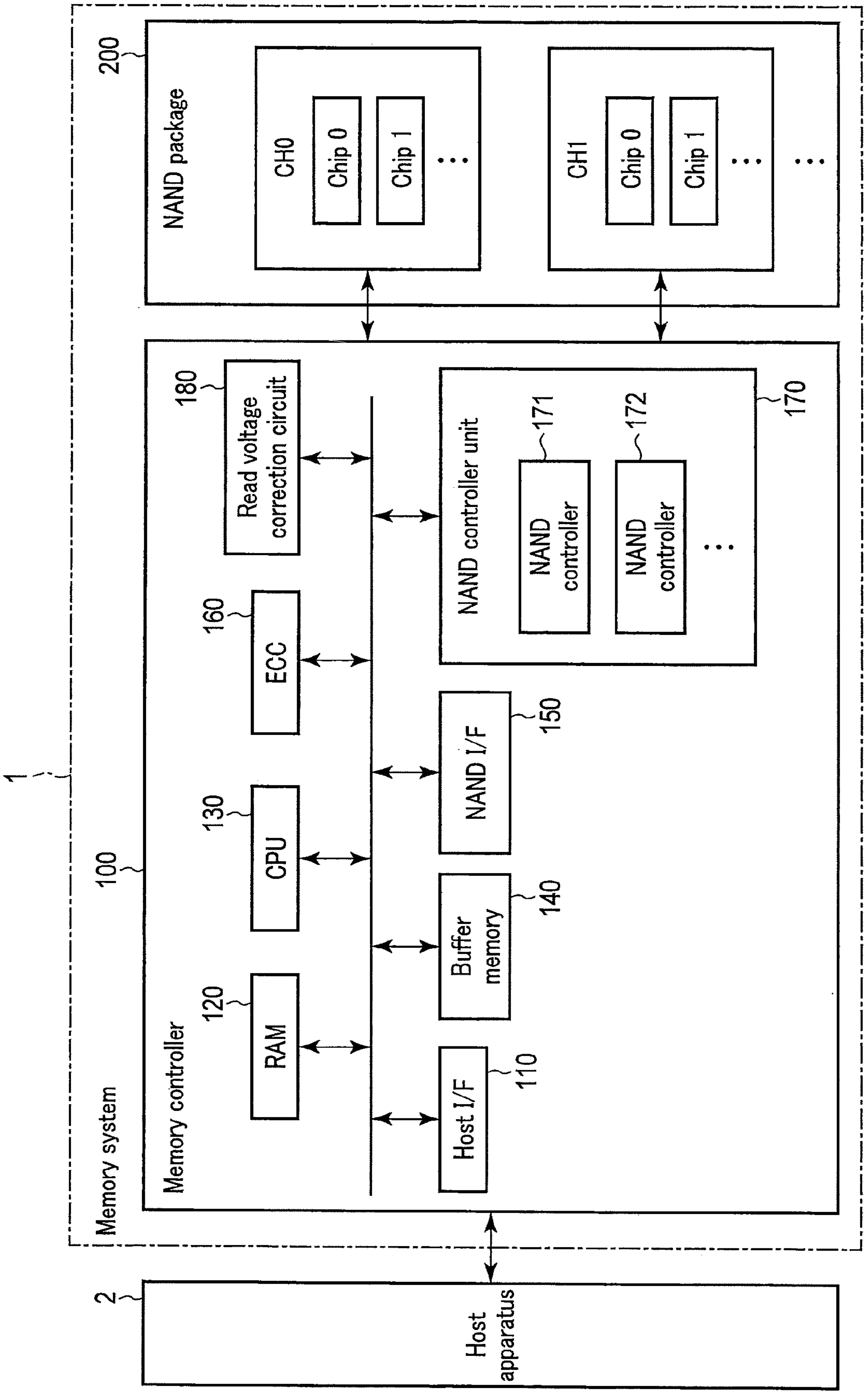
FIG. 1 illustrates a block diagram of a memory system according to a first embodiment.

In general according to one embodiment, a memory system includes a first nonvolatile memory including a memory cell array which includes a plurality of cell units each including a plurality of memory cells and a memory controller. The memory controller is configured: to store, in a first buffer, a first data set read from a first cell unit of the cell units in the first nonvolatile memory, and a first expected data set generated by an error correction on the first data set; to count a number of first memory cells corresponding to a first combination of data in the first data set and the first expected data set, and a number of second memory cells corresponding to a second combination of the data in the first data set and the first expected data set, among the memory cells in the first cell unit; to calculate a shift amount of a read voltage which is used in a read operation of reading data from the first cell unit, based on the counted number of the first memory cells and the counted number of the second memory cells; and to apply the shift amount to a next read operation of reading data from the first cell unit.

Embodiments will be described with reference to the accompanying drawings. In the description below, elements or features having like functions and configurations are denoted by like reference numerals. In addition, to distinguish a plurality of elements or features having a common reference numeral, subscripts are added to the common reference numeral. If distinction between the plurality of elements or features is not required, the plurality of elements or features are denoted by the common reference numeral alone, without subscripts being added.

1. First Embodiment

A memory system according to a first embodiment will be described. Hereinafter, a memory system including a NAND flash memory as a nonvolatile memory, and a memory controller which controls the NAND flash memory will be presented by way of example.

1.1 Configuration

1.1.1 Configuration of the Memory System

A configuration of the memory system according to the first embodiment will be described with reference to FIG. 1.

As illustrated in FIG. 1, a memory system 1 includes a memory controller 100 and a NAND package 200. The memory controller 100 and NAND package 200 may be integrated into a single semiconductor device. Examples of such a semiconductor device include a memory card such as an SD™ card, and a solid state drive (SSD).

The memory controller 100 is connected to a host apparatus 2 via a host bus. In addition, the memory controller 100 controls the NAND package 200. The memory controller 100 also accesses the NAND package 200 in response to an instruction which is received from the host apparatus 2. The host apparatus 2 may be, for example, a digital camera or a personal computer, and the host bus may be a bus complying with, for example, the SD™ interface, the Serial Attached Small Computer System Interface (SCSI) (SAS), the Serial Advanced Technology Attachment (SATA), the Peripheral Component Interconnect express (PCIe), or the Non-volatile memory express (NVMe).

In addition, the memory controller 100 is connected to the NAND package 200 via NAND buses to transmit or receive signals in compliance with the NAND interface specification (to be described later).

The NAND package 200 include a plurality of channels CH (CH0, CH1, . . . ). The channels CH are individually connected to the memory controller 100 via the corresponding NAND buses. Note that the number of channels in a NAND package 200 can be arbitrarily set.

Each of the channels CH includes a plurality of chips Chip (Chip0, Chip1, . . . ). Each of the chips Chip may function as, for example, a NAND flash memory. Note that the number of chips in a channel CH can be arbitrarily set.

The other channels CH which are not illustrated may be similarly configured. The configuration of the chip Chip will be described later.

1.1.2 Configuration of the Memory Controller

Further referring to FIG. 1, the configuration of the memory controller 100 is described in detail.

The memory controller 100 is, for example, a System-on-a-chip (SoC) controller, and includes a host interface circuit 110, a memory (RAN) 120, a processor (CPU) 130, a buffer memory 140, a NAND interface circuit 150, an ECC circuit 160, a NAND controller unit 170 including a plurality of NAND controllers 171, 172, . . . , and a read voltage correction circuit 180. Note that each of the functions of the components 110 to 170 of the memory controller 100, which will be described below, can be implemented with either hardware or a combination of hardware resources and firmware. In addition, it is assumed that the read voltage correction circuit 180 can be realized by hardware which can operate independently from firmware, unless otherwise described.

The host interface circuit 110 is connected to the host apparatus 2 via the host bus, and receives instructions and data from the host apparatus 2, and transfer the instructions and data to the processor 130 and the buffer memory 140. In addition, responding to an instruction from the processor 130, the host interface circuit 110 transfers data stored in the buffer memory 140 to the host apparatus 2.

The RAM 120 is a semiconductor memory such as a dynamic random access memory (DRAM) or a static random access memory (SRAM), and is used for a working area of the processor 130. In addition, the RAM 120 stores firmware for managing the NAND package 200, and various management tables such as a history table (to be described later).

The processor 130 controls the operations of the entirety of the memory controller 100. For example, when the processor 130 received a read instruction from the host apparatus 2, the processor 130 controls the NAND controller unit 170 in response to the read instruction, and causes the NAND controller unit 170 to issue read commands to the NAND package (this read operation under control of the instruction from the host apparatus 2 is also referred to as a "host read operation"). The same applies to a write operation and an erase operation are similarly performed. In addition, the processor 130 controls the NAND controller unit 170 and causes the NAND controller unit 170 to execute various internal operations to manage the NAND package 200, without a direct control by the host apparatus 2. For example, the processor 130 may cause the NAND controller unit 170 to execute internal operations of the memory system 1, such as a patrol read operation and a refresh process.

The buffer memory 140 temporarily stores data to be written into or read out of the NAND package 200, and data read out of the NAND package 200 and error-corrected by the ECC circuit 160 (also referred to as "expected data").

The NAND interface circuit 150 is connected to the NAND package 200 via the NAND buses, and controls communication with the NAND package 200. In addition, upon reception of an instruction from the processor 130, the NAND interface circuit 150 sends and receives various signals complying with the NAND interface specification (to be described later) to and from the NAND package 200.

The ECC circuit 160 executes error checking and error correction for data stored in the NAND package 200. At a time of writing data, the ECC circuit 160 generates error correction codes and associates the error correction codes to the data to be written. At a time of reading data, the ECC circuit 160 decodes the error correction code associated the read data to check the presence/absence of error bits in the read data. When an error bit is detected, the ECC circuit 160 specifies the location of the error bit, and corrects the error bit. Error correction methods include, for example, hard bit decoding and soft bit decoding. For decoding codes to be used in the hard bit decoding, the Bose-Chaudhuri-Hocquenghem (BCH) codes and the Reed-Solomon (RS) codes, for example, can be used. For decoding codes to be used in the soft bit decoding, for example, the Low Density Parity Check (LDPC) codes can be used.

The NAND controller unit 170 generates commands and addresses to be communicated with the NAND package 200, in response to instructions from the processor 130. For example, the NAND controller unit 170 issues read commands complying with the NAND interface specification to the NAND package 200, in response to a data read instruction received from the host apparatus 2. In addition, the NAND controller unit 170 may issue read commands to the NAND package 200 in compliance with the NAND interface specification, without instructions from the host apparatus 2.

The NAND controller unit 170 includes a plurality of NAND controllers 171, 172 . . . The NAND controllers 171, 172, . . . , are provided in association with the channels CH0, CH1, . . . , of the NAND package 200, respectively. Each of the NAND controllers 171, 172, . . . , are configured to control communications with corresponding one of the channels CH0, CH1 . . . .

The read voltage correction circuit 180 is configured to calculate a correction amount (a shift amount) for a read voltage which is generated when data is read from the NAND package 200. For example, the read voltage correction circuit 180 receives read data from the NAND package 200, and also receives corrected read data which is acquired generated from the read data via the error correction by the ECC circuit 160. The read voltage correction circuit 180 calculates the correction amount for the read voltage based on the read data and the corrected read data, and transfers the calculated correction amount to the RAM 120 to be stored. The details of the configuration of the read voltage correction circuit 180 will be described later.

1.1.3 Configuration of the Chip

Figure 2:
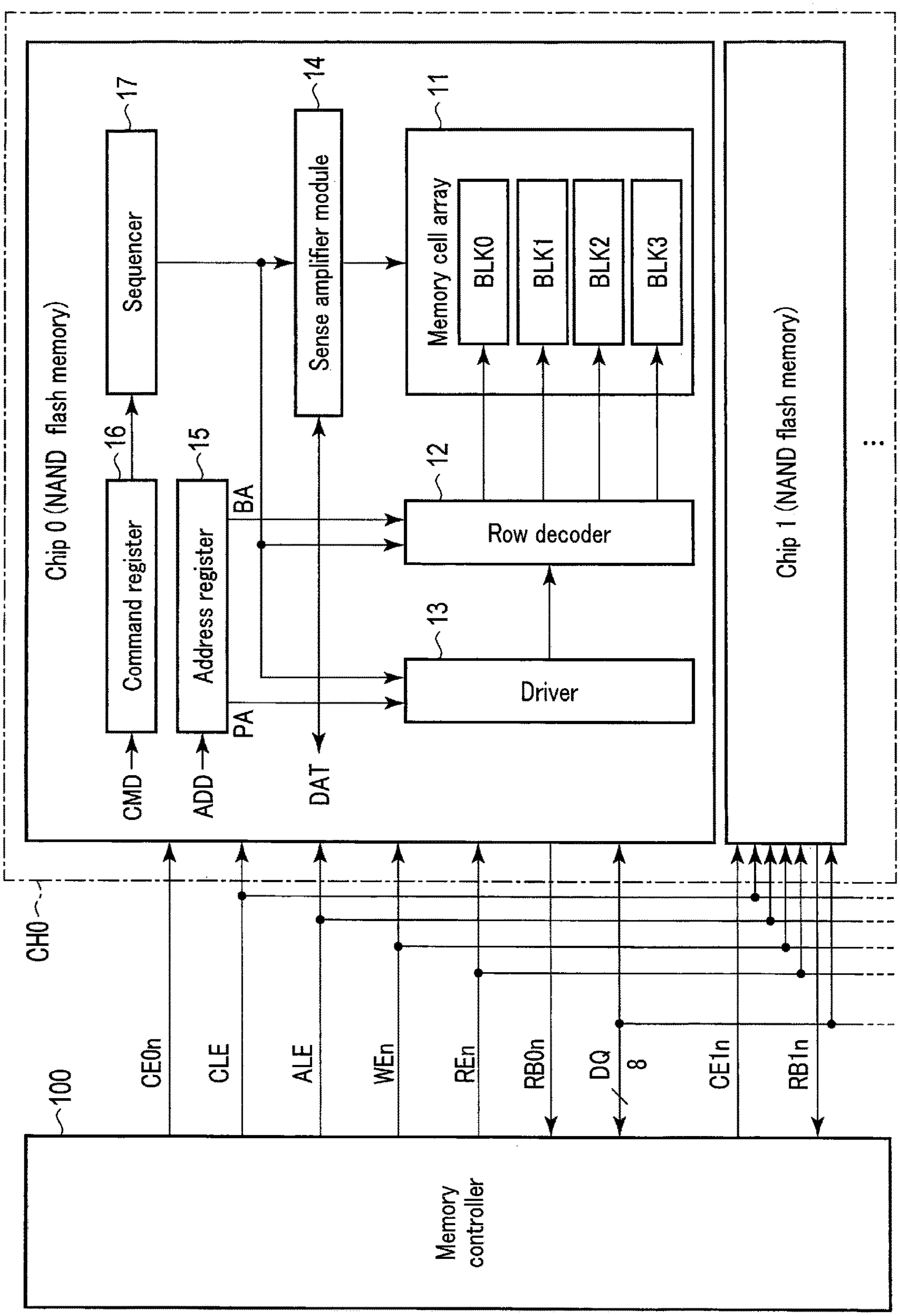
FIG. 2 illustrates a block diagram of a semiconductor memory device for the memory system according to the first embodiment.

Next, a configuration of the chip, which may be a NAND flash memory, is described with reference to FIG. 2. In FIG. 2, a connection between the memory controller 100 and the channel CH0, and a configuration of one chip (e.g. Chip0) in the channel (e.g. CH0), are illustrated by way of example.

To begin with, the connection between the memory controller 100 and the channel CH0 is described. Note that a description of connections between the memory controller 100 and the other channels CH1 and so on, is omitted since these connections are similar to the connection between the memory controller 100 and the channel CH0.

As illustrated in FIG. 2, each chip Chip in the channel CH0 is connected to the memory controller 100 via the NAND bus, and sends and receives signals in compliance with the NAND interface specification. Examples of the signals defined in the NAND interface specification are a chip enable signal CEn (CE0*n*, CE1*n*, . . . ), an address latch enable signal ALE, a command latch enable signal CLE, a write enable signal WEn, a read enable signal REn, a ready/busy signal RBn (RB0*n*, RB1*n*, . . . ), and an input/output signal DQ. The signals CE0*n*, CE1*n*, . . . , are respectively input to the chips Chip0, Chip1, . . . , and the signals RBn0, RBn1, . . . , are respectively output from the chips Chip0, Chip1, . . . . The signals ALE, CLE, WEn, REn and DQ are commonly input to the respective chips Chip in the same channel (e.g. CH0).

The signals CE0*n*, CE1*n*, . . . , are signals for enabling the chips Chip0, Chip1, . . . , when asserted at a "Low (L)" level. The signals CLE and ALE are signals for notifying each chip Chip whether a signal input to the chip Chip is a command or an address. The signal WEn is a signal which causes each chip Chip to capture the input signal DQ when asserted at a "L" level. The signal REn is a signal which causes each chip Chip to produce the output signal DQ to be read when asserted at an "L" level. Each of the ready/busy signals, RB0*n*, RB1*n*, . . . , is a signal which indicates whether each of the chip Chip0, Chip1, . . . , is in a ready state (a state in which the chip is ready to receive an instruction from the memory controller 100) or in a busy state (a state in which the chip cannot receive an instruction from the memory controller 100). The ready/busy signal in an "L" state indicates that the chip is in the busy state. The input/output signal DQ is, for example, a signal of 8 bits. In addition, the input/output signal DQ is the substance of information which is sent/received between each chip Chip and the memory controller 100, and includes a command CMD, an address ADD, and data DAT such as write data and read data.

With the above-described configuration, the memory controller 100 can communicate with any one of the chips Chip in the channel CH, independently and in parallel between the channels CH.

Next, the configuration of the chip Chip0 is described. Note that a description of the configurations of the other chips Chip1 and so on is omitted since the other chips are similarly configured with the chip Chip0.

Each chip (e.g. Chip0) includes a memory cell array 11, a row decoder 12, a driver 13, a sense amplifier module 14, an address register 15, a command register 16 and a sequencer 17.

The memory cell array 11 includes a plurality of blocks BLK each including a plurality of nonvolatile memory cells which are arranged in rows and columns. In FIG. 2, four blocks BLK0 to BLK3 are illustrated by way of example. In addition, the memory cell array 11 stores data which is delivered from the memory controller 100.

The row decoder 12 selects any one of the blocks BLK0 to BLK3 based on a block address BA held in the address register 15, and further selects a word line in the selected block BLK.

The driver 13 supplies voltages to the selected block BLK via the row decoder 12, based on a page address PA in the address register 15.

The sense amplifier module 14 senses a threshold voltage of a memory cell transistor in the memory cell array 11, and reads data depending on the sensed threshold voltage, at a time of reading data. Then, the sense amplifier module 14 outputs the read data DAT to the memory controller 100. On the other hand, at a time of writing data, the sense amplifier module 14 transfers write data DAT, which is received from the memory controller 100, to the memory cell array 11.

The address register 15 holds the address ADD which is received from the memory controller 100. This address ADD includes the above-described block address BA and page address PA. The command register 16 holds the command CMD which is received from the memory controller 100.

The sequencer 17 controls the operation of the entirety of the chip Chip0 based on the command CMD held in the command register 16.

Figure 3:
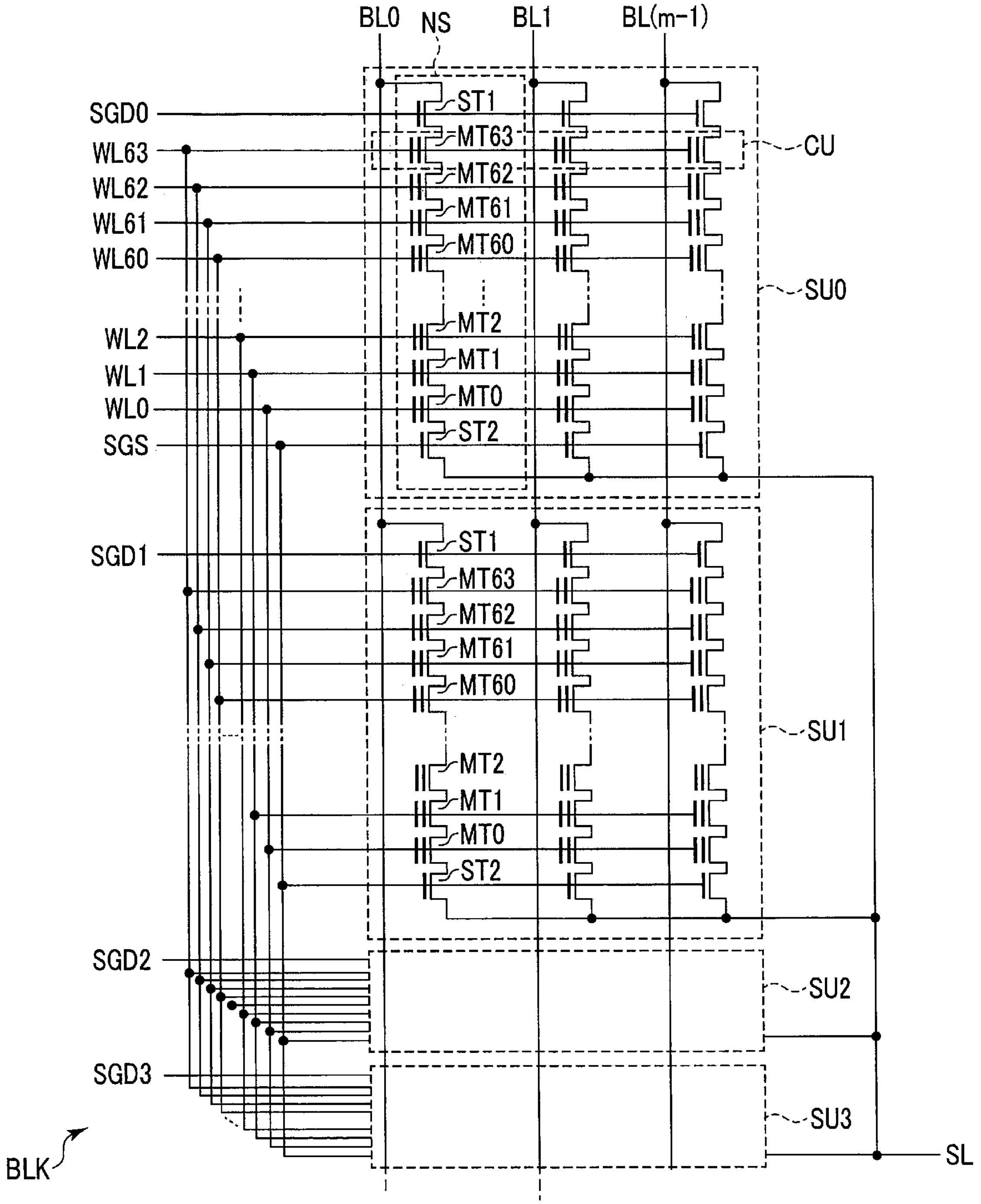
FIG. 3 illustrates a circuit diagram of a memory cell array of the semiconductor memory device for the memory system according to the first embodiment.

Next, the configuration of the block BLK will be described with reference to FIG. 3. FIG. 3 shows a circuit diagram of any one of the blocks BLK.

As illustrated in FIG. 3, the block BLK includes, for example, four string units SU (SU0 to SU3). In addition, each string unit SU includes a plurality of NAND strings NS. The number of blocks in the memory cell array 11, the number of string units in the block BLK, and the number of NAND strings in the string unit SU are arbitrarily selected.

Each NAND string NS includes, for example, 64 memory cell transistors MT (MT0 to MT63) and select transistors ST1 and ST2. The memory cell transistor MT includes a control gate and a charge trap layer, and stores data non-volatilely. In addition, the memory cell transistors MT are connected in series between the source of the select transistor ST1 and the drain of the select transistor ST2.

The gates of the select transistors ST1 in the respective string units SU0 to SU3 are connected to respective select gate lines SGD0 to SGD3. On the other hand, the gates of the select transistors ST2 in the respective string units SU0 to SU3 are commonly connected to, for example, a select gate line SGS. Alternatively, the gates of the select transistors ST2 in the respective string units SU0 to SU3 may be connected to different select gate lines SGS0 to SGS3 between the respective string units SU0 to SU3. In addition, the control gates of the memory cell transistors MT0 to MT63 in the same block BLK are commonly connected to respective word lines WL0 to WL63.

Besides, the drains of the select transistors ST1 of the NAND strings NS in the same column of the memory cell array 11 are commonly connected to a single bit line BL (i.e. one of BL0 to BL(m−1)); m is a natural number of two or more). Specifically, one of the bit lines BL is commonly connected to the NAND strings NS which are arranged in the same column between plural blocks BLK. Further, the sources of the select transistors ST2 are commonly connected to a source line SL.

In other words, the string unit SU is a set of NAND strings NS which are connected to different bit lines BL and are connected to the same select gate line SGD. In each string unit SU, a set of memory cell transistors MT which share the same word line WL is referred to as a "cell unit CU" (or a "memory group"). In addition, each block BLK is a set of string units SU which share the same word lines WL. Furthermore, the memory cell array 11 is a set of blocks BLK which share the same bit lines BL.

Figure 4:
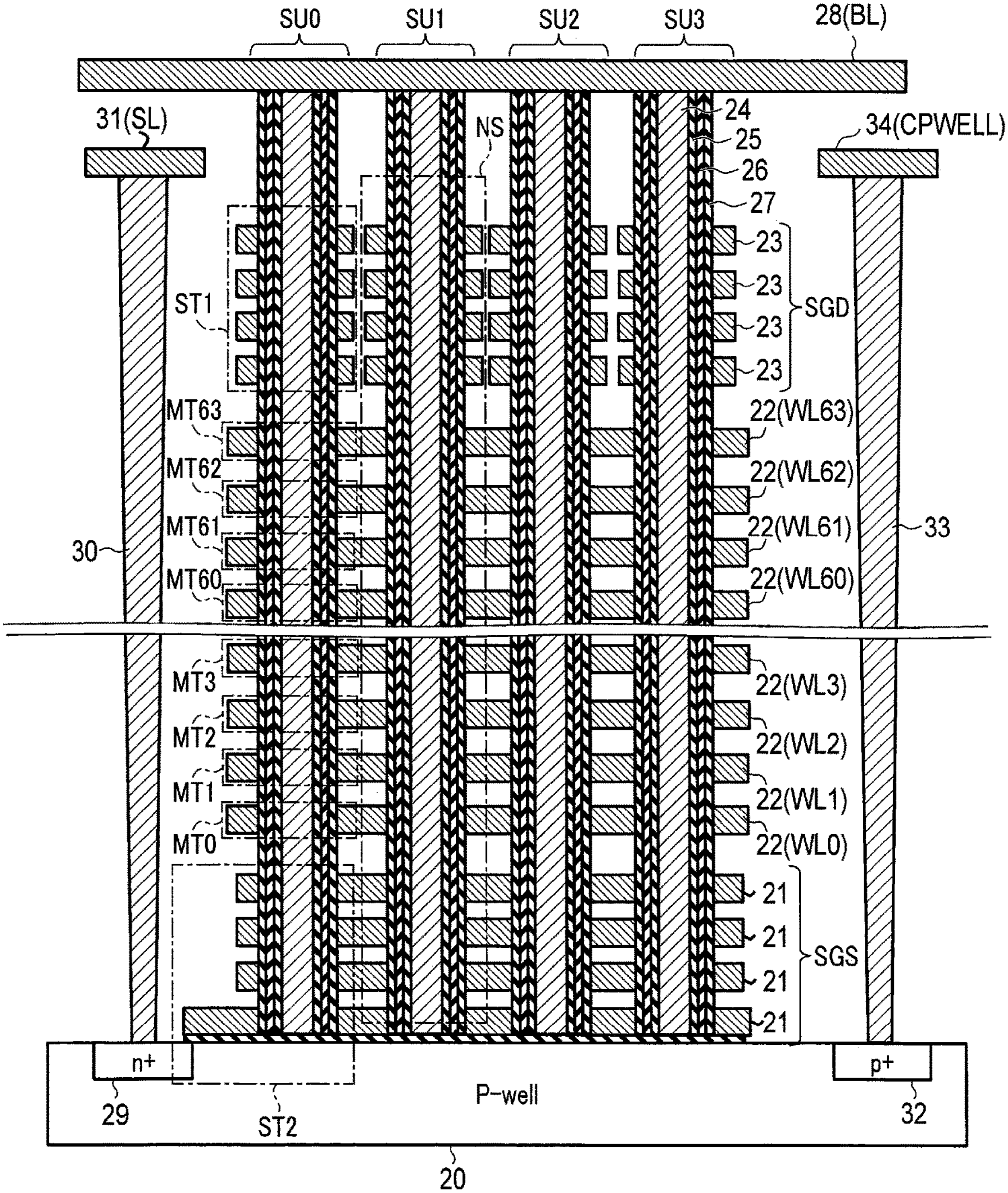
FIG. 4 illustrates a cross-section of the memory cell array of the semiconductor memory device for the memory system according to the first embodiment.

FIG. 4 shows a cross-section of a partial region of any block BLK. As illustrated in FIG. 4, a plurality of NAND strings NS are arranged on a p-well region 20. In the example of FIG. 4, four interconnect layers 21 functioning as the select gate lines SGS, 64 interconnect layers 22 functioning as the word lines WL0 to WL63, and four interconnect layers 23 functioning as the select gate lines SGD are stacked in order above the p-well region 20. Insulating films (not shown) are formed between the stacked interconnect layers.

A pillar-shaped structure 24 is formed which passes through the interconnect layers 23, 22 and 21 and reaches the p-well region 20. A gate insulating film 25, a charge trap layer (an insulating film or a conductive film) 26 and a block insulating film 27 are fabricated in order on the circumferential surface of the structure 24 to form the memory cell transistors MT and the select transistors ST1 and ST2. The structure 24 includes a conductive body which functions as a current path of the NAND string NS, and serves as a region where a channel of each transistor is formed. In addition, the upper end of the structure 24 is connected to a bit line BL arranged in a metal interconnect layer 28.

An $n^+$-type impurity diffusion layer 29 is provided in a surface region of the p-well region 20. A contact plug 30 is formed on the $n^+$-type impurity diffusion layer 29. The contact plug 30 is connected to a metal interconnect 31 functioning as a source line SL. Further, a $p^+$-type impurity diffusion layer 32 is formed in a surface region of the p-well region 20. A contact plug 33 is formed on the $p^+$-type impurity diffusion layer 32. The contact plug 33 is connected to a metal interconnect 34 functioning as a well interconnect CPWELL. The well interconnect CPWELL is an interconnect for applying a voltage to the conductor 24 via the p-well region 20.

A plurality of the above-described structures are arranged in a depth direction which is normal to the plane of the sheet of FIG. 4. The string unit SU is formed by a set of NAND strings NS which are arranged in the depth direction.

In this example, one memory cell transistor MT can store, for example, 2-bit data. It is assumed that the bits of the 2-bit data are called a lower bit and an upper bit in the order from the least significant bit. In addition, a set of lower bits of data stored in the memory cells belonging to the same cell unit is called "lower page", and a set of upper bits of the data is called "upper page". Since two pages are allocated to each of the 64 word lines WL (each of the cell units CU) in one string unit SU, one string unit SU has a capacity of 128 pages. In other words, the "page" can be defined as a part of a memory space which is formed by each of the cell units CU. Data write and data read operations may be performed for each page or for each cell unit CU.

Figure 5:
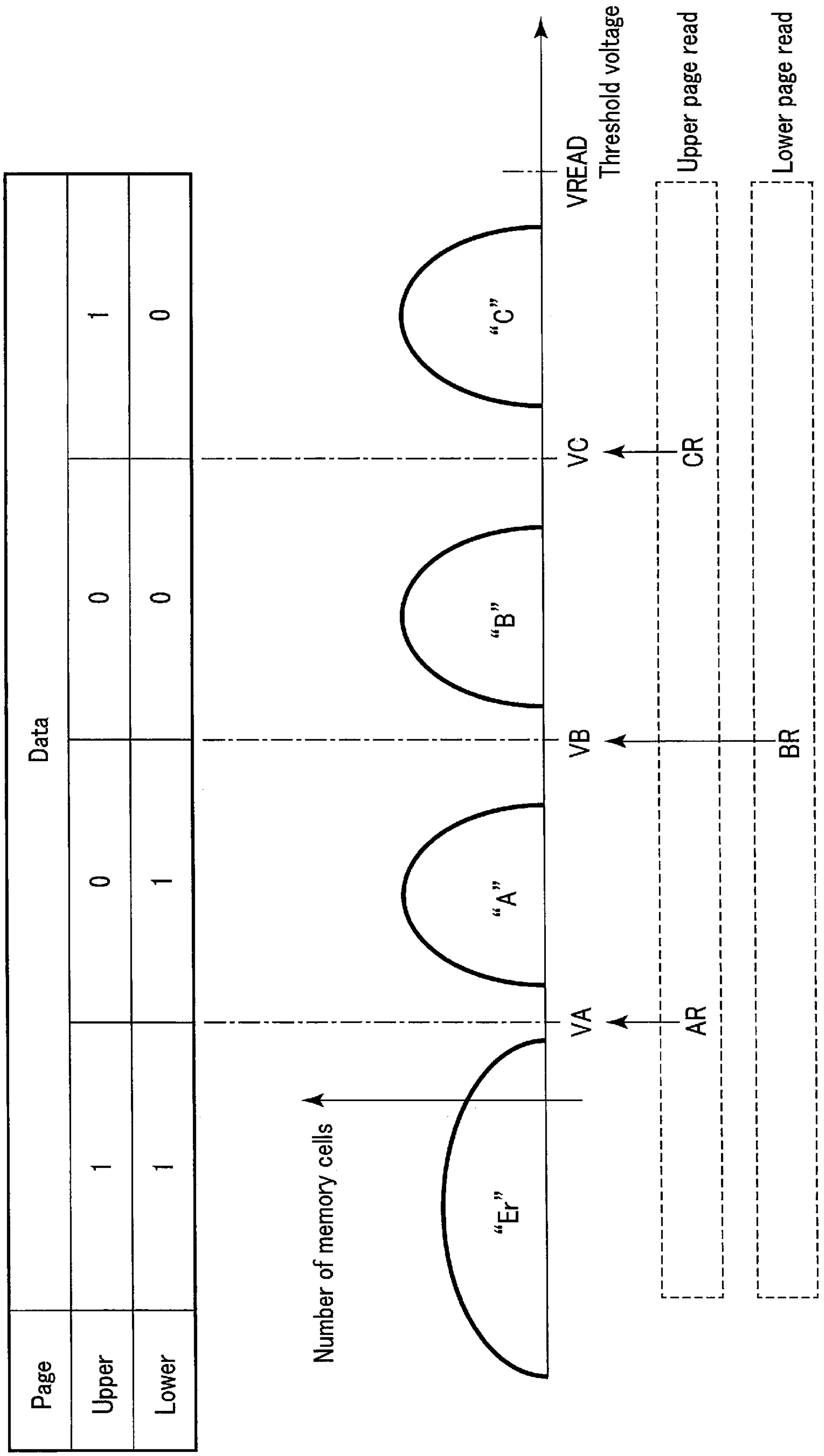
FIG. 5 schematically shows threshold voltage distributions of memory cells of the memory cell array for the memory system according to the first embodiment.

FIG. 5 illustrates data which each memory cell transistor MT can store, threshold voltage distributions, and reference voltages used at a time of reading the stored data.

As described above, in this example, the memory cell transistor MT can store 2-bit data. The memory cell transistor MT can be set in four states in accordance with its threshold voltages. It is assumed that the four states are called an "Er" state, an "A" state, a "B" state and a "C" state, in the order from the lowest threshold voltage.

The threshold voltage of the memory cell transistor MT in the "Er" state can have a value less than a voltage VA, and corresponds to state in which data is erased. The threshold voltage of the memory cell transistor MT in the "A" state can have a value equal to or larger than the voltage VA and less than a voltage VB (>VA). The threshold voltage of the memory cell transistor MT in the "B" state can have a value equal to or larger than the voltage VB and less than a voltage VC (>VB). The threshold voltage of the memory cell transistor MT in the "C" state can have a value equal to or larger than the voltage VC and less than a voltage VREAD. Among the four states which correspond to the threshold voltage distributions in this manner, the "C" state corresponds to the highest threshold voltage distribution. The voltages VA to VC are generically referred to as reference voltages VCGR. The voltage VREAD is, for example, a voltage which is applied to word lines WL to which memory cell transistors MT that are not a data read target at a time of the read operation are coupled. With the voltage VREAD being applied, the memory cell transistor MT is turned on regardless of stored data.

In addition, the threshold voltage of the memory cell transistor MT has the above-described threshold voltage distributions when data of 2 bits including the above-described lower bit and upper bit is written into the memory cell transistor MT. The relationship between the "Er" state to "C" state, and values of the lower bit and upper bit is, for example, as follows:

"Er" state: "11" (expressed in the descent order from the most significant bit), "A" state: "01", "B" state: "00", and "C" state: "10".

In this manner, only one bit of the two bits varies between data corresponding to two neighboring states in the threshold voltage distributions.

Accordingly, when a value of the lower bit is read, a reference voltage corresponding to a boundary of any threshold voltage distribution at which the value ("0" or "1") of the lower bit changes, may be used. This also applies when a value of the upper bit is read.

In the example illustrated in FIG. 5, when reading a value of the lower page, the voltage VB which distinguishes the "A" state and "B" state is used as a read reference voltage. The read operation using the voltage VB is referred to as "read operation BR". The read operation BR is performed to determine whether the threshold voltage of the memory cell transistor MT is less than the voltage VB or not. If it is determined that the threshold voltage of the memory cell transistor MT is less than the voltage VB, i.e. the memory cell transistor MT is turned on with the voltage VB being applied, the value of the lower page is determined to be "1". Otherwise, it is determined to be "0".

Similarly, when reading a value of the upper page, the voltage VA which distinguishes the "Er" state and "A" state, and the voltage VC which distinguishes the "B" state and "C" state are used as read reference voltages. The read operations using the voltage VA and VC are referred to as "read operation AR" and "read operation CR", respectively. A memory cell transistor MT, which is in an erase state, is identified by the read operation AR. If the memory cell transistor MT is turned on with the voltage VA being applied, it is determined that the memory cell transistor MT is in the "Er" state, i.e. the value of the upper page is "1". Otherwise, the voltage VC is applied to the memory cell transistor MT. Then, if the memory cell transistor MT is turned on with the voltage VC being applied, it is determined that the value of the upper page is "0", and otherwise, it is determined that the value of the upper page is "1".

It is appreciated by a person ordinarily skilled in the art that the memory cell array 11 may have other configurations. For example, the memory cell array 11 may have a configuration as disclosed in U.S. patent application Ser. No. 12/407,403 filed Mar. 19, 2009 and entitled "THREE DIMENSIONAL STACKED NONVOLATILE SEMICONDUCTOR MEMORY". In addition, the memory cell array 11 may have configurations as disclosed in U.S. patent application Ser. No. 12/406,524 filed Mar. 18, 2009 and entitled "THREE DIMENSIONAL STACKED NONVOLATILE SEMICONDUCTOR MEMORY", U.S. patent application Ser. No. 12/679,991 filed Mar. 25, 2010 and entitled "NON-VOLATILE SEMICONDUCTOR STORAGE DEVICE AND MANUFACTURING METHOD THEREOF", and U.S. patent application Ser. No. 12/532,030 filed Mar. 23, 2009 and entitled "SEMICONDUCTOR MEMORY AND METHOD FOR MANUFACTURING SAME". The entirety of the above-described patent applications is incorporated in the present specification by reference.

1.1.4 Configuration of the Sense Amplifier Module

Figure 6:
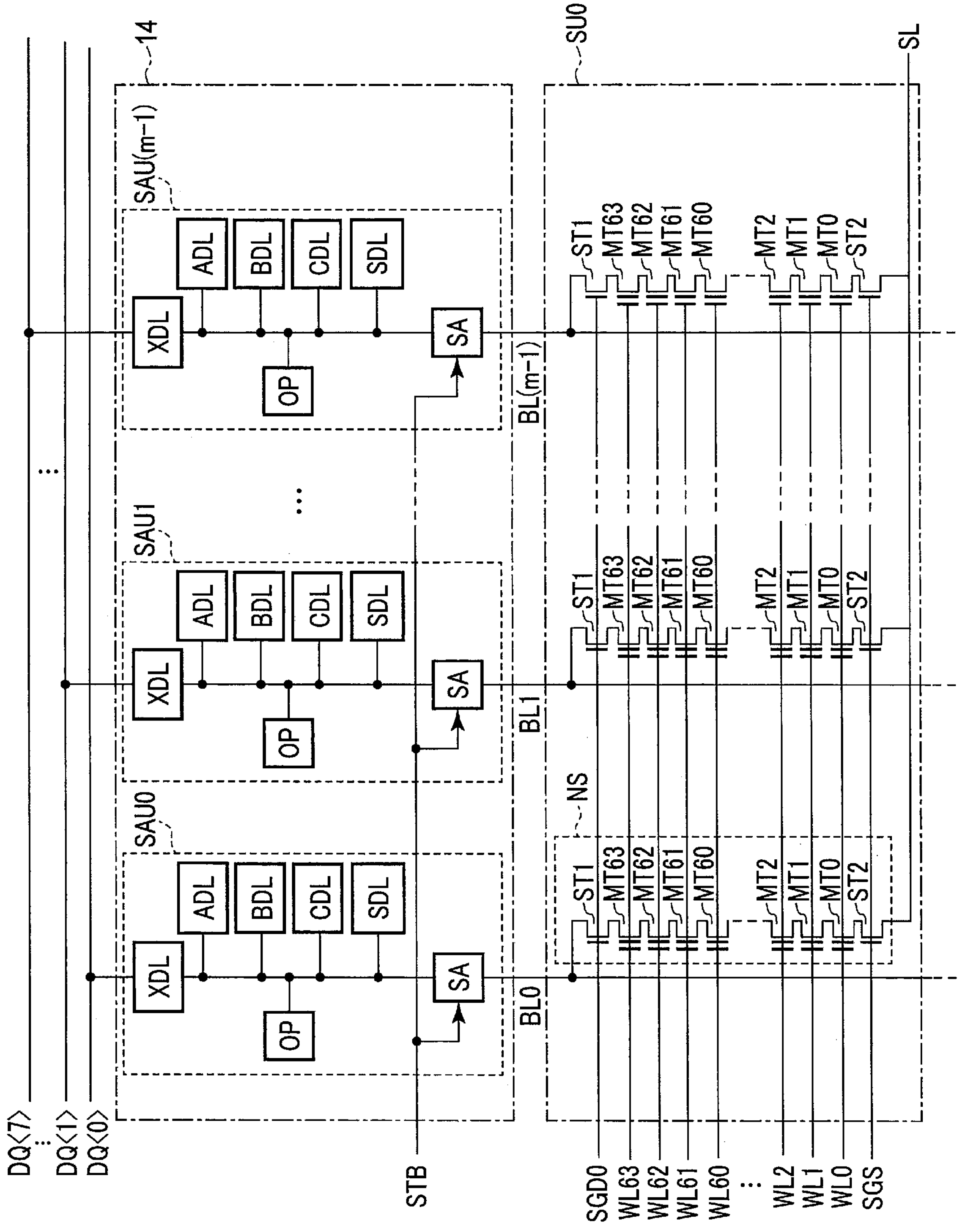
FIG. 6 illustrates a block diagram of a sense amplifier module used in the memory system according to the first embodiment.

Next, a configuration of the sense amplifier module used in the nonvolatile memory system according to the first embodiment will be described with reference to FIG. 6. FIG. 6 illustrates, by way of example, a circuit diagram of the sense amplifier module used in the nonvolatile memory system according to the first embodiment.

As illustrated in FIG. 6, the sense amplifier module 14 includes sense amplifier units SAU (SAU0, SAU1, . . . , SAU(m−1)) which are provided for respective bit lines BL.

Each of the sense amplifier units SAU includes a sense amplifier SA, an operation unit OP, and, for example, five latch circuits ADL, BDL, CDL, SDL and XDL.

The sense amplifier SA reads data by sensing the voltage or current of the corresponding bit line BL in the read operation, and applies voltage to the corresponding bit line BL in accordance with data to be written in the write operation. The sense amplifiers SA are modules which directly control the corresponding bit lines BL. In addition, at a time of reading data, a strobe signal STB is delivered to each sense amplifier SA by, for example, the sequencer 17. The sense amplifier SA determines read data at a timing when the strobe signal STB is asserted. Then, the sense amplifier SA stores the read data in a latch circuit (not shown) which is included in the sense amplifier SA, and transfers the read data to any one of the latch circuits ADL, BDL, CDL, SDL and XDL.

The latch circuits ADL, BDL, CDL and SDL of each sense amplifier units SAU temporarily store the read data in the read operation, or data to be written in the write operation. The operation unit OP executes various logical operations, such as a NOT operation, an OR operation, an AND operation, a NAND operation, a NOR operation and an XOR operation, on the data stored in any of the sense amplifier SA and the latch circuits ADL, BDL, CDL, SDL and XDL.

In each sense amplifier units SAU, the sense amplifier SA, the latch circuits ADL, BDL, CDL and SDL, and the operation unit OP are interconnected by a bus to transmit/receive data to/from each other. This bus is also connected to the latch circuit XDL.

In each sense amplifier units SAU, the input/output of data to/from the sense amplifier module 14 is executed via the latch circuits XDL. The data received from the memory controller 100 is transferred to any of the latch circuit ADL, BDL, CDL and SDL and the sense amplifier SA via the latch circuit XDL. On the other hand, the data held in any of the latch circuits ADL, BDL, CDL and SDL, or the data detected by the sense amplifier SA of each sense amplifier units SAU is transmitted to the memory controller 100 via the latch circuit XDL as a signal of any one of signals DQ<7:0>. The latch circuit XDL of each sense amplifier units SAU functions as a cache memory of the chip Chip. Accordingly, even when the latch circuit ADL, BDL, CDL and SDL are being used, the chip Chip can be set in the ready state if the latch circuit XDL is available.

In the example of FIG. 6, the bit line BL0 is connected to a signal line which communicates a signal DQ<0>, the bit line BL1 is connected to a signal line which communicates a signal DQ<1>, via their sense amplifiers SA and latch circuits XDL. The latch circuit XDL, which is connected to the bit line BL(m−1), is connected to a signal line which communicates a signal DQ<7>. In this manner, the signal lines, which couple the bit lines BL to the memory controller 100, correspond to the respective signals DQ<7:0>. The NAND string NS, which is connected to a certain bit line BL, is associated with any one of the signals DQ<7:0>.

1.1.5 Configuration of the History Table

Figures 7, 8:
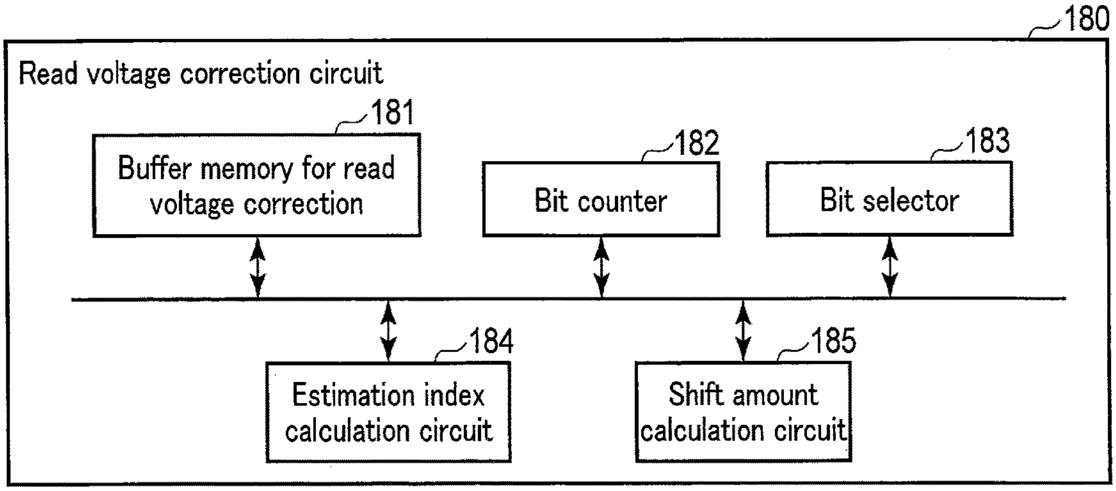
FIG. 7 schematically shows a history table stored in a memory controller for the memory system according to the first embodiment.
FIG. 8 illustrates a block diagram of a read voltage correction circuit in the memory controller for the memory system according to the first embodiment.

Next, a history table will be described. As described above, the memory controller 100 stores the history table, for example, in the RAM 120. The concept of the history table is described with reference to FIG. 7. FIG. 7 schematically illustrates an example of the history table used in the memory system according to the first embodiment.

As illustrated in FIG. 7, the history table includes, for example, information (e.g. digital to analogue converter (DAC) values) indicative of shift amounts Δ of read reference voltages used in the read operations AR to CR. The shift amounts Δ can be individually set, for example, for each channel CH, each chip Chip, each block BLK, each word line WL, and each string unit SU.

The shift amounts Δ will be described below. The threshold voltage distributions corresponding to the "Er", "A", "B" and "C" states, which are described above with reference to FIG. 5, are placed apart from each other. Accordingly, the respective states can be distinguished by the reference voltages VA, VB and VC. However, if time has passed since data was written (i.e. the retention age is high), there is a case in which the threshold voltage distribution of memory cell transistors MT shifts due to interference of certain memory cell transistors MT with neighboring memory cell transistors MT (this is called "data retention error"). In addition, the threshold voltage distributions may vary due to a write process and a read process (the variations due to the write process and read process are called "program disturb" and "read disturb", respectively). When such various kinds of factors cause the threshold voltage distributions to vary (hereinafter, simply referred to as "variation factors"), there may be a case in which neighboring threshold voltage distributions overlap.

Due to the overlap of the neighboring threshold voltage distributions, there occurs a case in which the data cannot correctly be read with the above-described reference voltages VA, VB and VC. For example, in a case where the threshold voltage distribution of the "A" state and the threshold voltage distribution of the "B" state overlap, since there is a possibility that the threshold voltage of a memory cell transistor MT is in the threshold voltage distribution of the "A" state, but actually has a value higher than the voltage VB, data stored in the memory cell transistor MT is erroneously read as the bit values of the "B" state. On the other hand, since there may be a case in which the threshold voltage of a memory cell transistor MT is in the threshold voltage distribution of the "B" state, but actually has a value lower than the voltage VB, data stored in the memory cell transistor MT is erroneously read as the bit values of the "A" state. If data read from a channel CH of the memory cell array 11 has such erroneously read bits the number of which ("the number of fail bits") exceeds the number of correctable error bits of the ECC circuit 160 so that the read data cannot be corrected by the ECC circuit 160, the memory controller 100 fails to read correct data from the channel CH.

In this case, the memory controller 100 shifts a read voltage from the read reference voltage VA, VB or VC normally used in the data read operation (hereinafter, referred to as "default read voltage(s)"), and retries the data read operation. This is called a "shift read operation". The history table illustrated in FIG. 7 stores, for each of the read operations AR to CR, information indicative of the shift amount from the default read voltage which is used in the data read operation, in association with each channel CH, each chip Chip, each block BLK, each word line WL, and each string unit SU.

In the history table of this example, the state of "DAC Value=0" corresponds to the default read voltage (i.e. Shift Amount Δ=0). The shift amount Δ is properly calculated as needed, and stored in the history table in the RAM 120, for example, by the read voltage correction circuit 180 in the memory controller 100. By referring to the history table, the memory controller 100 determines a suitable (shifted) read voltage which is to be applied to the word line WL corresponding to a read target memory cell transistor MT.

In the example of FIG. 7, in connection with a cell unit CU corresponding to a channel CH, a chip Chip, a block BLK, a word line WL, and a string unit SU identified by (channel CH, chip Chip, block BLK, word line WL, string unit SU)=(0, 0, 0, 0, 0), shift amounts Δ of "+8", "+2" and "−7" are set for the read operations AR, BR and CR, respectively. This means that when each of the read operations AR, BR and CR is executed for the cell unit CU, a read reference voltage is shifted based on corresponding one of the DAC values+8, +2 and −7 from corresponding one of the default read reference voltages VA, VB and VC. On the other hand, in connection with the cell unit CU corresponding to a channel CH, a chip Chip, a block BLK, a word line WL, and a string unit SU identified by (channel CH, chip Chip, block BLK, word line WL, string unit SU)=(0, 0, 0, 1, 0), a shift amount Δ of 0 is set for each of the read operations AR, BR and CR. This means that when the read operations AR, BR and CR are executed for the cell unit CU, the default read reference voltages VA, VB and VC are used.

1.1.6 Configuration of the Read Voltage Correction Circuit

Next, referring to FIG. 8, a description will be given of a configuration of the read voltage correction circuit 180 which is provided in the memory controller 100.

As illustrated in FIG. 8, the read voltage correction circuit 180 includes, for example, a buffer memory 181 for read voltage correction, a bit counter 182, a bit selector 183, an estimation index calculation circuit 184, and a shift amount calculation circuit 185.

The buffer memory 181 for read voltage correction is, for example, a semiconductor memory such as a static random access memory (SRAM), and is a storage area for temporarily storing read data which is used in an operation of correcting a read voltage. The buffer memory 181 for read voltage correction has such a storage capacity as to be capable of simultaneously storing read data of a read voltage correction target (pre-error-correction read data) and expected data (post-error-correction read data) which was obtained by correcting one or more errors of the pre-error-correction read data by the ECC circuit 160. Note that each of the pre-error-correction read data and the post-error-correction read data has at least a data size of a unit (e.g. page unit) which the ECC circuit can process for error correction.

The bit counter 182 counts, for data read from a read target cell unit CU stored in the buffer memory 181, the number of bits of the read data corresponding to each of the combinations of values of the pre-error-correction read data and the post-error-correction read data. For example, when the pre-error-correction read data and the post-error-correction read data are both obtained for one page, one memory cell transistor can have four combinations of values of the pre-error-correction read data and the post-error-correction read data, namely (1, 1), (1, 0), (0, 0) and (0, 1). The bit counter 182 counts how many bits corresponding to each of the four combination exist in the data read from the read target cell unit CU.

The bit selector 183 selects, from among the four combinations of values for which the number of bits is counted by the bit counter 182, two combinations (e.g. (1, 0) and (0, 1)) are selected to be used in the shift amount calculation operation.

The estimation index calculation circuit 184 calculates an estimation index for use in the shift amount correction operation, based on the counted numbers of bits corresponding to the two combinations of values selected by the bit selector 183. For example, the ratio between the two count values may be used as the estimation index.

The shift amount calculation circuit 185 calculates a shift amount Δ, based on the estimation index calculated by the estimation index calculation circuit 184. For example, the shift amount calculation circuit 185 transfers the calculated shift amount Δ to the RAM 120 and updates the history table.

In FIG. 8, the case was described in which the respective components 181 to 185 can function independently from firmware. However, this is not exclusive. For example, among the components 181 to 185 illustrated in FIG. 8, the configurations (e.g. of the bit selector 183, the estimation index calculation circuit 184, and the shift amount calculation circuit 185) except the configurations of the buffer memory 181 for read voltage correction and bit counter 182 may be implemented by firmware.

1.2 Operation

Next, the operation of the memory system according to the first embodiment will be described.

1.2.1 Read Process Including the Shift Amount Calculation

Figure 9:
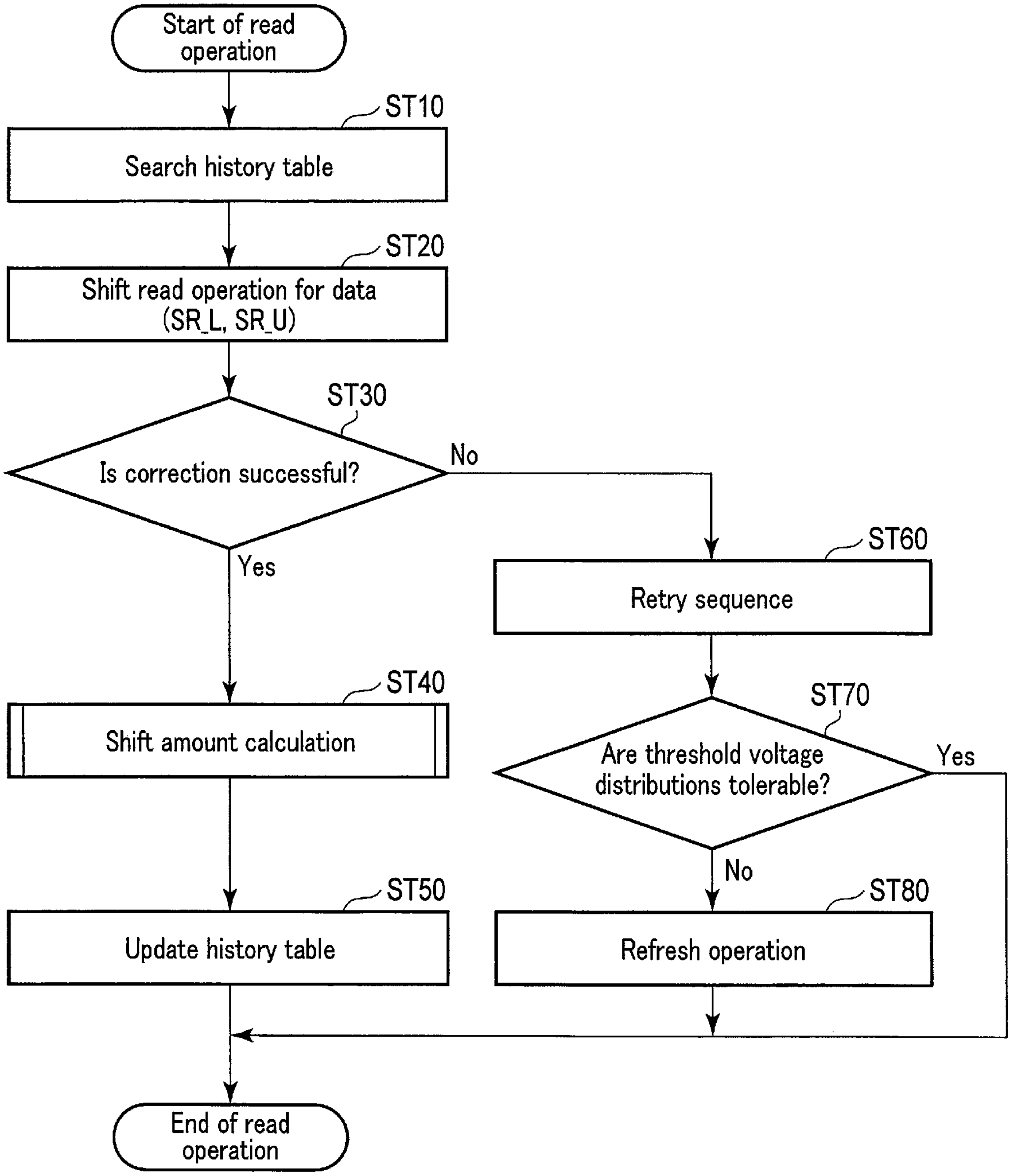
FIG. 9 is a flowchart of a read operation which includes a shift amount calculation in the memory system according to the first embodiment.

A read operation including the shift amount calculation which is executed by the memory controller 100 will be described with reference to a flowchart shown in FIG. 9. FIG. 9 illustrates an example of a sequence of operations, taking it into consideration that a patrol read operation, for instance, is performed. The patrol read operation is performed internally in the memory system 1 to cause the memory controller 100 to periodically patrol the cell units CU in the NAND package 200 and execute the data read operation, for example, in order to realize variation of distributions of the threshold voltages of the memory cell transistors MT storing data in each cell unit CU. Note that in the example of FIG. 9, the memory controller 100 initiates the patrol read operation to read all pages (including the upper page and the lower page) for a certain cell unit CU. This read method is also called "sequential read operation", which is distinguished from "random read operation" of reading pages one by one at random.

As illustrated in FIG. 9, in step ST10, the memory controller 100 searches the history table in the RAM 120, and retrieves the shift amounts Δ for the respective read operations AR to CR corresponding to the read target cell unit CU.

In step ST20, the memory controller 100 issues commands for the shift read operation, based on the retrieved shift amounts Δ. At this time, for example, a command sequence, which the memory controller 100 issues, includes information indicative of the shift amounts Δ, and the chip Chip applies read reference voltages to the read target cell unit CU based on the information. Thereby, the chip Chip reads data from the read target cell unit CU as the pre-error-correction read data SR (including pre-error-correction upper read data SR_U and pre-error-correction lower read data SR_L) by using shifted read reference voltages to which the shift amounts Δ retrieved from the history table are applied, and outputs the pre-error-correction read data SR to the memory controller 100. In the memory controller 100, the pre-error-correction read data SR is transferred to the ECC circuit 160, and also is stored in the buffer memory 181 for read voltage correction.

In step ST30, the ECC circuit 160 executes the error correction operation for the pre-error-correction read data SR. The ECC circuit 160 successfully corrects the pre-error-correction read data SR (step ST30; yes), the ECC circuit 160 stores the post-error-correction read data EXP (including post-error-correction upper read data EXP_U and post-error-correction lower read data EXP_L), which is the corrected pre-error-correction read data, in the buffer memory 181 for the read voltage correction. Then, the process proceeds to step ST40.

In step ST40, the read voltage correction circuit 180 executes the shift amount calculation. The details of the shift amount calculation will be described later.

In step ST50, the memory controller 100 updates the history table by storing the shift amounts Δ calculated in step ST40 in a corresponding area in the history table of the RAM 120.

On the other hand, if the ECC circuit 160 fails to correct the pre-error-correction read data SR in step ST30 (step ST30; no), the process proceeds to step ST60.

In step ST60, the memory controller 100 executes a retry sequence to retry the data read operation. For example, the memory controller 100 again executes the shift read operation by using read reference voltages changed in accordance with a predetermined algorithm, and tries error correction of the data which is read by the retried shift read operation.

In step ST70, the memory controller 100 determines, based on the result of the retry sequence, whether the variation of the threshold voltage distributions is within a tolerable range or not. If it is determined that the variation of the threshold voltage distributions is within the tolerable range, based on the result of the retry sequence, the memory controller 100 determines that a refresh operation is not required (step ST70; yes), and finishes the read operation. On the other hand, if it is determined that the variation of the threshold voltage distribution is outside the tolerable range, based on the result of the retry sequence, the memory controller 100 determines that the refresh process is required (step ST70; no), and the process proceeds to step ST80. The refresh operation is performed, for example, to reinstate the varied threshold voltage distributions to or nearly to the ideal threshold voltage distributions, by writing the error-corrected data in the memory cell array 11 once again.

In step ST80, the memory controller 100 issues a refresh command to execute the refresh process.

Then, the series of operations described above ends.

1.2.2 Shift Amount Calculation

Next, the shift amount calculation in the memory system according to the first embodiment will be described.

Figure 10:
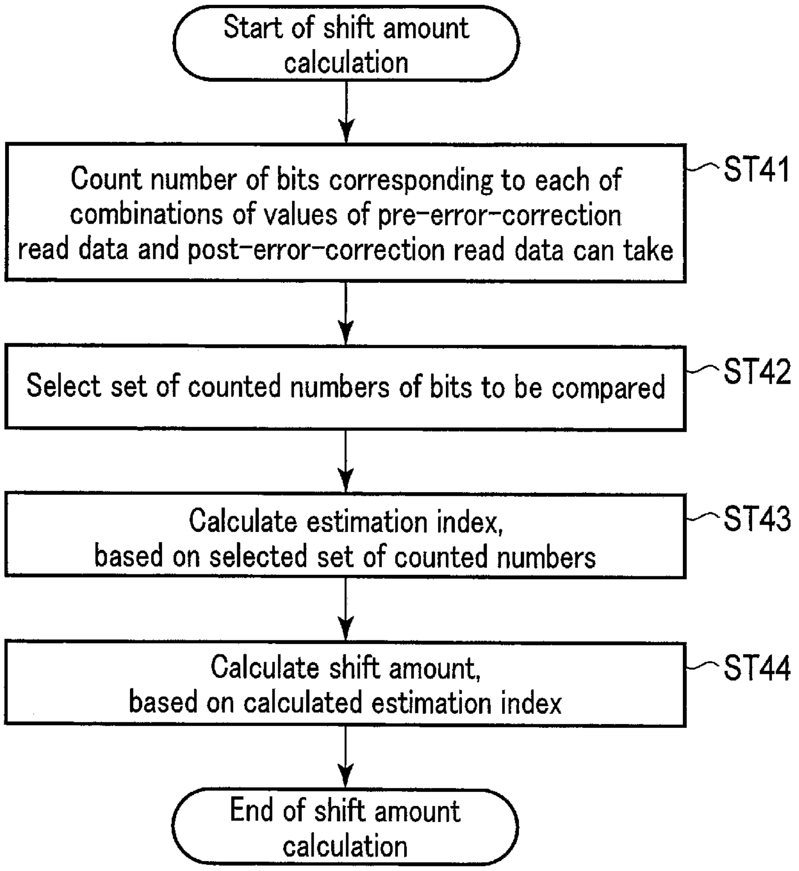
FIG. 10 is a flowchart of the shift amount calculation in the memory system according to the first embodiment.

FIG. 10 shows a flowchart for describing the shift amount calculation in the memory system according to the first embodiment. FIG. 10 illustrates the details of step ST40 shown in FIG. 9.

As illustrated in FIG. 10, in step ST41, the bit counter 182 counts the number of bits corresponding to each of the possible combinations of values of the pre-error-correction read data SR and the post-error-correction read data EXP stored in the buffer memory 181 for the read target cell unit.

In step ST42, the bit selector 183 selects a set of the counted numbers of bits to be compared, from the count values corresponding to the respective combinations of values in step ST41.

In step ST43, the estimation index calculation circuit 184 calculates the estimation index, based on the set of the counted numbers selected in step ST42.

In step ST44, the shift amount calculation circuit 185 calculates the shift amount Δ, based on the estimation index calculated in step ST43.

Then, the shift amount calculation operation ends.

Figure 11:
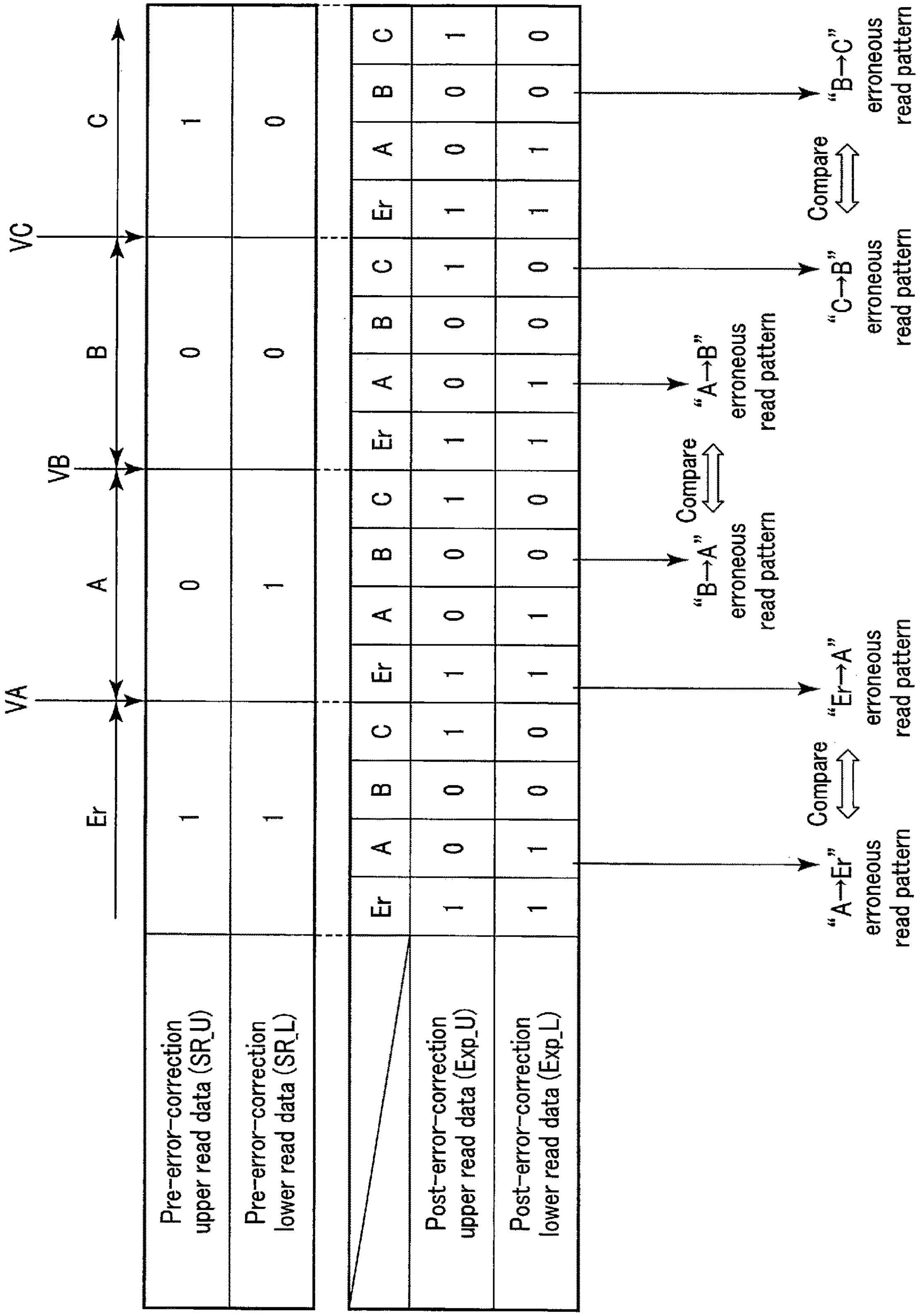
FIG. 11 schematically illustrates a process of the shift amount calculation which is performed until count values are selected for calculation of an estimation index in the memory system according to the first embodiment.

FIG. 11 schematically shows operations executed to select the set of count values for the estimation index calculation in the shift amount calculation in the memory system according to the first embodiment. FIG. 11 corresponds to steps ST41 and ST42 in FIG. 10.

In the example illustrated in FIG. 11, the number of combinations of values, C0=(SR_U, SR_L, EXP_U, EXP_L), of the pre-error-correction read data SR of two bits and the post-error-correction read data EXP of two bits is 2^4 (2 to the 4 times)=16. Among the 16 combinations, the four combinations, in which the valued of the set (SR_U, SR_L) of the pre-error-correction read data coincides with the values of the set (EXP_U, EXP_L) of the post-error-correction read data, indicate that the read data (i.e. the pre-error-correction read data) is correct. For example, the combination C0=(1, 1, 1, 1) indicates that data of the "Er" state is correctly read from the memory cell transistor MT which stores data of the "Er" state. Similarly, the combinations C0=(0, 1, 0, 1), C0=(0, 0, 0, 0) and C0=(1, 0, 1, 0) indicate that the read data of the "A" state, "B" state and "C" state are correct.

On the other hand, the other 12 combinations, in which the values of the set (SR_U, SR_L) of the pre-error-correction read data does not coincide with the values of the set (EXP_U, EXP_L) of the post-error-correction read data, indicate that the read data (i.e. the pre-error-correction read data) is erroneous. For example, the combination C0=(1, 1, 0, 1) indicates that the data of the "Er" state read from the memory cell transistor MT is erroneous while the memory cell transistor MT actually stores the data of the "A" state. In addition, for example, the combination C0=(0, 1, 1, 1) indicates that the data of the "A" state read from the memory cell transistor MT is erroneous while the memory cell transistor MT actually store the data of the "Er" state.

In step ST41 in FIG. 10, the bit counter 182 classifies the memory cell transistors MT in the read target cell unit CU according to values of the above-described 16 combinations C0 that the data read from the memory cell transistors MT have. Then, the bit counter 182 counts the number of memory cell transistors MT (as the number of bits) in each group classified according to the values of the 16 combinations C0.

In step ST42 in FIG. 10, the bit selector 183 selects, as one set, the counted numbers for two combinations which meet the condition described below, among the 16 combinations C0. In order to calculate the shift amount for a certain read reference voltage VCGR which distinguishes the first state and second state, the bit selector 183 selects, as one set, the counted number corresponding to a "first state→second state" erroneous read pattern and the counted number corresponding to a "second state→first state" erroneous read pattern. Here, the "first state→second state" erroneous read pattern indicates a case in which the data of the second state, which neighbors the first state which is distinguished by the read reference voltage VCGR, read from the memory cell transistor MT is erroneous while the memory cell transistor MT actually stores the data of the first state. In addition, the "second state→first state" erroneous read pattern indicates a case in which the data of the first state read from the memory cell transistor MT is erroneous while the memory cell transistor MT actually stores the data of the second state.

Accordingly, for the read reference voltages VA, VB and VC, the bit selector 183 can select six combinations from the 16 combinations C0, and can form three sets from the selected six combinations. For example, when the bit selector 183 calculates the shift amount Δ for the read reference voltage VA ((first state, second state)=(Er, A)), the bit selector 183 selects, as one set, the counted number corresponding to the "A→Er" erroneous read pattern, which is indicated by combination C0=(1, 1, 0, 1) and the counted number corresponding to the "Er→A" erroneous read pattern, which is indicated by combination C0=(0, 1, 1, 1). In addition, when the bit selector 183 calculates the shift amount Δ for the read reference voltage VB ((first state, second state)=(A, B)), the bit selector 183 selects, as one set, the counted number corresponding to the "B→A" erroneous read pattern, which is indicated by combination C0=(0, 1, 0, 0), and the counted number corresponding to the "A→B" erroneous read pattern, which is indicated by combination C0=(0, 0, 0, 1). Besides, when the bit selector 183 calculates the shift amount Δ of the read reference voltage VC ((first state, second state)=(B, C)), the bit selector 183 selects, as one set, the counted number corresponding to the "C→B" erroneous read pattern, which is indicated by combination C0=(0, 0, 1, 0), and the counted number corresponding to the "B→C" erroneous read pattern, which is indicated by combination C0=(1, 0, 0, 0).

By operating as described above, the bit selector 183 selects a set of the counted numbers corresponding to two combinations in the shift amount calculation operation for each of the read reference voltages VA, VB and VC used in the read operations AR to CR.

Figure 12:
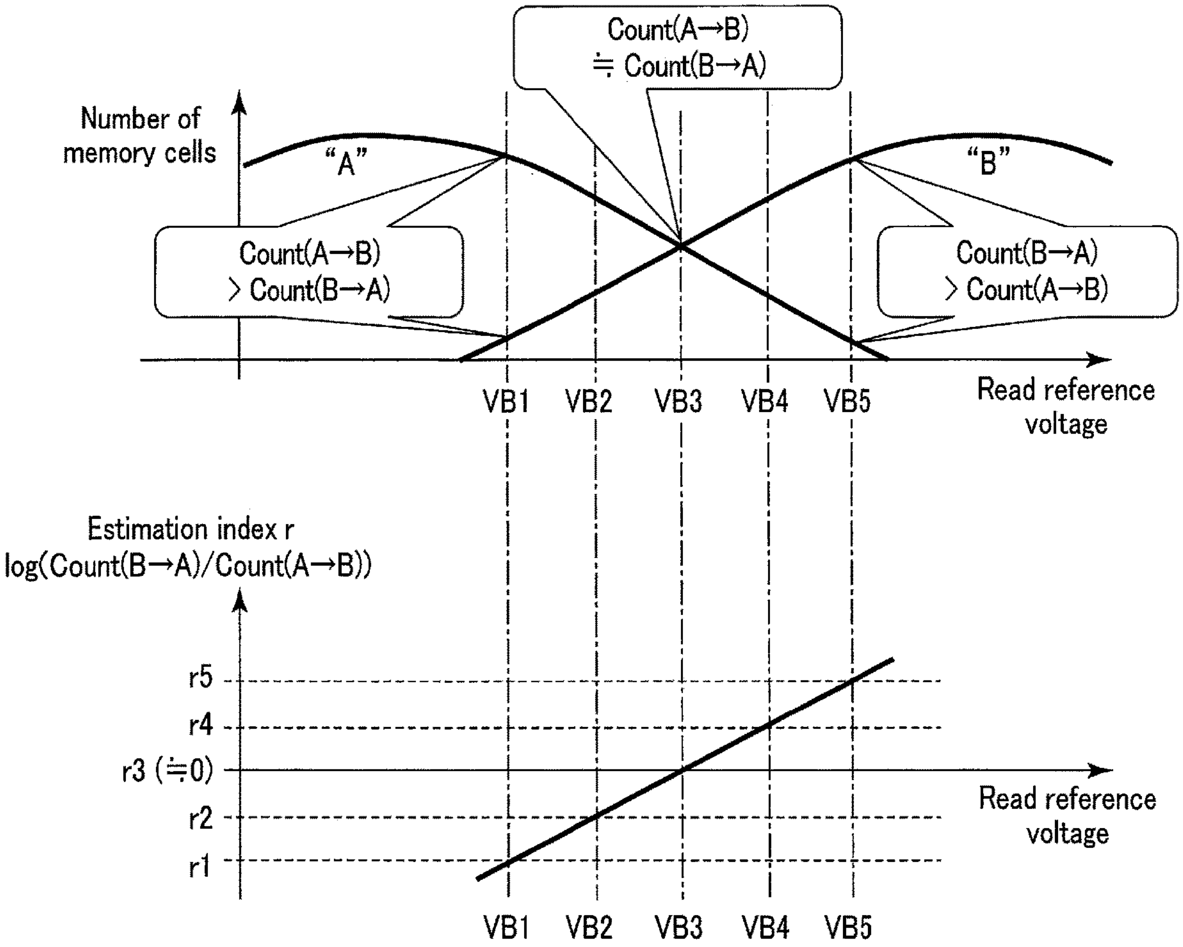
FIG. 12 schematically illustrates a process of calculating the estimation index, in the shift amount calculation for the memory system according to the first embodiment.

FIG. 12 schematically illustrates a process of calculating the estimation index, in the shift amount calculation performed in the memory system according to the first embodiment. FIG. 12 corresponds to step ST43 in FIG. 10.

An upper part of FIG. 12 illustrates threshold voltage distributions of memory cell transistors MT which are set in the "A" state and the "B" state, as an example of two neighboring threshold voltage distributions. The two threshold voltage distributions may vary due to various factors, and overlap each other. The upper part of FIG. 12 illustrates how the number of memory cell transistors MT corresponding to the "A→B" erroneous read pattern and the number of memory cell transistors MT corresponding to the "B→A" erroneous read pattern increase or decrease when read voltages VB (VB1 to VB5) are applied to the memory cell transistors MT the threshold voltages of which have the two threshold voltage distributions shown in the upper part of FIG. 12. A lower part of FIG. 12 illustrates, by way of example, a relationship between the read reference voltages VB (VB1 to VB5) and estimation indices r which are calculated from the counted numbers of memory cell transistors MT corresponding to the "A→B" erroneous read pattern (referred to as Count (A→B)) and the counted numbers of memory cell transistors MT corresponding to the "B→A" erroneous read pattern (referred to as Count (B→A)).

As illustrated in the upper part of FIG. 12, the voltage VB3 corresponds to, for example, a voltage at which the curves of the two threshold voltage distributions corresponding to the "A" state and "B" state cross, i.e. a voltage at which the numbers of memory cell transistors having the same threshold voltage in the "A" and "B" states are equal between the two neighboring threshold voltage distributions. When the profiles of the two neighboring threshold voltage distributions can be regarded as being substantially identical, the number of memory cell transistors of the "A" state having threshold voltages higher than the voltage VB3 (as shown in the threshold voltage distribution of the "A" state) and the number of memory cell transistors of the "B" state having threshold voltages lower than the voltage VB3 (as shown in the threshold voltage distribution of the "B" state) can be substantially equal. Thus, if data are read from memory cell transistors MT of the "A" or "B" state with the read reference voltage VB3, Count (A→B) and Count (B→A) may probably be equal. In other words, the ratio of Count(B→A) to Count (A→B) will be "1".

If the read reference voltage is gradually increased from the voltage VB3 to voltage VB4 and further to voltage VB5, Count (A→B) will gradually decreases while Count (B→A) will sharply increase. Thus, the ratio of Count (B→A) to Count (A→B) will sharply increase from "1". On the other hand, if the read reference voltage is gradually decreased from the voltage VB3 to voltage VB2 and further to voltage VB1, Count (A→B) will sharply increase while Count (B→A) will gradually decreases. Thus, the ratio of Count (B→A) to Count (A→B) will sharply decrease from "1".

Thus, as illustrated in the lower part of FIG. 12, for example, in which logarithmic values of the ratios are plotted on the ordinate axis, the logarithmic value r3 of the ratio taken at the voltage VB3 becomes $r3 \approx 0$, and can have a positive correlation with the read reference voltage at voltages near the voltage VB3. For example, the estimation index calculation circuit 184 calculates the logarithmic value of the ratio of Count (state 2→state 1) to Count (state 1→state 2) as the estimation index r, and sends the estimation index r to the shift amount calculation circuit 185. Thereby, the shift amount calculation circuit 185 can estimate how far the present read voltage is distant from the voltage VB3 at which the estimation index r is substantially zero, in accordance with the value of the estimation index r.

Figure 13:
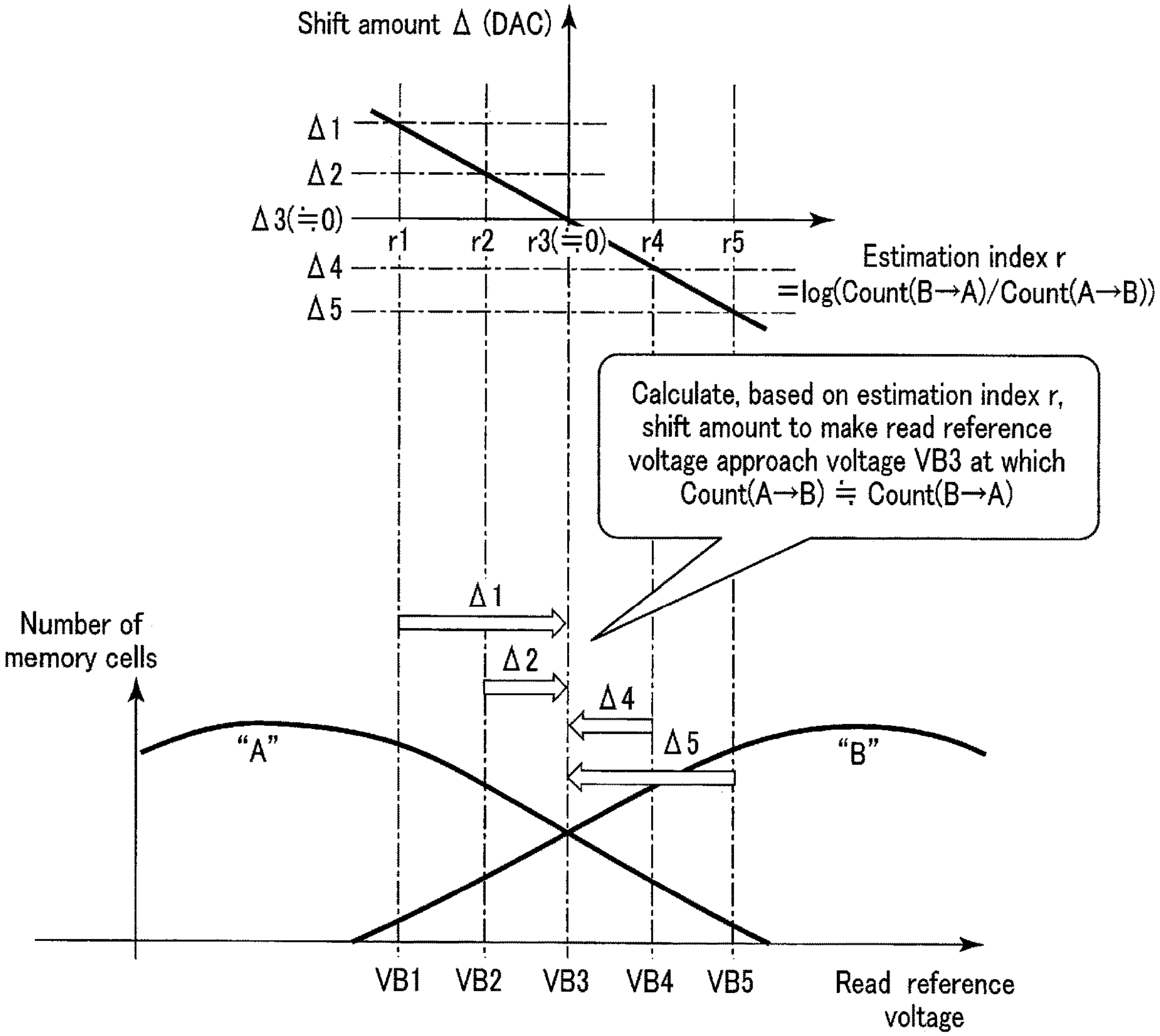
FIG. 13 schematically illustrates a process of calculating a shift amount based on the estimation index, in the shift amount calculation for the memory system according to the first embodiment.

FIG. 13 schematically illustrates a process of calculating the shift amount Δ, based on the estimation index r, in the shift amount calculation performed in the memory system according to the first embodiment. FIG. 13 corresponds to step ST44 in FIG. 10.

An upper part of FIG. 13 illustrates values of the shift amounts Δ (Δ1 to Δ5) which are set in accordance with values of the estimation indices r (r1 to r5). A lower part of FIG. 13 illustrates a relationship between the shift amounts Δ and the read reference voltages VB.

In the example illustrated in the upper part of FIG. 13, when the estimation index r is "0", the shift amount Δ is set to be "0" and is set to have a negative correlation with the estimation index r. For example, the shift amount Δ3 corresponding to the estimation index r3 (≈0) is set to have a value near "0" (≈0). In addition, the shift amount Δ is set so that the values of the shift amounts Δ1, Δ2, Δ4 and Δ5 for the estimation indices r1, r2, r4 and r5 of ($r1<r2<r3$ (0 or $\approx 0)<r4<r5$) have a relation ($\Delta 1>\Delta 2>\Delta 3$ (0 or $\approx 0)>\Delta 4>\Delta 5$).

With the values of the shift amounts Δ set in this manner, if a value greater than the voltage VB3 is used for the read reference voltage VB (as a result, the estimation value r will become positive), a negative shift amount Δ (<Δ3) (e.g. the shift amounts Δ4 and Δ5) can be obtained so as to make the read reference voltage closer to the voltage VB3, as illustrated in the lower part of FIG. 13. On the other hand, if a value less than the voltage VB3 is used for the read reference voltage VB (as a result, the estimation value r will become negative), a positive shift amount Δ (>Δ3) (e.g. the shift amounts Δ1 and Δ2) can be obtained so as to make the read reference voltage VB closer to the voltage VB3.

Besides, the absolute value of the shift amount Δ is set to be smaller as the difference of the read reference voltage VB from the voltage VB3 (to which the absolute value of the estimation value r corresponds) is smaller, and the absolute value of the shift amount Δ is set to be greater as the difference of the read reference voltage VB from the voltage VB3 (the absolute value of the estimation value r) is greater. Thereby, the magnitude of the shift amount Δ can be varied depending on the magnitude of the deviation of the read reference voltage VB from the voltage VB3, and the convergence of the reference voltage VB to the voltage VB3 can be expedited. In general, when the profiles of two neighboring threshold voltage distributions can be regarded as being substantially the same, it is highly possible that the number of fail bits can be minimized by setting the read reference voltage VB to a voltage corresponding to a position at which the curves of the two threshold voltage distributions cross. Thus, the read reference voltage VB can be made closer to the optimal value by use of the above-described calculation of the shift amount Δ which makes the read reference voltage VB closer to the voltage VB3.

As described above, in order to calculate the shift amounts Δ to obtain optimal values of the read reference voltages VCGR (e.g. VA, VB and VC for example, for the read operations AR to CR), it may be practical to repeat the correction until the ratio of the numbers of fail bits (i.e. Count (state 2→state 1) and Count (state 1→state 2) becomes 1:1 between the data states having overlapping threshold voltage distributions. However, the calculation of the shift amount Δ is not limited to this method, particularly, when the profiles of the overlapping threshold voltage distributions are not identical, and the overlapping areas of the threshold voltage distributions are not identical.

1.3 Advantageous Effects of the First Embodiment

In the memory system according to the first embodiment, the buffer memory 181 for read voltage correction stores the pre-error-correction read data SR_U and SR_L, and post-error-correction read data EXP_U and EXP_L for the read target cell unit CU. The bit counter 182 counts the number of bits corresponding to each of the combinations C0=(SR_U, SR_L, EXP_U, EXP_L) for the data read from the read target cell unit CU. In order to calculate the shift amounts Δ for the read reference voltages VA to VC, the bit selector 183 selects, from among the combinations C0, the set of C0=(1, 1, 0, 1) and (0, 1, 1, 1), the set of (0, 1, 0, 0) and (0, 0, 0, 1), and the set of (0, 0, 1, 0) and (1, 0, 0, 0), respectively. The estimation index calculation circuit 184 calculates, as the estimation index r, the logarithmic value of the ratio of Count (state 2→state 1) to Count (state 1→state 2) for each of the selected sets. The shift amount calculation circuit 185 calculates the shift amount Δ for each of the read reference voltages VA to VC based on the estimation index r. Thereby, the memory controller 100 can calculate the shift amounts Δ, each time the read operation is executed. Thus, the shift amounts Δ can be calculated without executing a further read operation in contrast with the tracking operation which requires a further read operation to calculate the shift amounts Δ. Therefore, an increase of latency due to the calculation of the shift amounts Δ can be suppressed.

In addition, it is determined whether the shift amount Δ has a positive value or a negative value, based on whether the estimation index r is above or below an estimation reference (e.g. "0"). Thereby, if the read reference voltage is greater than a voltage corresponding to a position at which the curves of two overlapping threshold voltage distributions cross, a negative shift amount Δ can be obtained, and if the read reference voltage is less than the voltage corresponding to the position, a positive shift amount Δ can be obtained. Therefore, the read reference voltage can be corrected toward the voltage corresponding to the position at which the curves of two overlapping threshold voltage distributions cross.

Furthermore, the shift amounts Δ are calculated so as to have a greater absolute value, as the absolute value of the difference between the estimation index r and the estimation reference (e.g. of r3) becomes greater. Thereby, as the difference of the read reference voltage from the optimal voltage corresponding to the position at which two threshold distribution curves cross is greater, a greater shift amount Δ can be obtained. If the read reference voltage is near the optimal voltage, a smaller shift amount Δ can be obtained. Thus, the read reference voltage can be made to converge to the optimal voltage with the read voltage correction of the read operation being repeated.

1.4 First Modification

In the example according to the first embodiment, the shift amount calculation is executed, and the history table is updated, for every case in which the error correction is successfully conducted. However, this is not exclusive. For example, the shift amount calculation may be executed only when the number of fail bits exceeds a predetermined value. In the description of a first modification of the first embodiment, the same configurations and operations as those in the first embodiment are not explained again, and differences in configurations and operations from the first embodiment will be described.

Figure 14:
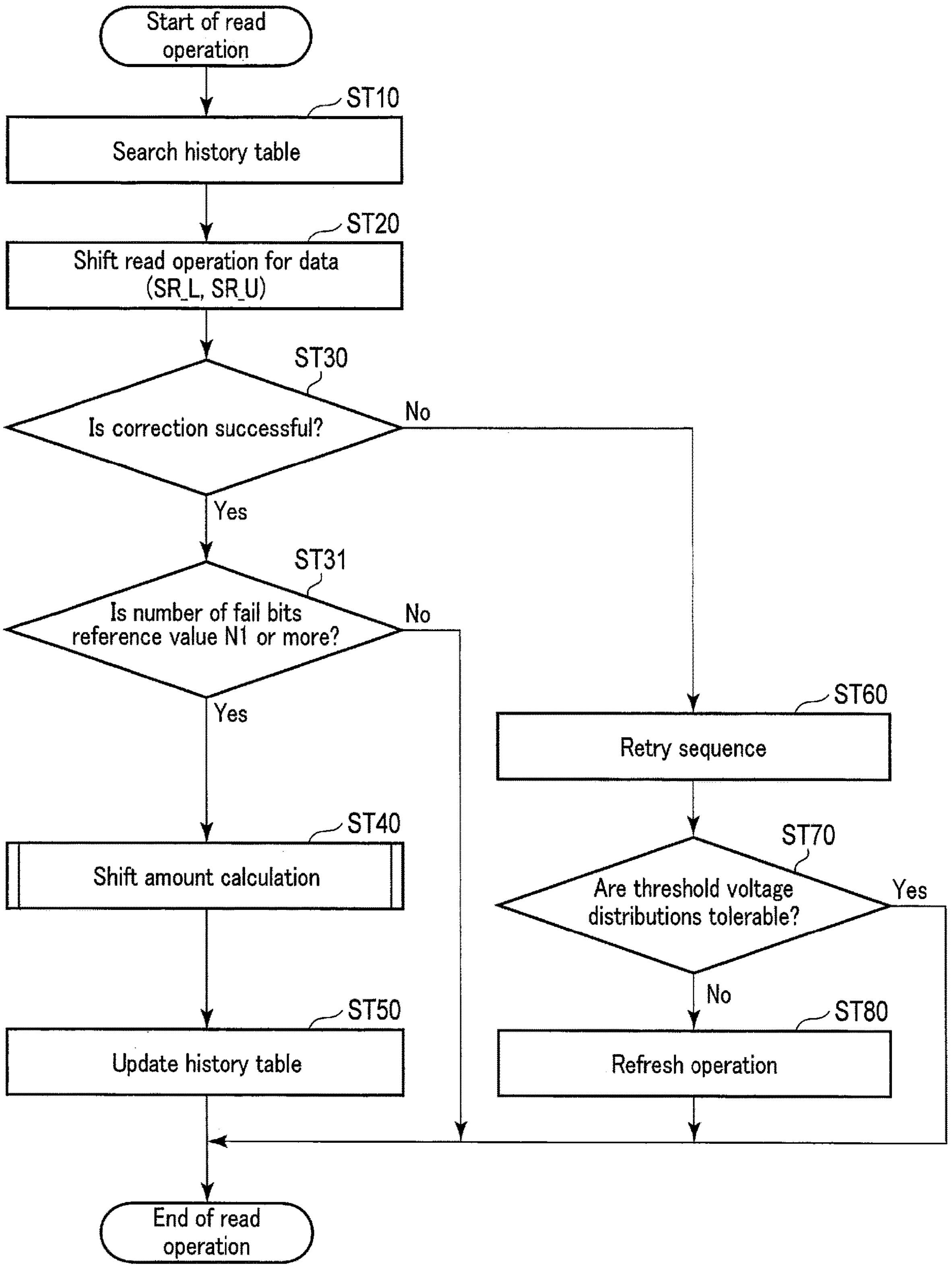
FIG. 14 is a flowchart of a read operation which includes a shift amount calculation in a memory system according to a first modification of the first embodiment.

FIG. 14 is a flowchart a read operation which includes shift amount calculation in a memory system according to the first modification of the first embodiment. FIG. 14 corresponds to FIG. 9 described in the first embodiment, and shows that a new step ST31 is added between step ST30 and step ST40 in FIG. 9.

As illustrated in FIG. 14, since the process of steps ST10 to ST30 is the same as that of FIG. 9, a description thereof is omitted. If error correction is successfully executed in step ST30 (step ST30; yes), the process proceeds to step ST31. If the error correction fails (step ST30; no), the process proceeds to step ST60. Since the process of steps ST60 to ST80 is the same as that of FIG. 9, a description thereof is omitted.

In step ST31, the memory controller 100 compares the pre-error-correction read data SR and post-error-correction read data EXP, and counts the number of fail bits ("fail bit number"). The number of fail bits is calculated, for example, by counting the number of bits of data for the read target cell unit CU having different data between the pre-error-correction read data SR and post-error-correction read data EXP as shown in FIG. 11. If the counted number of fail bits is equal to or more than a reference value N1 (step ST31; yes), the memory controller 100 determines that the shift amount calculation is required, and executes step ST40. Since the process of step ST40 and ST50 is the same as that of FIG. 9, a description thereof is omitted. Note that the reference value N1 is arbitrarily selected natural number which is not greater than the maximum number of error bits which can be corrected by the ECC circuit 160. On the other hand, if the counted number of fail bits is less than the reference value N1 (step ST31; no), the memory controller 100 determines that the shift amount calculation is not required, and finishes the read operation without executing the shift amount calculation.

By executing the above-described steps, the read operation ends.

In the memory system according to the first modification of the first embodiment, the memory controller 100 compares the pre-error-correction read data SR and the post-error-correction read data EXP for data read from the target cell unit CU, and counts the number of fail bits. Based on the counted number of fail bits, the memory controller 100 determines whether the shift amount calculation is required or not. Thereby, if the deviation is small in the read reference voltages with reference to the appropriate voltages determined based on the profiles of the overlapping threshold voltage distributions, and thus the number of bits the data of which are erroneously read is small, the controller 100 determines that the shift amount calculation is not required. Thus, the number of times of execution of the shift amount calculation can be decreased, while the shift amount calculation can be executed whenever the threshold voltage distributions vary to such a degree that the read reference voltages need to be corrected. Therefore, the reduction of the number of times of execution of the shift amount calculation can suppress an increase of latency due to the read voltage correction.

1.5 Second Modification

In the examples described in the first embodiment and the first modification of the first embodiment, in the patrol read operation, every cell unit CU is periodically patrolled to execute the read operation for the cell units C. However, this is not exclusive. For example, as regards the target of the patrol read operation, cell units CU to be patrolled in a certain repetition of the patrol read operation may be determined as targets of the patrol read operation in accordance with the results of the previously executed shift amount calculation. In the description below, a description of the same configurations and operations as those of the first embodiment is omitted, and different configurations and operations from the first embodiment will be described.

FIG. 15 schematically illustrates an example of a history table used in a memory system according to a second modification of the first embodiment. FIG. 15 corresponds to FIG. 7 in the first embodiment.

As illustrated in FIG. 15, in the history table of this example, entries for a priority patrol flag and a patrol count value are provided in addition to the entries for the shift amounts Δ.

The priority patrol flag is allocated to, for example, each of pages (in the example of FIG. 15, each set of a lower page and an upper page). The priority patrol flag is provided for, for example, a cell unit CU for which the patrol read operation including the shift amount calculation is executed with priority.

The patrol count value is indicative of, for example, the number of times of successive execution of the patrol read operation including the shift amount calculation for the cell unit CU. If the patrol count value is large, this indicates that the shift amount calculation is executed many times with priority for the same cell unit CU. The state in which the patrol count value is excessively large suggests that error correction can hardly be achieved by the shift amount calculation. The error correction may fail, for example, in the event that the deviation of the read reference voltages from the optimal voltages is not improved, or in the event that the overlapping area of the profiles of the neighboring threshold voltage distributions is excessively large even if the read reference voltages can be adjusted to the optimal voltage.

Figure 16:
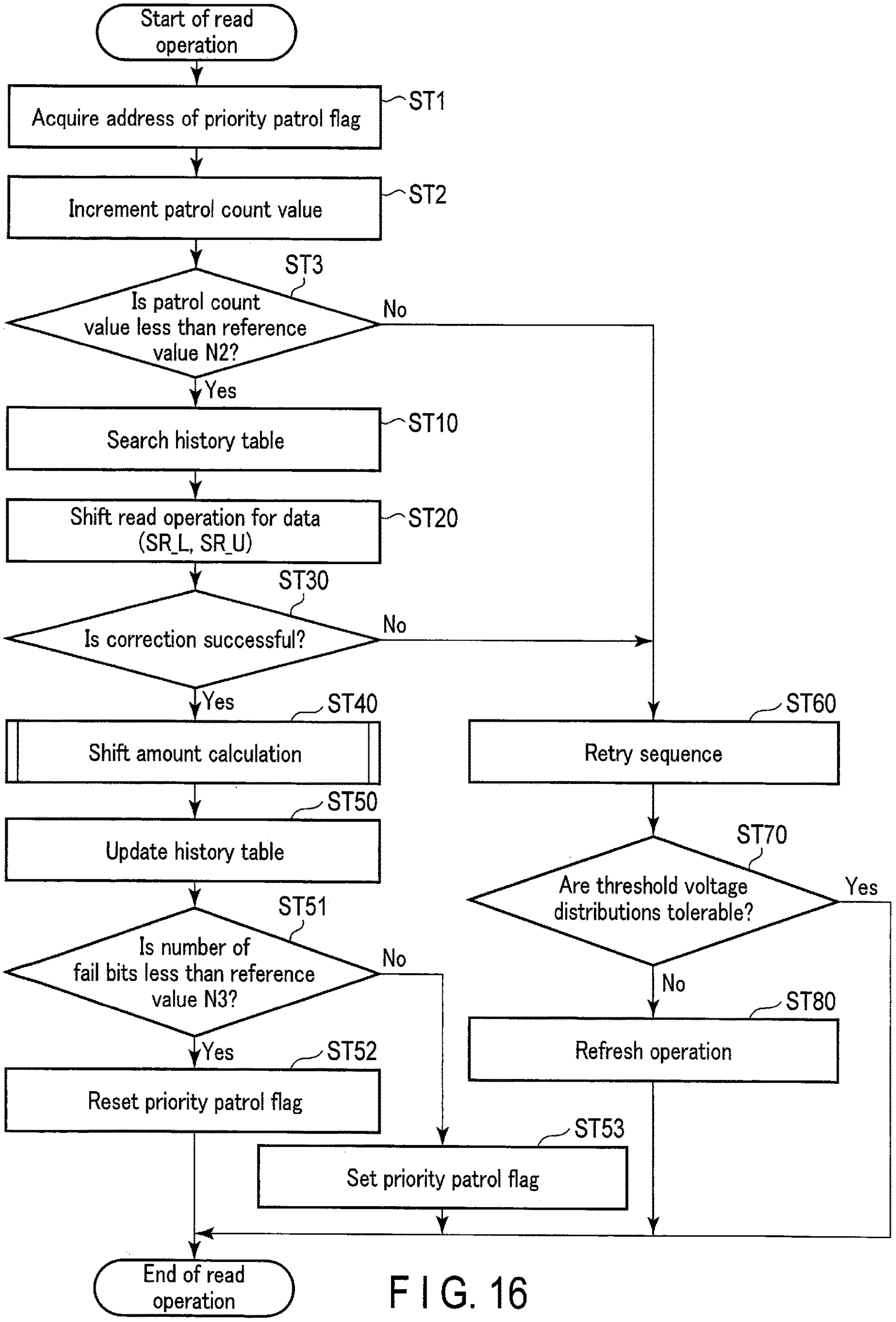
FIG. 16 illustrates a flowchart of a read operation which includes a shift amount calculation in the memory system according to the second modification of the first embodiment.

FIG. 16 is a flowchart of a read operation which includes shift amount calculation, executed in the memory system according to the second modification of the first embodiment. FIG. 16 corresponds to FIG. 9 described in the first embodiment, and shows that new steps ST1 to ST3 are added before step ST10 in FIG. 9, and new steps ST51, ST52 and ST53 are added after step ST50.

As illustrated in FIG. 16, when the memory controller 100 starts the patrol read operation, in step ST1, the memory controller 100 searches the history table and acquires an address of a page for which the priority patrol flag is set. Based on the address, the memory controller 100 executes, with priority, the patrol read operation including the shift amount calculation for the page for which the priority patrol flag is set.

In step ST2, the memory controller 100 further searches the history table, and increments the patrol count value corresponding to the page for which the priority patrol flag is set.

In step ST3, the memory controller 100 determines whether the patrol count value incremented in step ST2 is less than a reference value N2. An arbitrarily selected natural number, for instance, is applicable as the reference value N2. If the patrol count value is less than the reference value N2 (step ST3; yes), the memory controller 100 determines that an improvement of the number of fail bits by the shift amount calculation can be expected, and then, the process proceeds to step ST10. On the other hand, when the patrol count value is not less than the reference value N2 (step ST3; no), the memory controller 100 determines that an improvement of the number of fail bits can no longer be expected even if the shift amount calculation is further executed, and then, the process proceeds to step ST60. Since the process of steps ST10 to ST50 and steps ST60 to ST80 is the same as that of FIG. 9, a description thereof is omitted.

Following step ST50, the process proceeds to step ST51. In step ST51, the memory controller 100 compares the pre-error-correction read data SR and post-error-correction read data EXP for data read from the target cell unit for the selected page, and counts the number of fail bits. If the counted number of fail bits is less than a reference value N3 (step ST51; yes), the memory controller 100 determines that the number of fail bits is improved to such a degree that further execution of the shift amount calculation is not required, and the process proceeds to step ST52. In step ST52, the memory controller 100 searches the history table, and resets the priority patrol flag corresponding to the selected page of which the number of fail bits is determined to be sufficiently improved in step ST51, and then, the read operation ends. In this case, in the patrol read operation in the next repetition, the shift amount calculation for the cell unit CU having the page previously selected with priority is omitted since the priority patrol flag is not set for that cell unit CU.

On the other hand, when the counted number of fail bits is not less than the reference value N3 (step ST51; no), the memory controller 100 determines that further execution of the shift amount calculation is necessary, and the process proceeds to step ST53. In step ST53, the memory controller 100 searches the history table, and sets (or keeps the setting of) the priority patrol flag corresponding to the selected page, of which the number of fail bits is determined not to be sufficiently improved in step ST51. Then, the read operation ends. In this case, in the patrol read operation in the next repetition, the shift amount calculation for the cell unit CU having the page previously selected is executed again since the priority patrol flag is set for that cell unit CU.

In the memory system according to the second modification of the first embodiment, the history table stores the priority patrol flag and the patrol count value in addition to the shift amounts Δ. When the memory controller 100 executes the patrol read operation, the memory controller 100 selects the page which requires improvement of the number of fail bits with priority, by referring to the priority patrol flag, and executes the shift amount calculation for this selected page. Thereby, the patrol read operation can be executed with priority for the page which requires the shift amount calculation, and an increase of latency of the read operation can be suppressed.

In addition, by referring to the patrol count value, the memory controller 100 determine that, for the page which requires the shift amount calculation with priority, improvement of the number of fail bits is not expected even after the shift amount calculation is executed with priority. For the same page, the memory controller 100 can then execute the retry sequence and execute, when necessary, the refresh process. Thereby, it is possible to prevent the latency from increasing due to excessive repetitions of execution of the shift amount calculation for the same page while improvement of the number of fail bits is not expected for that page.

Besides, after the execution of the shift amount calculation, the memory controller 100 can determine whether further execution of the shift amount calculation with priority is necessary or not by counting the number of fail bits. Thereby, if the deviation of the threshold voltage distributions with reference to the optimal read reference voltages is not large, and thus there are few data which are erroneously read, the memory controller 100 can determine that the shift amount calculation is not required. Thus, the shift amount calculation can be selectively executed for the cell units CU on a basis of need to correct the read reference voltages. Therefore, the number of times of execution of the shift amount calculation can be decreased, and an increase of latency due to the number of times of execution of the read voltage correction can be suppressed.

2. Second Embodiment

Next, a memory system according to a second embodiment will be described.

In the first embodiment and the first modification and second modification thereof, the pre-error-correction read data SR is read for all pages in the cell unit CU, and the shift amount calculation is executed by using all post-error-correction read data EXP corresponding to the pre-error correction data. However, for example, if a sufficient temporary memory space cannot be allocated in the buffer memory 181 for the read voltage correction, the shift amount calculation may be executed without using the post-error-correction read data EXP of all pages. In the description below, a description of the same configurations and operations as those of first embodiment is omitted, and different configurations and operations from the first embodiment will be described.

2.1 Shift Amount Calculation

Figure 17:
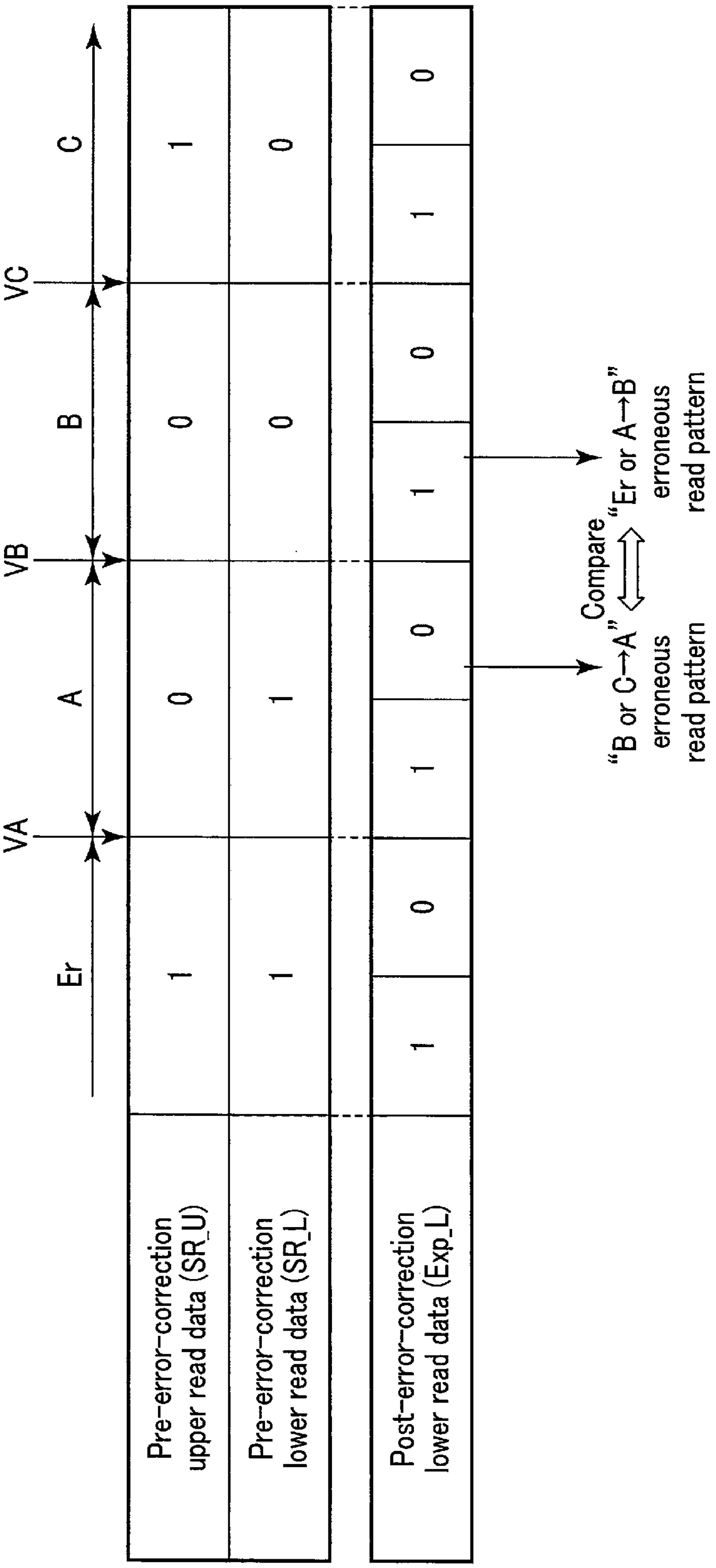
FIG. 17 schematically illustrates a shift amount calculation in a memory system according to a second embodiment.
Figure 18:
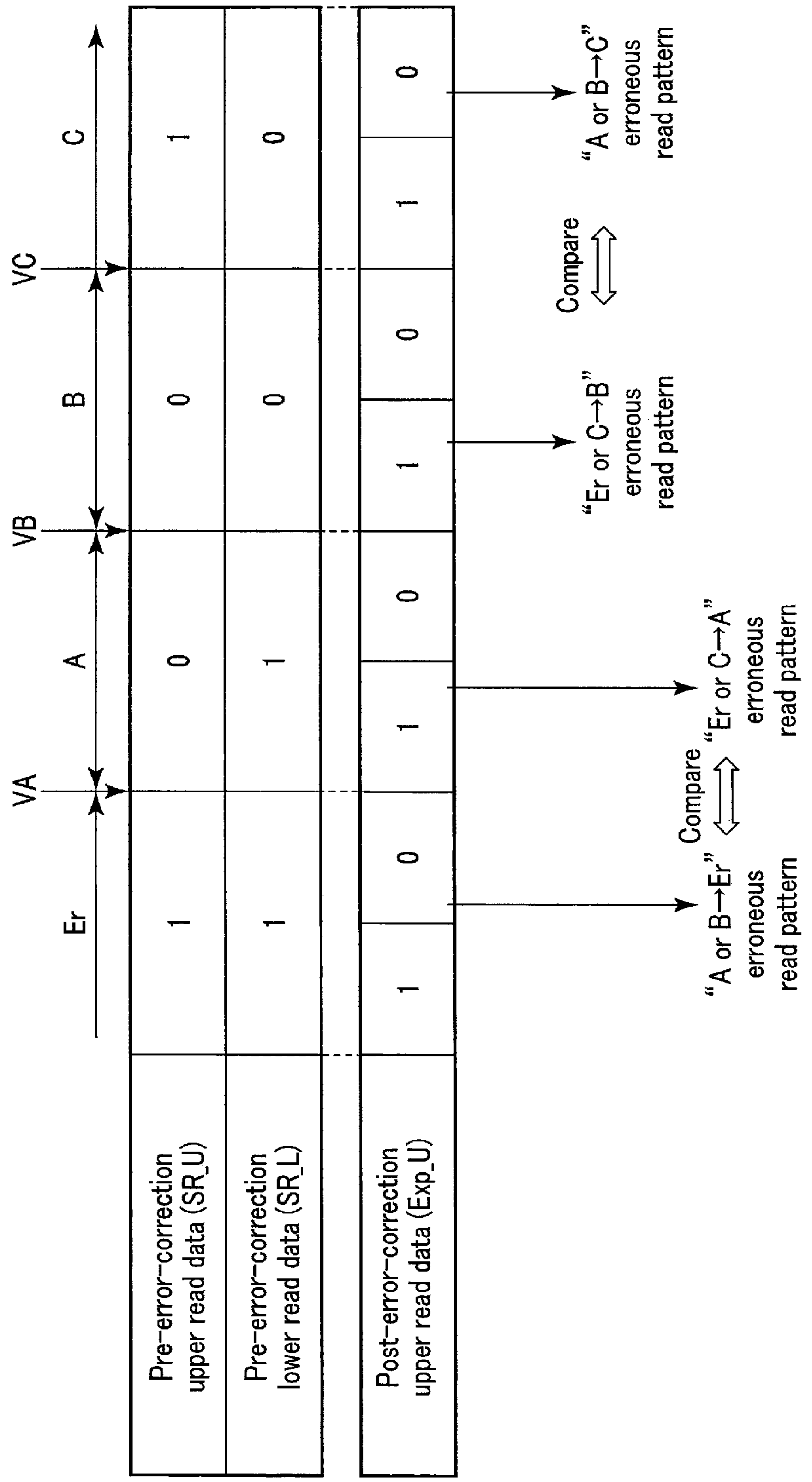
FIG. 18 schematically illustrates a process of the shift amount calculation in the memory system according to the second embodiment.

FIG. 17 and FIG. 18 are schematic diagrams for describing a process up to the selection of count values of an estimation index calculation target, in the shift amount calculation in the memory system according to the second embodiment. FIG. 17 and FIG. 18 correspond to FIG. 11 described in the first embodiment. FIG. 17 illustrates an example in which the counted numbers of fail bits for the estimation index calculation are selected by using the post-error-correction lower read data EXP_L, without using the post-error-correction upper read data EXP_U, of the post-error-correction read data EXP. FIG. 18 illustrates an example in which the counted numbers for the estimation index calculation are selected by using the post-error-correction upper read data EXP_U, without using the post-error-correction lower read data EXP_L, of the post-error-correction read data EXP.

To begin with, referring to FIG. 17, a description is given in the example of using the post-error-correction lower read data EXP_L without using the post-error-correction upper read data EXP_U.

As illustrated in FIG. 17, in the pre-error-correction read data SR, the memory cell transistors MT in the cell unit CU are classified into four states, namely the "Er" state to "C" state in which the pre-error-correction read data SR of the memory cell transistors MT are. However, since only the post-error-correction lower read data EXP_L for the lower page is used, the memory cell transistors MT in the cell unit CU are classified into two cases, namely "1" and "0" which correspond to the lower bit of the data of the "Er" state or "A" state, and the lower bit of the data of the "B" state or "C" state. Thus, the number of combinations of values, C1=(SR_U, SR_L, EXP_L), which the pre-error-correction read data SR and post-error-correction read data EXP can take, is 2'=4×2=8. The bit counter 182 classifies the memory cell transistors MT in the cell unit CU into groups corresponding to the above-described 8 combinations C1. Then, the bit counter 182 counts the number of classified memory cell transistors MT (as the number of bits) included in each group corresponding to each of the 8 combinations C1.

In the example of FIG. 17, the bit selector 183 selects one set of two combinations, i.e. combinations C1=(SR_U, SR_L, EXP_L)=(0, 1, 0) and (0, 0, 1), from the eight combinations C1. The combination C1=(0, 1, 0) indicates that data of the "A" state is erroneously read from the memory cell transistor MT which stores data of the "B" state or "C" state. The combination C1=(0, 0, 1) indicates that data of the "B" state is erroneously read from the memory cell transistor MT which stores data of the "Er" state or "A" state. The combination C1=(0, 1, 0) corresponds to the "B or C→A" erroneous read pattern, and the combination C1=(0, 0, 1) corresponds to the "Er or A→B" erroneous read pattern.

In general, in a threshold voltage distribution, the number of memory cell transistors MT becomes smaller as the threshold voltages of the memory cell transistors MT are farther apart from a voltage corresponding to a peak value of the threshold voltage distribution. Thus, the number of memory cell transistors having threshold voltages in a region of a threshold voltage distribution overlapping a neighboring threshold voltage distribution can be regarded as being significantly greater than the number of memory cell transistors having threshold voltages in a region overlapping a distant threshold voltage distribution which is located farther away from the neighboring threshold voltage distribution.

Accordingly, among the counted number of fail bits corresponding to the combination C1=(0, 1, 0), the number of fail bits corresponding to "B→A" erroneous read pattern can be regarded as being significantly greater than the number of fail bits corresponding to "C→A" erroneous read pattern. Thus, the counted number of fail bits corresponding to the combination C1=(0, 1, 0) can be regarded as being substantially equal to the number of fail bits corresponding to "B→A" erroneous read pattern. Similarly, among the counted number of fail bits corresponding to the combination C1=(0, 0, 1), the number of fail bits corresponding to "A→B" erroneous read pattern can be regarded as being significantly greater than the number of fail bits corresponding to "Er→B" erroneous read pattern. Thus, the counted number of fail bits corresponding to the combination C1=(0, 0, 1) can be regarded as being substantially equal to the number of fail bits corresponding to "A→B" erroneous read pattern.

In consideration of the above-described approximation, the bit selector 183 selects, as one set, the counted number corresponding to the combination C1=(0, 1, 0) which substantially corresponds to the number of fail bits corresponding to the "B→A" erroneous read pattern, and the counted number corresponding to the combination C1=(0, 0, 1) which substantially corresponds to the number of fail bits corresponding to the "A→B" erroneous read pattern, in the case of calculating the shift amount Δ for the reference voltage VB.

For the read operation BR, according to the above-described operations, the bit selector 183 can select the set of the two counted numbers for the "B→A" and "A→B" erroneous read patterns to be used in the shift amount calculation.

Next, referring to FIG. 18, a description is given in the example of using the post-error-correction upper read data EXP_U without using the post-error-correction lower read data EXP_L, of the post-error-correction read data EXP.

As illustrated in FIG. 18, in the pre-error-correction read data SR, the memory cell transistors MT in the cell unit CU are classified into four states, namely the "Er" state to "C" state in which the pre-error-correction read data SR of the memory cell transistors MT are. However, since there is only the post-error-correction upper read data EXP_U for the upper page, the memory cell transistors MT in the cell unit CU are classified into two cases, namely "1" and "0" which correspond to the upper bit of data of the "Er" state or "C" state, and the upper bit of data the "A" state or "B" state. Thus, the number of combinations of values, C2=(SR_U, SR_L, EXP_U), which the pre-error-correction read data SR and post-error-correction read data EXP can take, is 2'=4×2=8. The bit counter 182 classifies the memory cell transistors MT in the cell unit CU into groups corresponding to the above-described 8 combinations C1. Then, the bit counter 182 counts the number of classified memory cell transistors MT (as the number of bits) included in each group corresponding to each of the 8 combinations C2.

In the example of FIG. 18, the bit selector 183 selects one set of two combinations, i.e. combinations C2=(SR_U, SR_L, EXP_U)=(1, 1, 0) and (0, 1, 1), and another set including two combinations, i.e. (0, 0, 1) and (1, 0, 0), from the eight combinations C2.

The combination C2=(1, 1, 0) indicates that data of the "Er" state is erroneously read from the memory cell transistor MT which stores data of the "A" state or "B" state. The combination C2=(0, 1, 1) indicates that data of the "A" state is erroneously read from the memory cell transistor MT which stores data of the "Er" state or "C" state. The combination C2=(1, 1, 0) correspond to the "A or B→Er" erroneous read pattern, and the combination C2=(0, 1, 0) corresponds to the "Er or C→A" erroneous read pattern.

On the other hand, the combination C2=(0, 0, 1) indicates that data of the "B" state is erroneously read from the memory cell transistor MT which stores data of the "Er" state or "C" state. The combination C2=(1, 0, 0) indicates that data of the "C" state is erroneously read from the memory cell transistor MT which stores data of the "A" state or "B" state. The combination C2=(0, 0, 1) corresponds to the "Er or C→B" erroneous read pattern, and the combination C2=(1, 0, 0) corresponds to the "A or B→C" erroneous read pattern.

As described in FIG. 17, in a threshold voltage distribution, the number of memory cell transistors MT becomes smaller as the threshold voltages of the memory cell transistors MT are farther apart from a voltage corresponding to a peak value of the threshold voltage distribution. Thus, the number of memory cell transistors MT having threshold voltages in a region overlapping a neighboring threshold voltage distribution can be regarded as being significantly greater than the number of memory cell transistors having threshold voltages in a region overlapping a distant threshold voltage distribution which is located farther away from the neighboring threshold voltage distribution.

Accordingly, among the counted number of fail bits corresponding to the combination C2=(1, 1, 0), the number of fail bits corresponding to the "A→Er" erroneous read pattern can be regarded as being significantly greater than the number of fail bits corresponding to the "B→Er" erroneous read pattern. Thus, the counted number corresponding to the combination C2=(1, 1, 0) can be regarded as being substantially equal to the number of fail bits corresponding to the "A→Er" erroneous read pattern. Similarly, among the counted number of fail bits corresponding to the combination C2=(0, 1, 1), the number of fail bits corresponding to the "Er→A" erroneous read pattern can be regarded as being significantly greater than the number of fail bits corresponding to the "C→A" erroneous read pattern. Thus, the counted number corresponding to the combination C2=(0, 1, 1) can be regarded as being substantially equal to the number of fail bits corresponding to the "Er→A" erroneous read pattern.

On the other hand, among the counted number of fail bits corresponding to the combination C2=(0, 0, 1), the number of fail bits corresponding to the "C→B" erroneous read pattern can be regarded as being significantly greater than the number of fail bits corresponding to the "Er→B" erroneous read pattern. Thus, the counted number corresponding to the combination C2=(0, 0, 1) can be regarded as being substantially equal to the number of fail bits corresponding to the "C→B" erroneous read pattern. Similarly, among the counted number of fail bits corresponding to the combination C2=(1, 0, 0), the number of fail bits corresponding to the "B→C" erroneous read pattern can be regarded as being significantly greater than the number of fail bits corresponding to the "A→C" erroneous read pattern. Thus, the counted number corresponding to the combination C2=(1, 0, 0) can be regarded as being substantially equal to the number of fail bits corresponding to the "B→C" erroneous read pattern.

By utilizing the above-described approximation, the bit selector 183 selects, as one set, the counted number corresponding to the combination C2=(1, 1, 0) which is substantially equal to the number of fail bits corresponding to the "A→Er" erroneous read pattern, and the counted number corresponding to the combination C2=(0, 1, 1) which is substantially equal to the number of fail bits corresponding to "Er→A" erroneous read pattern, in the calculation of the shift amount Δ for the reference voltage VA. In addition, the bit selector 183 selects, as one set, the counted number corresponding to the combination C2=(0, 0, 1) which is substantially equal to the number of fail bits corresponding to the "C→B" erroneous read pattern, and the counted number corresponding to the combination C2=(1, 0, 0) which is substantially equal to the number of fail bits corresponding to the "B→C" erroneous read pattern, in the calculation of the shift amount Δ of the reference voltage VC.

By operating as described above, the bit selector 183 can select the set of the two counted numbers for use in the shift amount calculation for each of the read operations AR and CR.

2.2 Advantageous Effects of the Second Embodiment

In the memory system according to the second embodiment, the bit counter 182 counts the number of bits corresponding to the eight combinations C1 or C2 which are formed by combinations of the pre-error-correction read data SR (SR_U and SR_L), and either one of the post-error-correction lower read data EXP_L and the post-error-correction upper read data EXP_U. When the bit selector 183 uses the post-error-correction lower read data EXP_L, the bit selector 183 uses the set of counted numbers corresponding to C1=(0, 1, 0) and C1=(0, 0, 1) among the eight combinations C1. Thereby, the bit selector 183 can select the counted numbers to be used to calculate the shift amount Δ for the read operation BR without using the post-error-correction upper read data EXP_U. In addition, when the bit selector 183 uses the post-error-correction upper read data EXP_U, the bit selector 183 uses the set of counted numbers corresponding to C2=(1, 1, 0) and C1=(0, 1, 1) and the set of counted numbers corresponding to C2=(0, 0, 1) and C1=(1, 0, 0), among the eight combinations C2. Thereby, the bit selector 183 can select the counted numbers to be used to calculate the shift amounts Δ for the read operations AR and CR without using the post-error-correction lower read data EXP_L. Accordingly, the shift amount calculation can be executed even if the space for simultaneously storing the whole of the post-error-correction upper read data EXP_U and post-error-correction lower read data EXP_L cannot be allocated in the memory controller 100.

It is appreciated that even if the space for simultaneously storing the whole of the post-error-correction upper read data EXP_U and the post-error-correction lower read data EXP_L cannot be used, the shift amounts Δ for all the read operations AR to CR may be calculated by executing the operations illustrated in FIG. 17 and FIG. 18 in turn, like the shift amounts Δ calculated in the first embodiment. The read voltage correction circuit 180 first stores, in the buffer memory 181 for read voltage correction, the pre-error-correction read data SR (SR_U and SR_L) and the post-error-correction lower read data EXP_L, and then calculates the shift amount Δ for the read operation BR on the eight combinations C1. After calculating the shift amount Δ for the read operation BR, the read voltage correction circuit 180 transfers the pre-error-correction upper read data SR_U to the ECC circuit 160 and acquires the post-error-correction upper read data EXP_U to be stored in the buffer memory 181, while deleting the post-error-correction lower read data EXP_L from the buffer memory 181. Thereafter, the read voltage correction circuit 180 calculates the shift amounts Δ for the read operations AR and CR on the eight combinations C2 of the pre-error-correction read data SR (SR_U and SR_L) and the post-error-correction upper read data EXP_U stored in the buffer memory 181. Thereby, in the memory system according to the second embodiment, the read voltage correction circuit 180 can calculate the shift amounts Δ for all the read operations AR to CR.

3. Third Embodiment

Next, a memory system according to a third embodiment will be described.

In the memory systems according to the first embodiment and the second embodiment, the sequential read operation is executed to read data of all pages which the cell unit CU stores. A memory system according to a third embodiment will be described in which the shift amount calculation is executed in execution of a random read operation to read data of each page of the cell unit CU at random. In the description below, a description of the same configurations and operations as in the first embodiment is omitted, and different configurations and operations from the first embodiment will be described.

3.1 Read Operation Including the Shift Amount Calculation

Figure 19:
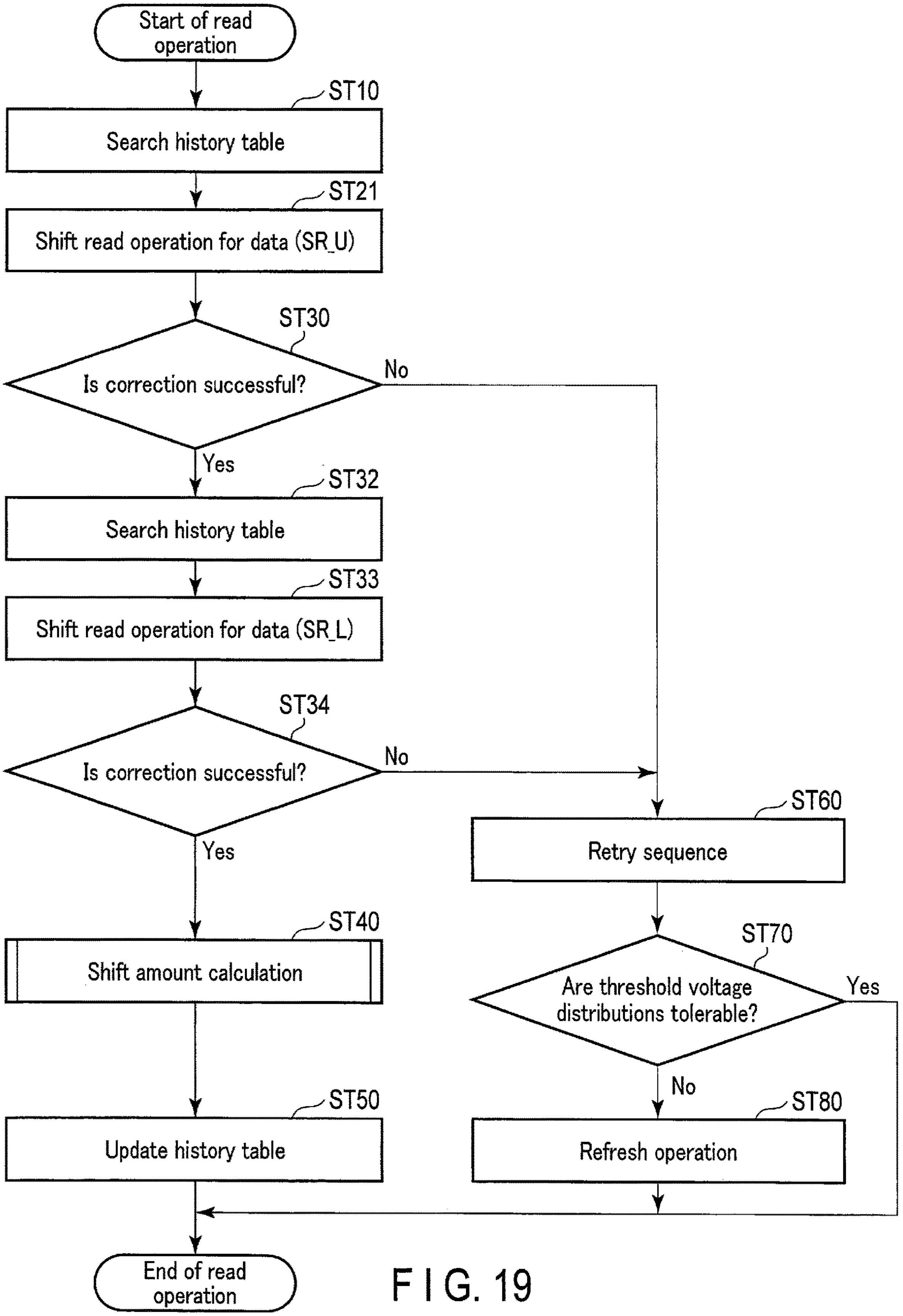
FIG. 19 is a flowchart of a read operation which includes a shift amount calculation in a memory system according to a third embodiment.

A read operation including the shift amount calculation in the memory system according to the third embodiment will now be described with reference to a flowchart of FIG. 19. FIG. 19 corresponds to FIG. 9 in the first embodiment. In FIG. 19, step ST21 is executed in place of step ST20 of FIG. 9, and new steps ST32, ST33 and ST34 are added between steps ST30 and ST40 of FIG. 9. In addition, as described above, FIG. 19 shows that data is read by the random read operation.

As illustrated in FIG. 19, in step ST10, the memory controller 100 searches the history table in the RAM 120, and obtains the shift amounts Δ for the read operations (in FIG. 19, read operations AR and CR) for a read target page.

In step ST21, the memory controller 100 issues a shift read command using the shift amounts Δ obtained in step ST10. Thereby, the chip Chip reads the pre-error-correction upper read data SR_U by read reference voltages to which the shift amounts obtained from the history table are applied, and outputs the pre-error-correction upper read data SR_U to the memory controller 100. In the memory controller 100, the pre-error-correction upper read data SR_U is transferred to the ECC circuit 160, and also stored in the buffer memory 181 for the read voltage correction.

In step ST30, the ECC circuit 160 executes error correction for the pre-error-correction upper read data SR_U. If the error correction is successfully processed by the ECC circuit 160 (step ST30; yes), the ECC circuit 160 stores the post-error-correction upper read data EXP_U in the buffer memory 181 for read voltage correction. Then, the operation proceeds to step ST32. On the other hand, if the error correction process by the ECC circuit 160 fails to correct the pre-error-correction upper read data SR_U (step ST30; no), the operation proceeds to step ST60. Since steps ST60 to ST80 are the same as those of FIG. 9, a description thereof is omitted.

In step ST32, the memory controller 100 again searches the history table in the RAM 120, and obtains the shift amount Δ used in the read operation (in FIG. 19, read operation BR) for the other page, including a read target page, of the cell unit CU.

In step ST33, the memory controller 100 issues a shift read command, using the shift amount Δ obtained in step ST32. Thereby, the chip Chip reads the pre-error-correction lower read data SR_L with the read reference voltage to which the shift amount Δ obtained from the history table is applied, and outputs the pre-error-correction lower read data SR_L to the memory controller 100. In the memory controller 100, the pre-error-correction lower read data SR_L is transferred to the ECC circuit 160, and is also stored in the buffer memory 181.

In step ST34, the ECC circuit 160 executes error correction for the pre-error-correction lower read data SR_L. If the ECC circuit 160 successfully processes the error correction (step ST34; yes), the ECC circuit 160 stores the post-error-correction lower read data EXP_L in the buffer memory 181 for the read voltage correction. Then, the operation proceeds to step ST40. On the other hand, if the ECC circuit 160 fails to correct the pre-error-correction lower read data SR_L (step ST34; no), the operation proceeds to step ST60.

In step ST40, the read voltage correction circuit 180 executes the shift amount calculation in a way similar to that illustrated in FIG. 10 to FIG. 13. Then, in step ST50, the memory controller 100 updates the history table by the calculated shift amounts Δ, and finishes the read operation.

3.2 Advantageous Effects of the Third Embodiment

In the memory system according to the third embodiment in which data for each is read in the random read operation, the memory controller 100 can execute the error correction by executing a further shift read operation. For example, if the shift read operation using two read reference voltages as in the random read operation for the upper page, the shift read operation for the lower page is further executed. Thereby, the same operation as in the first embodiment can be executed, and, the advantageous effects provided by the first embodiment can be obtained in the third embodiment.

4. Fourth Embodiment

In the memory system according to the third embodiment, it is described that the shift amount calculation in the random read operation is performed by executing an additional shift read operation. However, this is not exclusive. For example, a single state read operation may be executed instead of executing the shift read operation in the random read operation.

In the shift read operation, data for a certain page is determined by applying a set of a plurality of different read reference voltages. On the other hand, the single state read operation is executed to determine, by applying a single read voltage, the large/small relationships of threshold voltages with respect to a single read reference voltage by applying the single read voltage. Thus, with the single state read operation, since the number of times of reading data is reduced, the single state read operation can be executed in a shorter time than the shift read operation.

In the description below, a description of the same configurations and operations as those of the third embodiment is omitted, and different configurations and operations from the third embodiment will be described.

4.1 Threshold Voltage Distributions of Memory Cell Transistors

Figure 20:
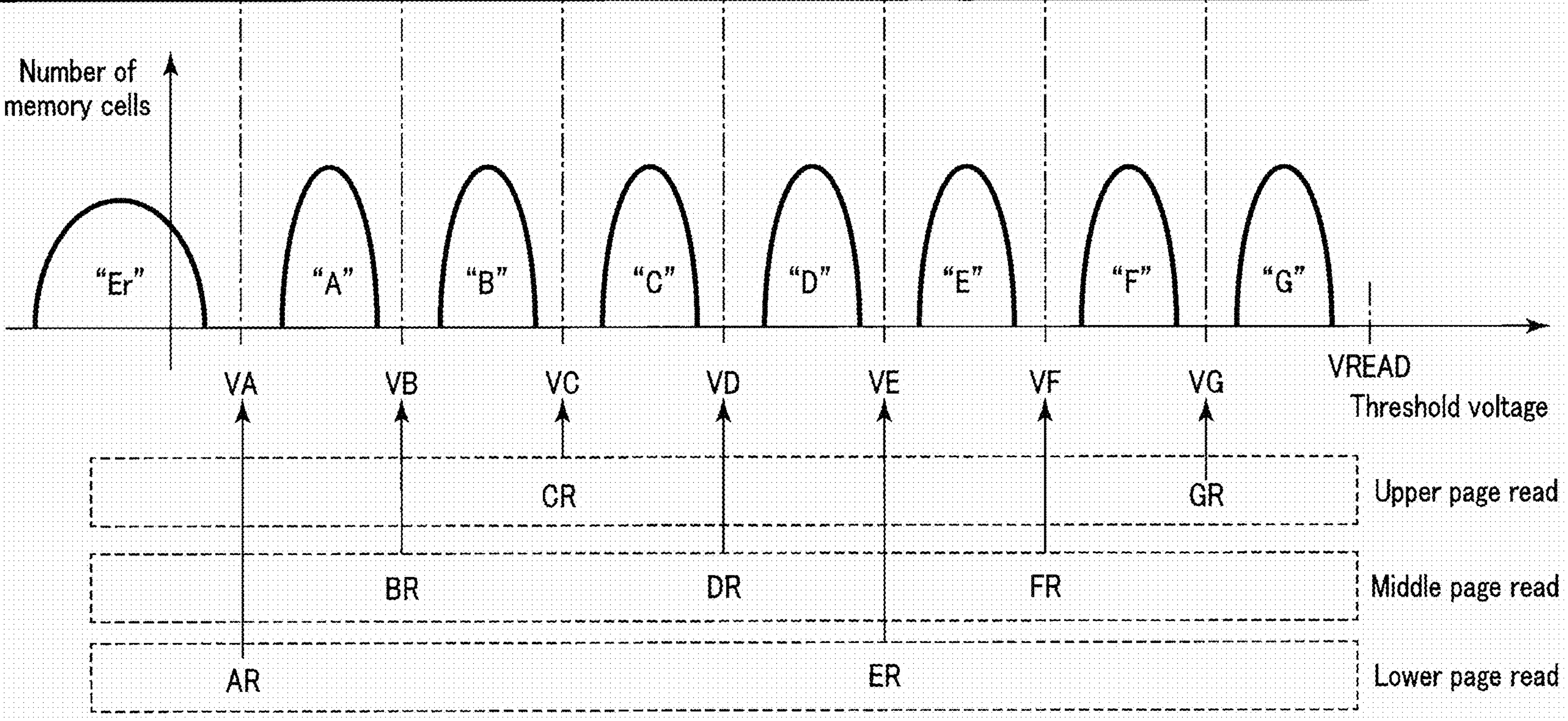
FIG. 20 schematically show threshold voltage distribution of memory cells of a memory cell array for a memory system according to a fourth embodiment.

With respect to a memory system according to a fourth embodiment, FIG. 20 illustrates bit data which each memory cell transistor MT can store, threshold voltage distributions corresponding to the bit data, and read reference voltages used to read the bit data from memory cell transistor MT. In the example of the fourth embodiment, a case is assumed in which one memory cell transistor MT can store 3-bit data. The respective three bits of the 3-bit data are called a lower bit, a middle bit, and an upper bit in the order from the least significant bit. In addition, a set of lower bits which are stored by the memory cell transistors MT of the same cell unit is called a "lower page", a set of middle bits which are stored by the memory cell transistors MT of the same cell unit is called a "middle page", and a set of upper bits which are stored by the memory cell transistors MT of the same cell unit is called an "upper page".

In this example, the memory cell transistor MT can be set in eight states in accordance with threshold voltages of the memory cell transistor MT. The eight states are called an "Er" state, an "A" state, a "B" state, a "C" state, a "D" state, an "E" state, an "F" state, a "G" state in the order from the lowest threshold voltage.

The "Er" state to "B" state are the same as the states shown in FIG. 5 in the first embodiment. Note that the values of the reference voltages VA to VC may be different from those shown in FIG. 5. A threshold voltage of the memory cell transistor MT in the "C" state is equal to or greater than the reference voltage VC and is less than a reference voltage VD (>VC). A threshold voltage of the memory cell transistor MT in the "D" state is equal to or greater than the reference voltage VD and is less than a voltage VE (>VD). A threshold voltage of the memory cell transistor MT in the "E" state is equal to or greater than the reference voltage VE and is less than a reference voltage VF (>VE). A threshold voltage of the memory cell transistor MT in the "F" state is equal to or greater than the reference voltage VF and is less than a reference voltage VG (>VF). A threshold voltage of the memory cell transistor MT in the "G" state is equal to or greater than the reference voltage VG and is less than a voltage VREAD. Among the memory cell transistors MT having threshold voltages in the eight states which are distributed in this manner, the "G" state is a state with the highest threshold voltage distribution.

The above-described threshold voltage distributions are realized by writing 3-bit (3-page) data which includes the above-described lower bit, middle bit and upper bit. In this example, the correspondence of the "Er" state to "G" state to the lower bit, middle bit and upper bit is as follows:

"Er" state: "111" (expressed in the order of "upper/middle/lower"),
"A" state: "110",
"B" state: "100",
"C" state: "000",
"D" state: "010",
"E" state: "011",
"F" state: "001", and
"G" state: "101".

In this example, only one bit of the three bits varies between data corresponding to two neighboring states in the threshold voltage distributions.

Accordingly, to determine the value of the lower bit, reference voltages corresponding to boundaries at which the value ("1" or "0") of the lower bit changes to the value ("0" or "1") may be used. This scheme also applies to determine the values of the middle bit and upper bit.

As illustrated in FIG. 20, the lower page read operation uses, as read reference voltages, the voltage VA which distinguishes the threshold voltage distribution of the "Er" state and the threshold voltage distribution of the "A" state, and the voltage VE which distinguishes the threshold voltage distribution of the "D" state and the threshold voltage distribution of the "E" state. The read operations using the read reference voltages VA and VE are referred to as a "read operation AR" and a "read operation ER", respectively.

The middle page read operation uses, as read reference voltages, the voltage VB which distinguishes the threshold voltage distribution of the "A" state and the threshold voltage distribution of the "B" state, the voltage VD which distinguishes the threshold voltage distribution of the "C" state and the threshold voltage distribution of the "D" state, and the voltage VF which distinguishes the threshold voltage distribution of the "E" state and the threshold voltage distribution of the "F" state. The read operations using the read reference voltages VD and VF are referred to as a "read operation DR" and a "read operation FR", respectively.

In addition, the upper page read operation uses, as read voltages, the voltage VC which distinguishes the threshold voltage distribution of the "B" state and the threshold voltage distribution of the "C" state, and the voltage VG which distinguishes the threshold voltage distribution of the "F" state and the threshold voltage distribution of the "G" state. The read operations using the read reference voltages VC and VG are referred to as a "read operation CR" and a "read operation GR", respectively.

4.2 Configuration of the Read Voltage Correction Circuit

Figure 21:
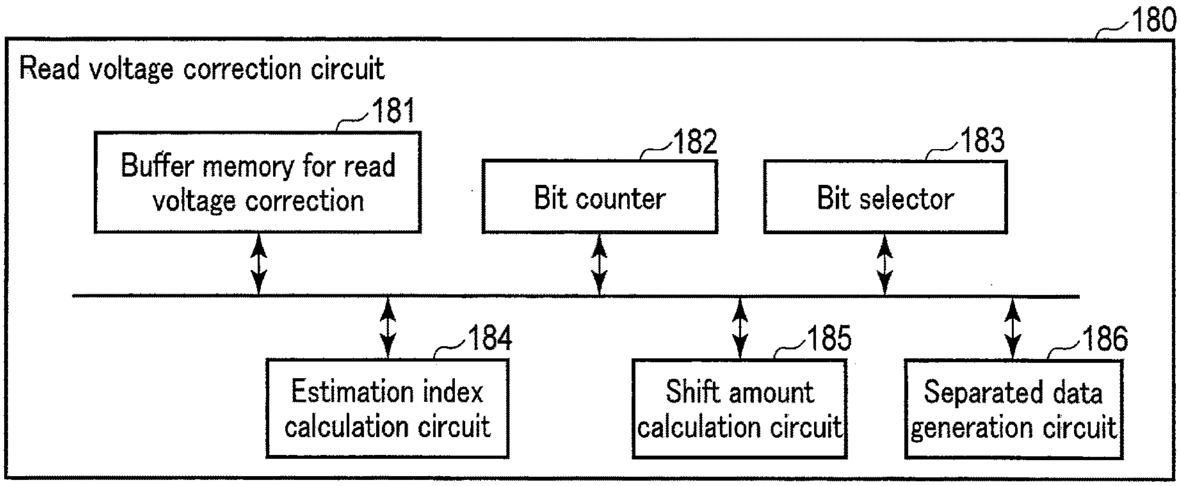
FIG. 21 illustrates a block diagram of a read voltage correction circuit of the memory cell array for the memory system according to the fourth embodiment.

Next, a configuration of the read voltage correction circuit of the memory system according to the fourth embodiment will be described with reference to a block diagram of FIG. 21. As illustrated in FIG. 21, the read voltage correction circuit 180 further includes a separated data generation circuit 186.

The separated data generation circuit 186 includes operation functions which can execute, for example, at least a NOT operation and an OR operation. In addition, the separated data generation circuit 186 has a function which reads a part of data, which meets a predetermined condition, as separated data, while executing predetermined logical operations for the data stored in the buffer memory 181 for read voltage correction. The separated data generation circuit 186 sends the separated data to the bit counter 182. The details of the separated data will be described later.

4.3 Lower Page Read Process Including the Shift Amount Calculation

Figure 22:
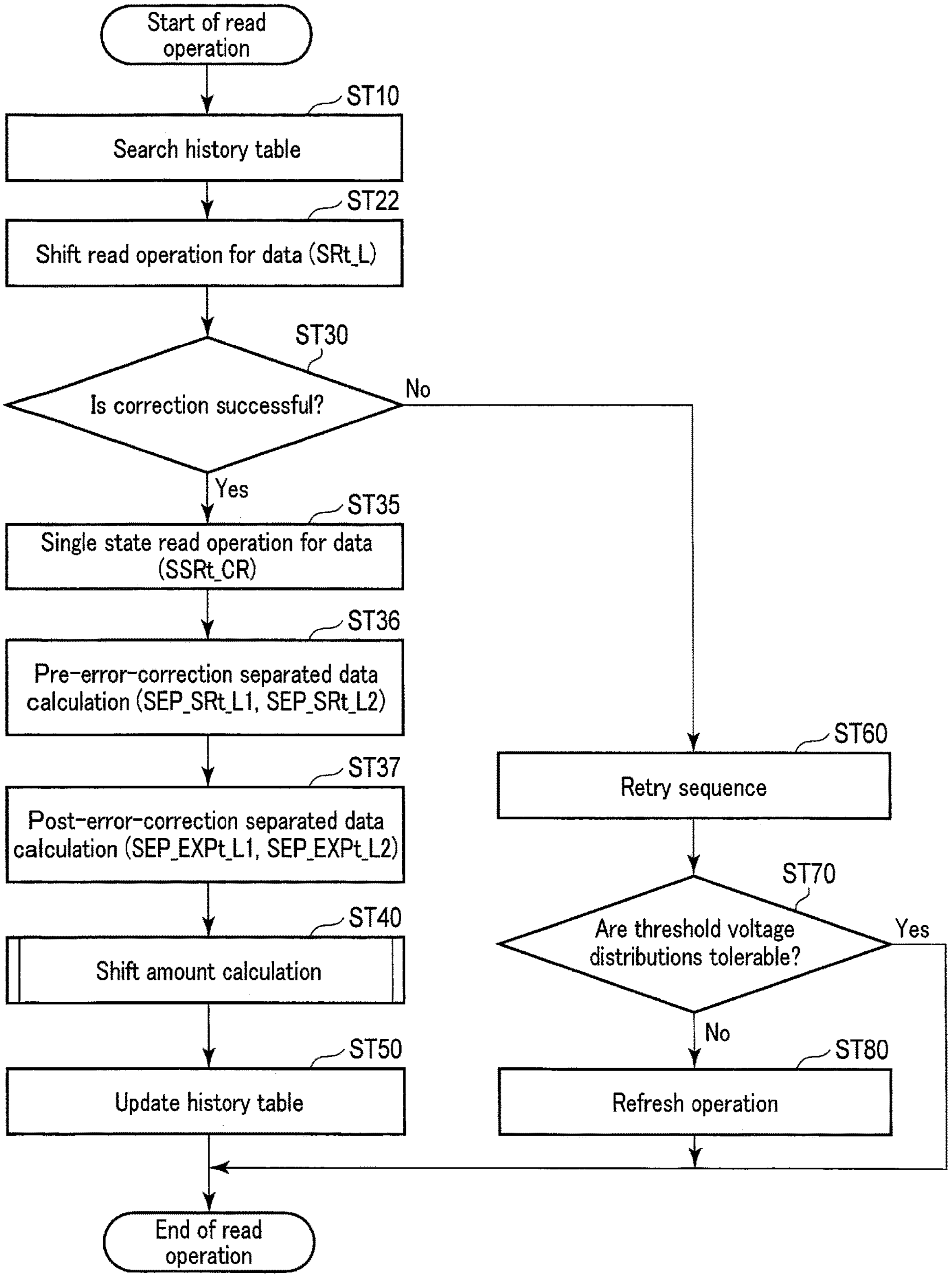
FIG. 22 is a flowchart of a lower page read operation which includes a shift amount calculation in the memory system according to the fourth embodiment.

To begin with, referring to a flowchart of FIG. 22, a description is given of an operation at a time of executing the shift amount calculation in the case of reading the lower page of the three pages by the random read operation. FIG. 22 corresponds to FIG. 19 in the third embodiment. In FIG. 22, step ST22 is executed in place of step ST21, and steps ST35 to ST37 are executed in place of steps ST32 to ST34.

As illustrated in FIG. 22, in step ST10, the memory controller 100 searches the history table in the RAM 120, and obtains the shift amounts Δ for the read operations (in the example of FIG. 22, for the read operations AR and ER) in the read target page.

In step ST22, the memory controller 100 issues a shift read command based on the shift amounts Δ obtained in step ST10. Thereby, the chip Chip reads pre-error-correction lower read data SRt_L with read reference voltages to which the shift amounts held in the history table are applied, and outputs the pre-error-correction lower read data SRt_L to the memory controller 100. In the memory controller 100, the pre-error-correction lower read data SRt_L is transferred to the ECC circuit 160, and is stored in the buffer memory 181 for read voltage correction.

In step ST30, the ECC circuit 160 executes an error correction for the pre-error-correction lower read data SRt_L. If the ECC circuit 160 successfully corrects errors (step ST30; yes), the ECC circuit 160 stores post-error-correction lower read data EXPt_L in the buffer memory 181. Then, the process proceeds to step ST35. On the other hand, if the error correction by the ECC circuit 160 fails (step ST30; no), the process proceeds to step ST60. Since the process of steps ST60 to ST80 is the same as those of FIG. 19, a description thereof is omitted.

In step ST35, the memory controller 100 issues a single state read command using the voltage VC as a read reference voltage. Thereby, the chip Chip reads single state read data SSRt_CR and outputs the single state read data SSRt_CR to the memory controller 100. The single state read data SSRt_CR is stored in the buffer memory 181 in the memory controller 100.

In step ST36, the separated data generation circuit 186 generates pre-error-correction separated data SEP_SRt_L1 and SEP_SRt_L2, based on the pre-error-correction lower read data SRt_L and single state read data SSRt_CR, which are read from the buffer memory 181. Specifically, the separated data generation circuit 186 extracts, from the pre-error-correction lower read data SRt_L, bits corresponding to data "1" of the single state read data SSRt_CR as the pre-error-correction separated data SEP_SRt_L1, and also extracts bits corresponding to data "0" as the pre-error-correction separated data SEP_SRt_L2. The extracted pre-error-correction separated data SEP_SRt_L1 and SEP_SRt_L2 are sent to the bit counter 182.

In step ST37, the separated data generation circuit 186 generates post-error-correction separated data SEP_EXPt_L1 and SEP_EXPt_L2, based on the post-error-correction lower read data EXPt_L and single state read data SSRt_CR, which are read from the buffer memory 181 for read voltage correction. Specifically, the separated data generation circuit 186 extracts, from the post-error-correction lower read data EXPt_L, bits corresponding to data "1" of the single state read data SSRt_CR as the post-error-correction separated data SEP_EXPt_L1, and also extracts bits corresponding to data "0" as the post-error-correction separated data SEP_EXPt_L2. The extracted post-error-correction separated data SEP_EXPt_L1 and SEP_EXPt_L2 are sent to the bit counter 182.

In step ST40, the read voltage correction circuit 180 executes a shift amount calculation, based on the pre-error-correction separated data SEP_SRt_L1 and SEP_SRt_L2, and the post-error-correction separated data SEP_EXPt_L1 and SEP_EXPt_L2. The details of the shift amount calculation will be described later.

In step ST50, the memory controller 100 updates the history table by storing the shift amounts Δ calculated in step ST40 in a corresponding area in the history table of the RAM 120.

Then, the serial operation ends.

4.4 Shift Amount Calculation Based on the Lower Page Read Operation

Figure 23:
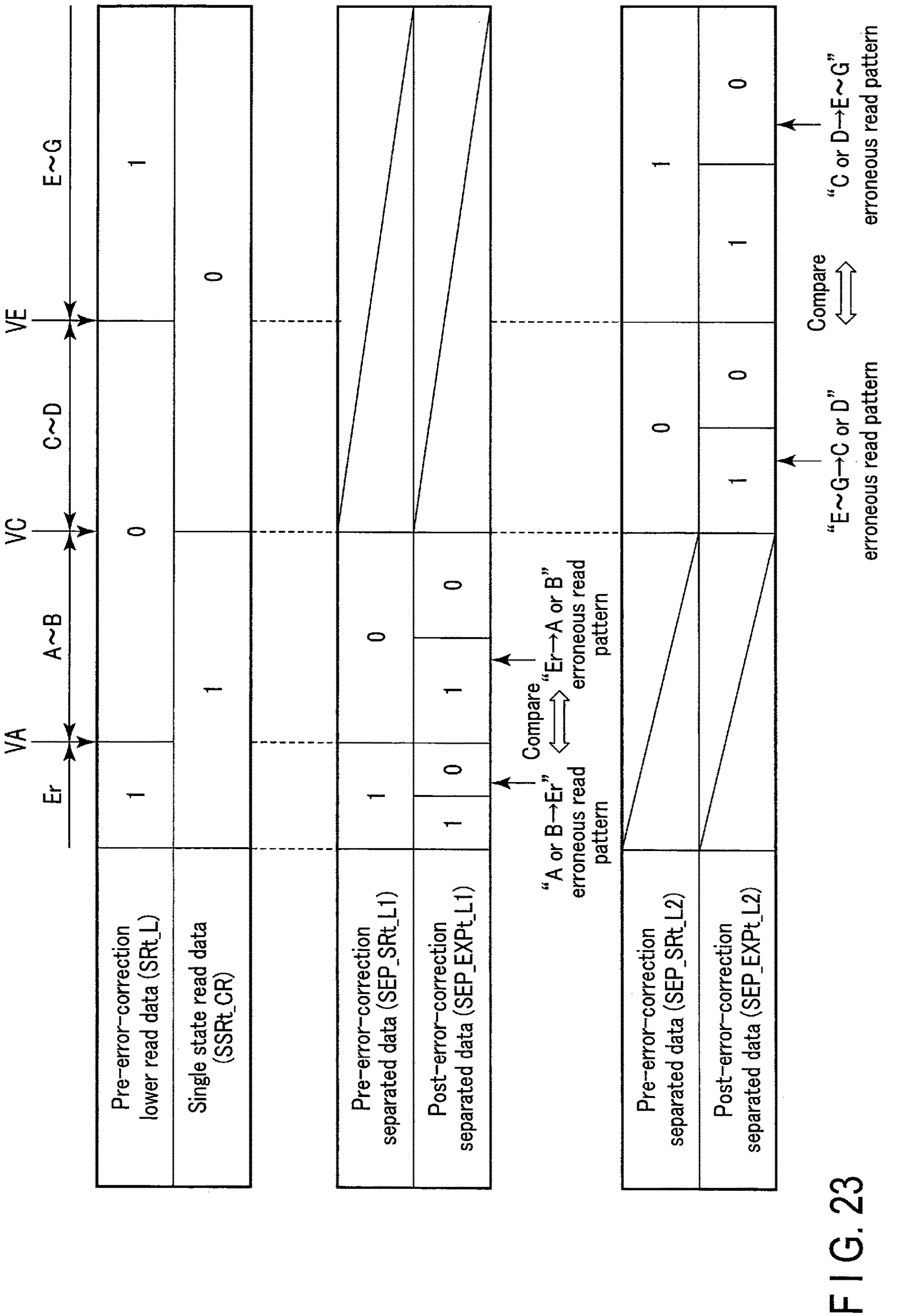
FIG. 23 schematically illustrates a process of the shift amount calculation in the lower page read operation in the memory system according to the fourth embodiment.

FIG. 23 schematically illustrates the shift amount calculation using the lower page read operation in the memory system according to the fourth embodiment. FIG. 23 illustrates a process until the counted numbers for the estimation index calculation are selected for the shift amount calculation.

As illustrated in FIG. 23, the pre-error-correction lower read data SRt_L classifies the memory cell transistors MT in the cell unit CU into two groups.

Specifically, with respect to a certain memory cell transistor MT, the pre-error-correction lower read data SRt_L is determined to be data "1" when the threshold voltage of the transistor MT is less than the voltage VA or is equal to or greater than the voltage VE, and it is determined that the memory cell transistor MT belongs to any of the threshold voltage distribution of the "Er" state and the threshold voltage distributions of the "E" state to "G" state. In addition, the pre-error-correction lower read data SRt_L is determined to be data "0" when the threshold voltage is equal to or greater than the voltage VA or is less than the voltage VE, and it is determined that the memory cell transistor MT belongs to any of the threshold voltage distributions of the "A" state to "D" state.

With respect to the same memory cell transistor MT, the single state read data SSRt_CR is determined to be data "1" when the threshold voltage is less than the voltage VC, and it is determined that the memory cell transistor MT belongs to any of the threshold voltage distributions of the "Er" state to "B" state. In addition, the single state read data SSRt_CR is determined to be data "0" when the threshold voltage is equal to or greater than the voltage VC, and it is determined that the memory cell transistor MT belongs to any of the threshold voltage distributions of the "C" state to "G" state.

Thus, the pre-error-correction separated data SEP_SRt_L1 classifies the memory cell transistors MT which are determined to be in any of the threshold voltage distributions of the "Er" state to "B" state, into two groups (data "1" of data (SEP_SRt_L1) when the threshold voltage is less than the voltage VA, and data "0" of data (SEP_SRt_L1) when the threshold voltage is equal to or greater than the voltage VA). Specifically, the memory cell transistors MT which store the pre-error-correction separated data SEP_SRt_L1 of data "1" are regarded as belonging to the threshold voltage distribution of the "Er" state, and the memory cell transistors MT which store the pre-error-correction separated data SEP_SRt_L1 of data "0" are regarded as belonging to the threshold voltage distribution of the "A" state or "B" state. In addition, the pre-error-correction separated data SEP_SRt_L2 classifies the memory cell transistors MT which are determined to be in any of the threshold voltage distributions of the "C" state to "G" state, into two groups (data "0" of data (SEP_SRt_L1) when the threshold voltage is less than the voltage VE, and data "1" of data (SEP_SRt_L1) when the threshold voltage is equal to or greater than the voltage VE). Specifically, the memory cell transistors MT which store the pre-error-correction separated data SEP_SRt_L2 of data "0" are regarded as belonging to any of the threshold voltage distribution of the "C" state or "D" state, and the memory cell transistors MT which store the pre-error-correction separated data SEP_SRt_L2 of data "1" are regarded as belonging to any of the threshold voltage distributions of the "E" state to "G" state.

On the other hand, the post-error-correction separated data SEP_EXPt_L1 and SEP_EXPt_L2 classify the memory cell transistors MT into two groups, without depending on the classification by the pre-error-correction separated data SEP_SRt_L1 and SEP_SRt_L2. The memory cell transistors MT, in which the post-error-correction separated data SEP_EXPt_L1 and SEP_EXPt_L2 become data "1", are expected to belong to the threshold voltage distribution of the "Er" state or the threshold voltage distributions of the "E" state to "G" state. The memory cell transistors MT, in which the post-error-correction separated data SEP_EXPt_L1 and SEP_EXPt_L2 become data "0", are expected to belong to the threshold voltage distributions of the "A" state to "D" state.

As described above, the post-error-correction separated data SEP_EXPt_L1 is a set of memory cell transistors MT which are regarded as belonging to the threshold voltage distributions of the "Er" state to "B" state, and the post-error-correction separated data SEP_EXPt_L2 is a set of memory cell transistors MT which are regarded as belonging to the threshold voltage distributions of the "C" state to "G" state. Thus, the memory cell transistors MT, in which the post-error-correction separated data SEP_EXPt_L1 is data "1", can be regarded as being expected to belong to the threshold voltage distribution of the "Er" state, and the memory cell transistors MT, in which the post-error-correction separated data SEP_EXPt_L1 is data "0", can be regarded as being expected to belong to the threshold voltage distributions of the "A" state to "B" state. In addition, the memory cell transistors MT, in which the post-error-correction separated data SEP_EXPt_L2 is data "1", can be regarded as being expected to belong to the threshold voltage distributions of the "E" state to "G" state, and the memory cell transistors MT, in which the post-error-correction separated data SEP_EXPt_L2 is data "0", can be regarded as being expected to belong to the threshold voltage distributions of the "C" state to "D" state.

Thus, the number of combinations of values, C3_L1=(SEP_SRt_L1, SEP_EXPt_L1), which the pre-error-correction separated data SEP_SRt_L1 and post-error-correction separated data SEP_EXPt_L1 can take, is 2×2=4. Similarly, the number of combinations of values, C3_L2=(SEP_SRt_L2, SEP_EXPt_L2), which the pre-error-correction separated data SEP_SRt_L2 and post-error-correction separated data SEP_EXPt_L2 can take, is 2×2=4. The bit counter 182 counts the number of bits with respect to each of the four combinations C3_L1 and four combinations C3_L2 (i.e. each of the eight combinations).

In the example of FIG. 23, the bit selector 183 selects one set of two combinations, i.e. combinations C3_L1=(1, 0) and (0, 1), from the four combinations C3_L1. The combination C3_L1=(1, 0) indicates that data of the "Er" state was erroneously read from the memory cell transistor MT in which data of the "A" state or "B" state was written. The combination C3_L1=(0, 1) indicates that data of the "A" state or "B" state is erroneously read from the memory cell transistor MT which stores data of the "Er" state. The combination C3_L1=(1, 0) corresponds to the "A or B→Er" erroneous read pattern, and the combination C3_L1=(0, 1) corresponds to the "Er→A or B" erroneous read pattern.

Among the number of fail bits corresponding to "A or B→Er" erroneous read pattern, the number of fail bits corresponding to "A→Er" erroneous read pattern" can be regarded as being significantly greater than the number of fail bits corresponding to "B→Er" erroneous read pattern. Thus, the counted number of fail bits corresponding to the combination C3_L1=(1, 0) can be regarded as being substantially equal to the number of fail bits corresponding to "A→Er" erroneous read pattern. Similarly, among the number of fail bits corresponding to "Er→A or B" erroneous read pattern, the number of fail bits corresponding to "Er→A" erroneous read pattern can be regarded as being significantly greater than the number of fail bits corresponding to "Er→B" erroneous read pattern. Specifically, the counted number of fail bits corresponding to the combination C3_L1=(0, 1) can be regarded as being substantially equal to the number of fail bits corresponding to "Er→A" erroneous read pattern.

Similarly, the bit selector 183 selects one set of two combinations, i.e. combinations C3_L2=(0, 1) and (1, 0), from the four combinations C3_L2. The combination C3_L2=(0, 1) indicates that data of the "C" state or "D" state is erroneously read from the memory cell transistor MT which stores data of the "E" state to "G" state. The combination C3_L2=(1, 0) indicates that data of the "E" state to "G" state is erroneously read from the memory cell transistor MT which stores data of the "C" state or "D" state. The combination C3_L2=(0, 1) corresponds to the "E~G→C or D" erroneous read pattern, and the combination C3_L2=(1, 0) corresponds to the "C or D→E~G" erroneous read pattern.

Among the number of fail bits corresponding to "E~G→C or D" erroneous read pattern, the number of fail bits corresponding to "E→D" erroneous read pattern can be regarded as being significantly greater than the number of fail bits corresponding to "F or G→C or D" erroneous read pattern and "E→C" erroneous read pattern. Thus, the counted number of fail bits corresponding to the combination C3_L2=(0, 1) can be regarded as being substantially equal to the number of fail bits corresponding to "E→D" erroneous read pattern. Similarly, among the number of fail bits corresponding to "C or D→E~G" erroneous read pattern, the number of fail bits corresponding to "D→E" erroneous read pattern can be regarded as being significantly greater than the number of fail bits corresponding to "C→E~G" erroneous read pattern and "D→F or G" erroneous read pattern. Thus, the counted number of fail bits corresponding to the combination C3_L2=(1, 0) can be regarded as being substantially equal to the number of fail bits corresponding to "D→E" erroneous read pattern.

In consideration of the above-described approximation, the bit selector 183 selects, as one set, the counted number corresponding to the combination C3_L1=(1, 0), which substantially corresponds to number of fail bits corresponding to the "A→Er" erroneous read pattern, and the counted number corresponding to the combination C3_L1=(0, 1), which substantially corresponds to the number of fail bits corresponding to the "Er→A" erroneous read pattern, in the case of calculating the shift amount Δ for the reference voltage VA. In addition, the bit selector 183 selects, as one set, the counted number corresponding to the combination C3_L2=(0, 1), which substantially corresponds to the number of fail bits corresponding to the "E→D" erroneous read pattern, and the counted number corresponding to the combination C3_L2=(1, 0), which substantially corresponds to the number of fail bits corresponding to the "D→E" erroneous read pattern, in the case of calculating the shift amount Δ for the reference voltage VE.

For the read operation AR and ER, according to the above-described operations, the bit selector 183 can select set of the two counted numbers for the "Er→A" and "A→Er" erroneous read patterns, and two counted numbers for the "D→E" and "E→D" erroneous read patterns to be used in the shift amount calculation.

4.5 Upper Page Read Operation Including the Shift Amount Calculation

Figure 24:
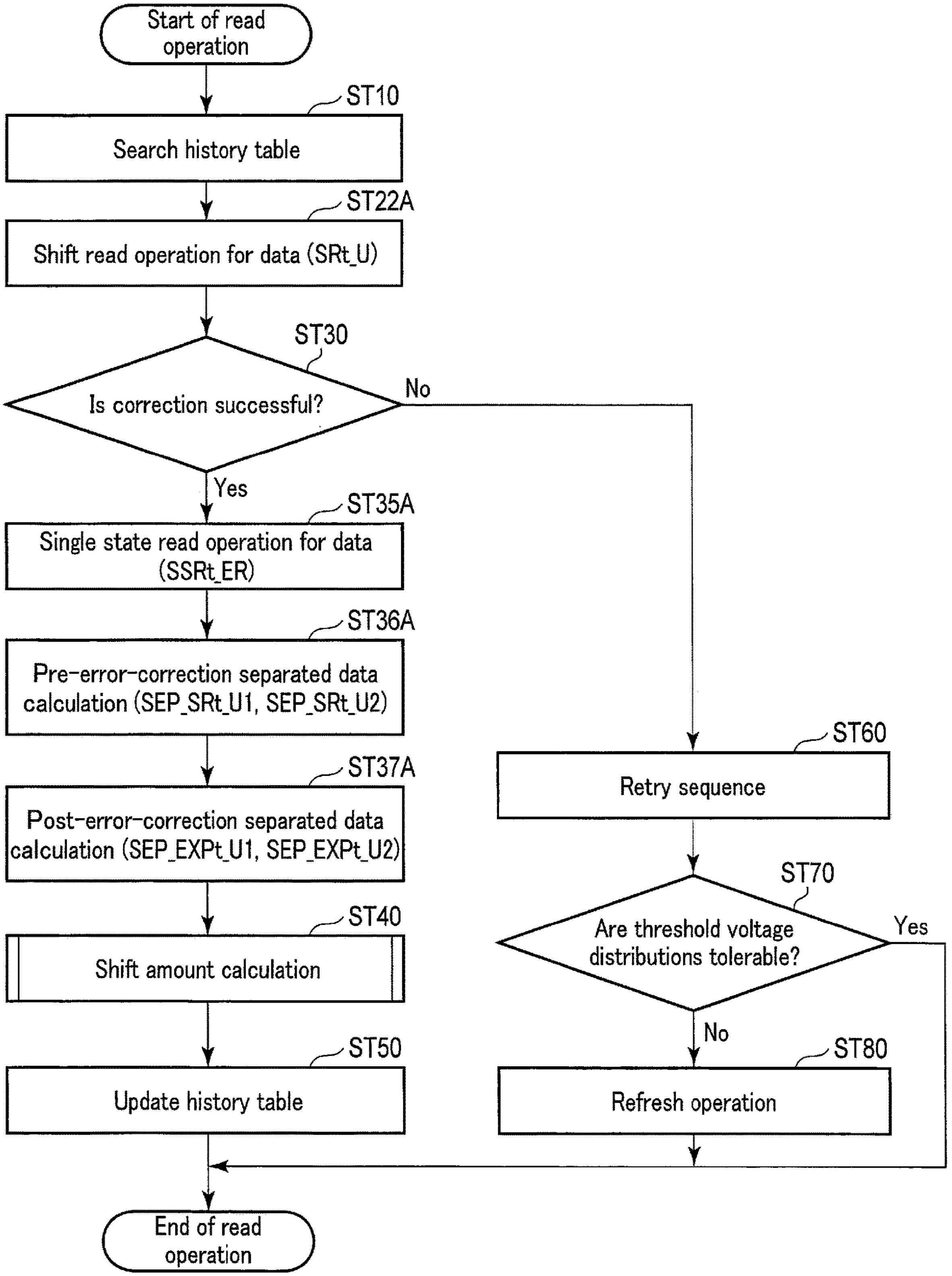
FIG. 24 is a flowchart of an upper page read operation which includes a shift amount calculation in the memory system according to the fourth embodiment.

Next, referring to a flowchart of FIG. 24, a description is given of an operation at a time of executing the shift amount calculation in the case of reading the upper page of the three pages by the random read operation. FIG. 24 corresponds to FIG. 22. In FIG. 24, step ST22A is executed in place of step ST22, and steps ST35A to ST37A are executed in place of steps ST35 to ST37.

As illustrated in FIG. 24, in step ST10, the memory controller 100 searches the history table in the RAM 120, and grasps the shift amounts Δ of the read operations (in the case of FIG. 24, read operations CR and GR) corresponding to the page of the read target.

In step ST22A, the memory controller 100 issues a shift read command, based on the shift amounts Δ which were grasped in step ST10. Thereby, the chip Chip reads pre-error-correction upper read data SRt_U, and outputs the pre-error-correction upper read data SRt_U to the memory controller 100. In the memory controller 100, the pre-error-correction upper read data SRt_U is transferred to the ECC circuit 160, and is stored in the buffer memory 181 for read voltage correction.

In step ST30, the ECC circuit 160 executes an error correction process on the pre-error-correction upper read data SRt_U. When the error correction process by the ECC circuit 160 was successful (step ST30; yes), the ECC circuit 160 stores post-error-correction upper read data EXPt_U in the buffer memory 181 for read voltage correction. Then, the process advances to step ST35A. On the other hand, when the error correction process by the ECC circuit 160 failed (step ST30; no), the process advances to step ST60. Since the process of steps ST60 to ST80 is the same as in the case of FIG. 22, a description thereof is omitted.

In step ST35A, the memory controller 100 issues a single state read command using the voltage VE as a read voltage. Thereby, the chip Chip reads single state read data SSRt_ER and outputs the single state read data SSRt_ER to the memory controller 100. The single state read data SSRt_ER is stored in the buffer memory 181 for read voltage correction in the memory controller 100.

In step ST36A, the separated data generation circuit 186 generates pre-error-correction separated data SEP_SRt_U1 and SEP_SRt_U2, based on the pre-error-correction upper read data SRt_U and single state read data SSRt_ER, which are read from the buffer memory 181 for read voltage correction. Specifically, the separated data generation circuit 186 extracts, from the pre-error-correction upper read data SRt_U, bits corresponding to data "1" of the single state read data SSRt_ER as the pre-error-correction separated data SEP_SRt_U1, and also extracts bits corresponding to data "0" as the pre-error-correction separated data SEP_SRt_U2. The extracted pre-error-correction separated data SEP_SRt_U1 and SEP_SRt_U2 are sent to the bit counter 182.

In step ST37A, the separated data generation circuit 186 generates post-error-correction separated data SEP_EXPt_U1 and SEP_EXPt_U2, based on the post-error-correction upper read data EXPt_U and single state read data SSRt_ER, which are read from the buffer memory 181 for read voltage correction. Specifically, the separated data generation circuit 186 extracts, from the post-error-correction upper read data EXPt_U, bits corresponding to data "1" of the single state read data SSRt_ER as the post-error-correction separated data SEP_EXPt_U1, and also extracts bits corresponding to data "0" as the post-error-correction separated data SEP_EXPt_U2. The extracted post-error-correction separated data SEP_EXPt_U1 and SEP_EXPt_U2 are sent to the bit counter 182.

In step ST40, the read voltage correction circuit 180 executes a shift amount calculation, based on the pre-error-correction separated data SEP_SRt_U1 and SEP_SRt_U2, and the post-error-correction separated data SEP_EXPt_U1 and SEP_EXPt_U2. The details of the shift amount calculation will be described later.

In step ST50, the memory controller 100 updates the history table by storing the shift amounts Δ calculated in step ST40 in a corresponding area in the history table of the RAM 120.

Then, the serial operation ends.

4.6 Shift Amount Calculation Based on the Upper Page Read operation

Figure 25:
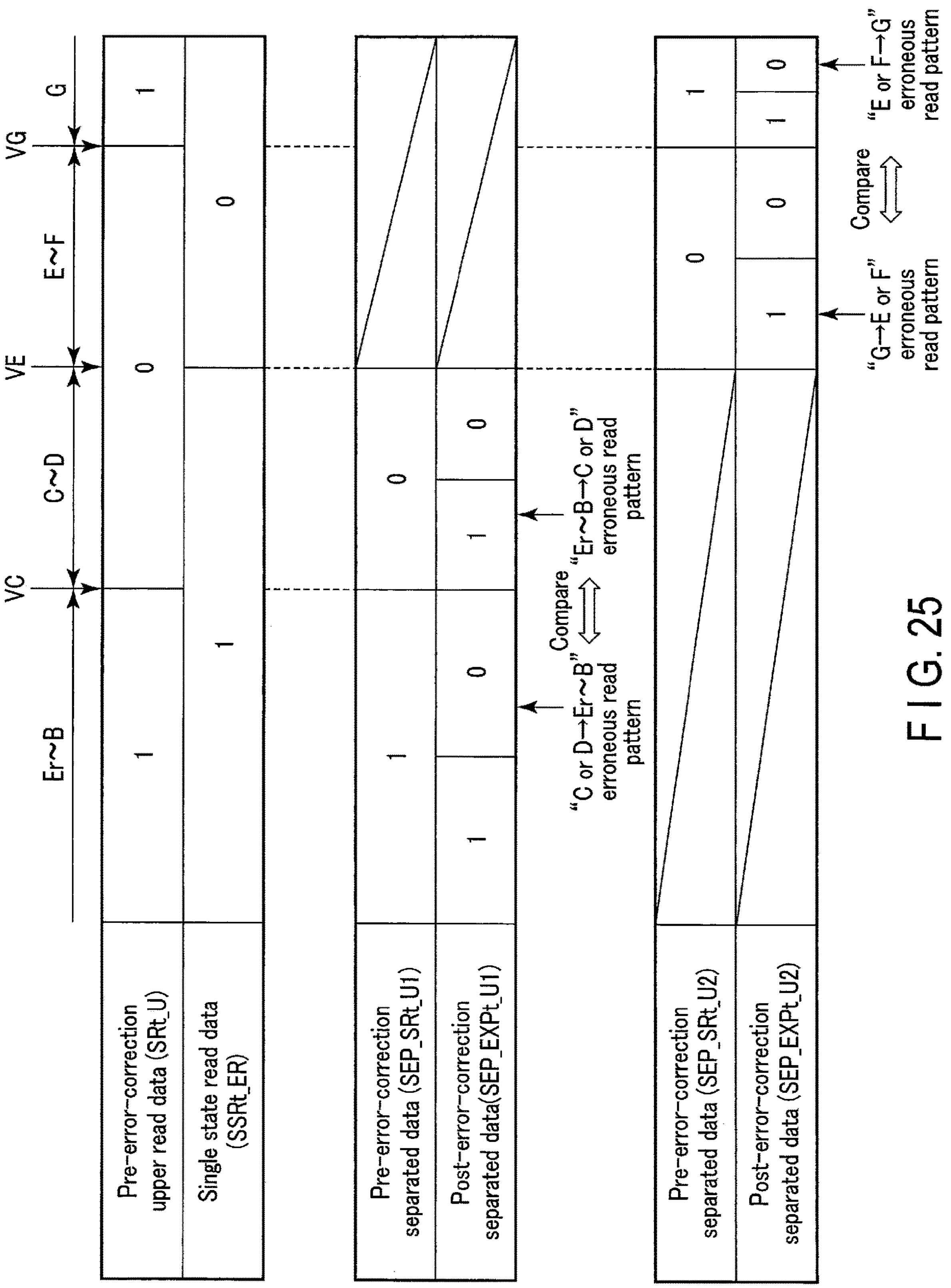
FIG. 25 schematically illustrates a process of the shift amount calculation in the upper page read operation in the memory system according to the fourth embodiment.

FIG. 25 is a schematic diagram for describing the shift amount calculation based on the upper page read operation in the memory system according to the fourth embodiment. FIG. 25 illustrates a process up to the selection of count values of the estimation index calculation target in the shift amount calculation.

As illustrated in FIG. 25, the pre-error-correction upper read data SRt_U classifies the memory cell transistors MT in the cell unit CU into two groups. Specifically, the pre-error-correction upper read data SRt_U becomes data "1" when the threshold voltage is less than the voltage VC or is not less than the voltage VG, and the corresponding memory cell transistors MT are regarded as belonging to the threshold voltage distributions of the "Er" state to "B" state or the threshold voltage distribution of the "G" state. In addition, the pre-error-correction upper read data SRt_U becomes data "0" when the threshold voltage is not less than the voltage VC or is less than the voltage VG, and the corresponding memory cell transistors MT are regarded as belonging to the threshold voltage distributions of the "C" state to "F" state.

The single state read data SSRt_ER becomes data "1" when the threshold voltage is less than the voltage VE, and the corresponding memory cell transistors MT are regarded as belonging to the threshold voltage distributions of the "Er" state to "D" state. In addition, the single state read data SSRt_ER becomes data "0" when the threshold voltage is not less than the voltage VE, and the corresponding memory cell transistors MT are regarded as belonging to the threshold voltage distributions of the "E" state to "G" state.

Thus, the pre-error-correction separated data SEP_SRt_U1 classifies the memory cell transistors MT, which were regarded as belonging to the threshold voltage distributions of the "Er" state to "D" state, into two groups (data "1" when the threshold voltage is less than the voltage VC, and data "0" when the threshold voltage is not less than the voltage VC). Specifically, the memory cell transistors MT, in which the pre-error-correction separated data SEP_SRt_U1 is data "1", are regarded as belonging to the threshold voltage distribution of the "Er" state to "B" state, and the memory cell transistors MT, in which the pre-error-correction separated data SEP_SRt_U1 is data "0", are regarded as belonging to the threshold voltage distribution of the "C" state or "D" state. In addition, the pre-error-correction separated data SEP_SRt_U2 classifies the memory cell transistors MT, which were regarded as belonging to the threshold voltage distributions of the "E" state to "G" state, into two groups (data "0" when the threshold voltage is less than the voltage VG, and data "1" when the threshold voltage is not less than the voltage VG). Specifically, the memory cell transistors MT, in which the pre-error-correction separated data SEP_SRt_U2 is data "0", are regarded as belonging to the threshold voltage distribution of the "E" state or "F" state, and the memory cell transistors MT, in which the pre-error-correction separated data SEP_SRt_U2 is data "1", are regarded as belonging to the threshold voltage distribution of the "G" state.

On the other hand, the post-error-correction separated data SEP_EXPt_U1 and SEP_EXPt_U2 classify the memory cell transistors MT into two groups, without depending on the classification by the pre-error-correction separated data SEP_SRt_U1 and SEP_SRt_U2. Specifically, the memory cell transistors MT, in which the post-error-correction separated data SEP_EXPt_U1 and SEP_EXPt_U2 become data "1", are expected to belong to the threshold voltage distributions of the "Er" state to "B" state or the threshold voltage distribution of the "G" state. The memory cell transistors MT, in which the post-error-correction separated data SEP_EXPt_U1 and SEP_EXPt_U2 become data "0", are expected to belong to the threshold voltage distributions of the "C" state to "F" state.

As described above, the post-error-correction separated data SEP_EXPt_U1 is a set of memory cell transistors MT which are regarded as belonging to the threshold voltage distributions of the "Er" state to "D" state, and the post-error-correction separated data SEP_EXPt_U2 is a set of memory cell transistors MT which are regarded as belonging to the threshold voltage distributions of the "E" state to "G" state. Thus, the memory cell transistors MT, in which the post-error-correction separated data SEP_EXPt_U1 is data "1", can be regarded as being expected to belong to the threshold voltage distributions of the "Er" state to "B" state, and the memory cell transistors MT, in which the post-error-correction separated data SEP_EXPt_U1 is data "0", can be regarded as being expected to belong to the threshold voltage distributions of the "C" state and "D" state. In addition, the memory cell transistors MT, in which the post-error-correction separated data SEP_EXPt_U2 is data "1", can be regarded as being expected to belong to the threshold voltage distribution of the "G" state, and the memory cell transistors MT, in which the post-error-correction separated data SEP_EXPt_U2 is data "0", can be regarded as being expected to belong to the threshold voltage distribution of the "E" state or "F" state.

Thus, the number of combinations of values, C3_U1=(SEP_SRt_U1, SEP_EXPt_U1), which the pre-error-correction separated data SEP_SRt_U1 and post-error-correction separated data SEP_EXPt_U1 can take, is 2×2=4. Similarly, the number of combinations of values, C3 U2=(SEP_SRt_U2, SEP_EXPt_U2), which the pre-error-correction separated data SEP_SRt_U2 and post-error-correction separated data SEP_EXPt_U2 can take, is 2×2=4. The bit counter 182 counts the number of bits with respect to each of the four combinations C3_U1 and four combinations C3 U2 (i.e. each of the eight combinations).

In the example of FIG. 25, the bit selector 183 selects one set of two combinations, i.e. combinations C3_U1=(1, 0) and (0, 1), from the four combinations C3_U1. The combination C3_U1=(1, 0) indicates that data of the "Er" state to "B" state is erroneously read from the memory cell transistor MT which stores data of the "C" state or "D" state. The combination C3_U1=(0, 1) indicates that data of the "C" state or "D" state is erroneously read from the memory cell transistor MT which stores data of the "Er" state to "B" state. The combination C3_U1=(1, 0) corresponds to the "C or D→Er~B" erroneous read pattern, and the combination C3_U1=(0, 1) corresponds to the "Er~B→C or D" erroneous read pattern.

Among the number of fail bits corresponding to "C or D→Er~B" erroneous read pattern, the number of fail bits corresponding to "C→B" erroneous read pattern can be regarded as being significantly greater than the number of fail bits corresponding to "D→Er~B" erroneous read pattern and "C→Er or A" erroneous pattern. Specifically, the counted number of fail bits corresponding to the combination C3_U1=(1, 0) can be regarded as being substantially equal to the number of fail bits corresponding to the "C→B" erroneous read pattern. Similarly, among the number of fail bits corresponding to "Er~B→C or D" erroneous read pattern, the number of fail bits corresponding to "B→C" erroneous read pattern can be regarded as being significantly greater than the number of fail bits corresponding to "Er or A→C or D" erroneous read pattern and "B→D" erroneous read pattern. Specifically, the counted number of fail bits corresponding to the combination C3_U1=(0, 1) can be regarded as being substantially equal to the number of fail bits corresponding to "B→C" erroneous read pattern.

Similarly, the bit selector 183 selects one set of two combinations, i.e. combinations C3 U2=(0, 1) and (1, 0), from the four combinations C3_U2. The combination C3 U2=(0, 1) indicates that data of the "E" state or "F" state is erroneously read from the memory cell transistor MT which stores data of the "G" state. The combination C3 U2=(1, 0) indicates that data of the "G" state is erroneously read from the memory cell transistor MT which stores data of the "E" state or "F" state. The combination C3 U2=(0, 1) corresponds to the "G→E or F" erroneous read pattern, and the combination C3 U2=(1, 0) corresponds to the "E or F→G" erroneous read pattern.

Among the number of fail bits corresponding to "G→E or F" erroneous read pattern, the number of fail bits corresponding to "G→F" erroneous read pattern can be regarded as being significantly greater than the number of fail bits corresponding to "G→E" erroneous read pattern. Specifically, the counted number of fail bits corresponding to the combination C3_U2=(0, 1) can be regarded as being substantially equal to the number of fail bits corresponding to "G→F" erroneous read pattern. Similarly, among the number of fail bits corresponding to "E or F→G" erroneous read pattern, the number of fail bits corresponding to "F→G" erroneous read pattern can be regarded as being significantly greater than the number of fail bits corresponding to "E→G" erroneous read pattern. Thus, the counted number of fail bits corresponding to the combination C3_U2=(1, 0) can be regarded as being substantially equal to the number of fail bits corresponding to "F→G" erroneous read pattern.

In consideration of the above-described approximation, the bit selector 183 selects, as one set, the counted number of fail bits corresponding to the combination C3_U1=(1, 0) which substantially corresponds to the number of fail bits corresponding to "C→B" erroneous read pattern, and the counted number of fail bits corresponding to the combination C3_U1=(0, 1) which substantially corresponds to the "B→C" erroneous read pattern, in the case of calculating the shift amount Δ for the reference voltage VC. In addition, the bit selector 183 selects, as one set, the counted number of fail bits corresponding to the combination C3_U2=(0, 1) which substantially corresponds to the number of fail bits corresponding to "G→F" erroneous read pattern, and the counted number of fail bits corresponding to the combination C3_U2=(1, 0) which substantially corresponds to the number of fail bits corresponding to "F→G" erroneous read pattern, in the case of calculating the shift amount Δ for the reference voltage VG.

For the read operation CR and GR, according to the above-described operations, the bit selector 183 can select the set of the two counted numbers for the "C→B" and "B→C" erroneous read patterns and the set of the two counted numbers for the "F→G" and "G→F" erroneous read patterns to be used in the shift amount calculation.

4.7 Middle Page Read Operation Including the Shift Amount Calculation

Figure 26:
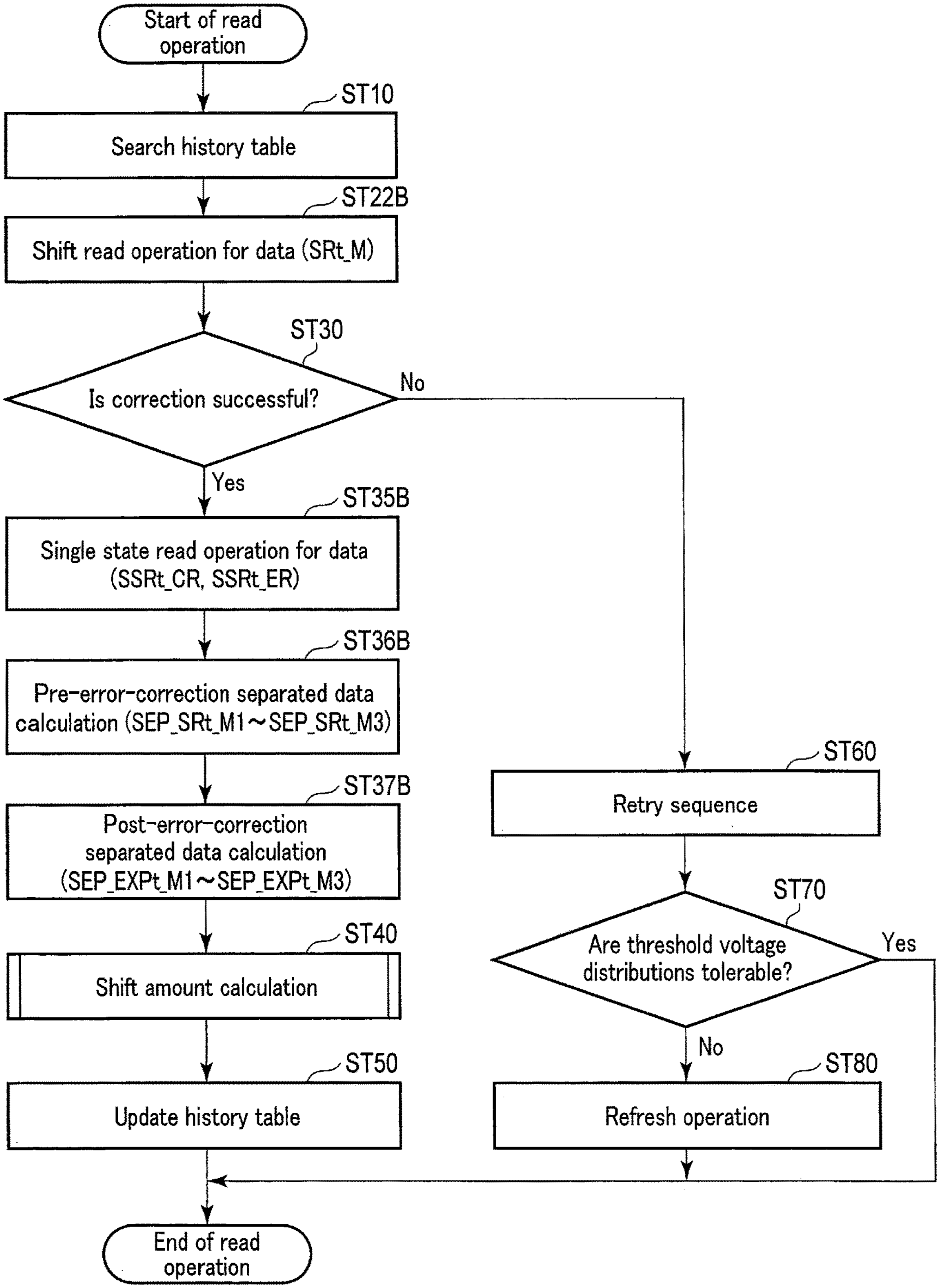
FIG. 26 is a flowchart of a middle page read operation which includes a shift amount calculation in the memory system according to the fourth embodiment.

Next, referring to a flowchart of FIG. 26, a description is given of an operation at a time of executing the shift amount calculation in the case of reading the middle page of the three pages by the random read operation. FIG. 26 corresponds to FIG. 22. In FIG. 26, step ST22B is executed in place of step ST22, and steps ST35B to ST37B are executed in place of steps ST35 to ST37.

As illustrated in FIG. 26, in step ST10, the memory controller 100 searches the history table in the RAM 120, and grasps the shift amounts Δ of the read operations (in the case of FIG. 26, read operations BR, DR and FR) corresponding to the page of the read target.

In step ST22B, the memory controller 100 issues a shift read command, based on the shift amounts Δ which were grasped in step ST10. Thereby, the chip Chip reads pre-error-correction middle read data SRt_M, and outputs the pre-error-correction middle read data SRt_M to the memory controller 100. In the memory controller 100, the pre-error-correction middle read data SRt_M is transferred to the ECC circuit 160, and is stored in the buffer memory 181 for read voltage correction.

In step ST30, the ECC circuit 160 executes an error correction process on the pre-error-correction middle read data SRt_M. When the error correction process by the ECC circuit 160 was successful (step ST30; yes), the ECC circuit 160 stores post-error-correction middle read data EXPt_M in the buffer memory 181 for read voltage correction. Then, the process advances to step ST35B. On the other hand, when the error correction process by the ECC circuit 160 failed (step ST30; no), the process advances to step ST60. Since the process of steps ST60 to ST80 is the same as in the case of FIG. 22, a description thereof is omitted.

In step ST35B, the memory controller 100 issues a single state read command using the voltages VC and VE as read voltages. Thereby, the chip Chip reads single state read data SSRt_CR and SSRt_ER and outputs the single state read data SSRt_CR and SSRt_ER to the memory controller 100. The single state read data SSRt_CR and SSRt_ER is stored in the buffer memory 181 for read voltage correction in the memory controller 100.

In step ST36B, the separated data generation circuit 186 generates pre-error-correction separated data SEP_SRt_M1, SEP_SRt_M2 and SEP_SRt_M3, based on the pre-error-correction middle read data SRt_M and single state read data SSRt_CR and SSRt_ER, which are read from the buffer memory 181 for read voltage correction. Specifically, the separated data generation circuit 186 extracts, from the pre-error-correction middle read data SRt_M, bits corresponding to data "1" of the single state read data SSRt_CR as the pre-error-correction separated data SEP_SRt_M1. In addition, the separated data generation circuit 186 extracts, from the pre-error-correction middle read data SRt_M, bits corresponding to data "0" and "1" of the single state read data SSRt_CR and SSRt_ER as the pre-error-correction separated data SEP_SRt_M2. Further, the separated data generation circuit 186 extracts, from the pre-error-correction middle read data SRt_M, bits corresponding to data "0" of the single state read data SSRt_ER as the pre-error-correction separated data SEP_SRt_M3. The extracted pre-error-correction separated data SEP_SRt_M1, SEP_SRt_M2 and SEP_SRt_M3 are sent to the bit counter 182.

In step ST37B, the separated data generation circuit 186 generates post-error-correction separated data SEP_EXPt_M1, SEP_EXPt_M2 and SEP_EXPt_M3, based on the post-error-correction middle read data EXPt_M and single state read data SSRt_CR and SSRt_ER, which are read from the buffer memory 181 for read voltage correction. Specifically, the separated data generation circuit 186 extracts, from the post-error-correction middle read data EXPt_M, bits corresponding to data "1" of the single state read data SSRt_CR as the post-error-correction separated data SEP_EXPt_M1. In addition, the separated data generation circuit 186 extracts, from the post-error-correction middle read data EXPt_M, bits corresponding to data "0" and "1" of the single state read data SSRt_CR and SSRt_ER as the post-error-correction separated data SEP_EXPt_M2. Further, the separated data generation circuit 186 extracts, from the post-error-correction middle read data EXPt_M, bits corresponding to data "0" of the single state read data SSRt_ER as the post-error-correction separated data SEP_EXPt_M3. The extracted post-error-correction separated data SEP_EXPt_M1 to SEP_EXPt_M3 are sent to the bit counter 182.

In step ST40, the read voltage correction circuit 180 executes a shift amount calculation, based on the pre-error-correction separated data SEP_SRt_M1, SEP_SRt_M2 and SEP_SRt_M3, and the post-error-correction separated data SEP_EXPt_M1, SEP_EXPt_M2 and SEP_EXPt_M3. The details of the shift amount calculation will be described later.

In step ST50, the memory controller 100 updates the history table by storing the shift amounts Δ calculated in step ST40 in a corresponding area in the history table of the RAM 120.

Then, the read operation ends.

4.8 Shift Amount Calculation Based on the Middle Page Read Operation

Figure 27:
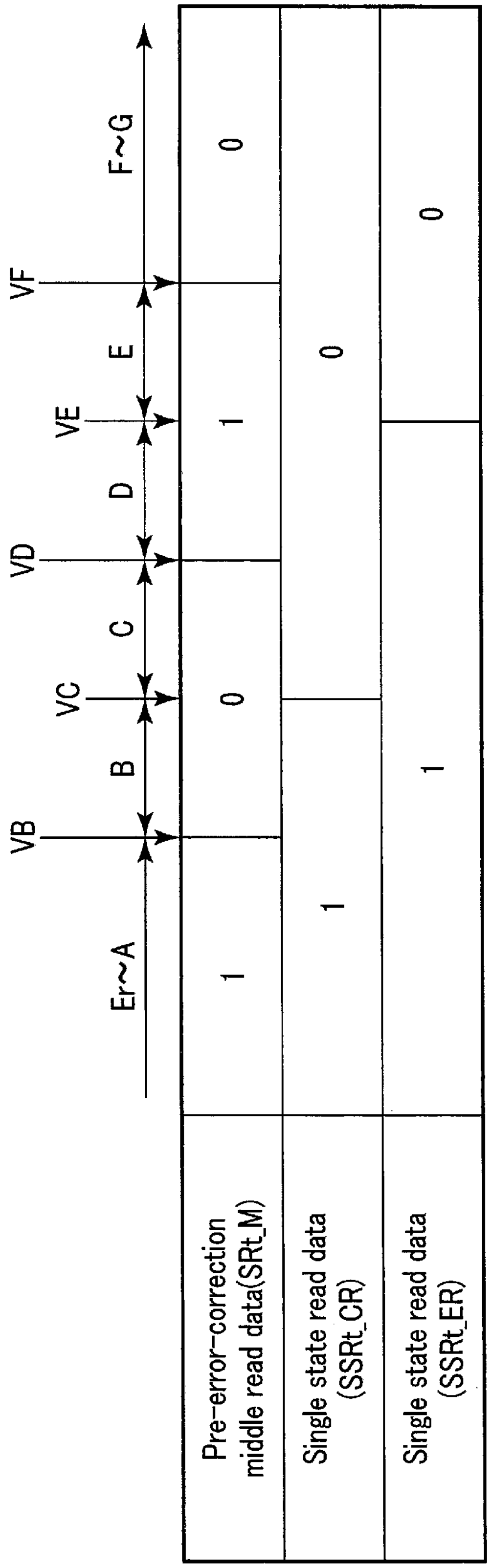
FIG. 27 schematically illustrates a process of the shift amount calculation in the middle page read operation in the memory system according to the fourth embodiment.
Figure 28:
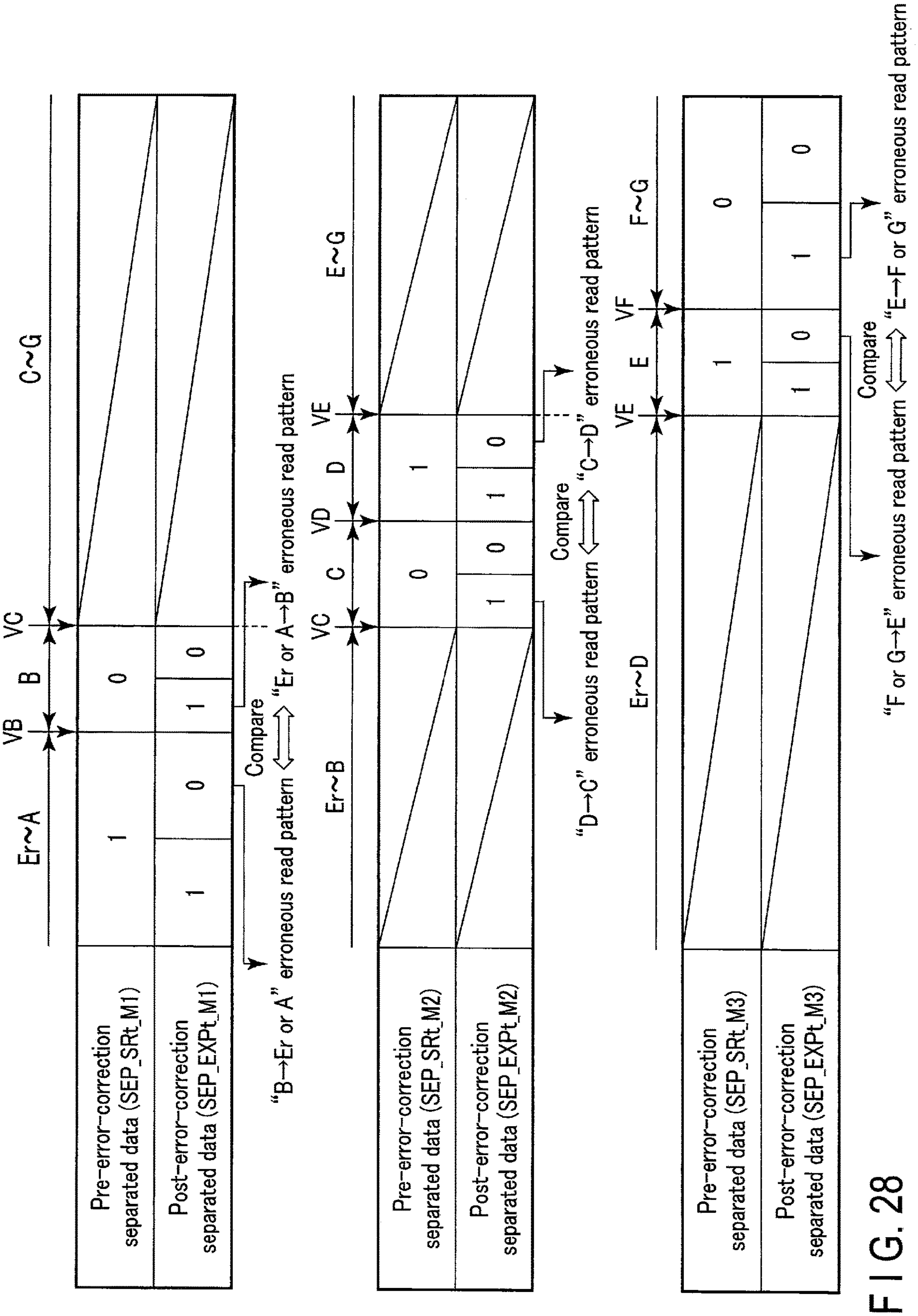
FIG. 28 schematically illustrates a process of the shift amount calculation in the middle page read operation in the memory system according to the fourth embodiment.

FIG. 27 and FIG. 28 are schematic diagrams for describing the shift amount calculation based on the middle page read operation in the memory system according to the fourth embodiment. FIG. 27 illustrates data which is read by the shift read operation and single state read operation, and FIG. 28 illustrates a process up to the selection of count values of the estimation index calculation target in the shift amount calculation.

As illustrated in FIG. 27, the pre-error-correction middle read data SRt_M classifies the memory cell transistors MT in the cell unit CU into two groups in accordance with threshold voltages. Specifically, the pre-error-correction middle read data SRt_M becomes data "1" when the threshold voltage is less than the voltage VB, or is not less than the voltage VD and is less than the voltage VF, and the corresponding memory cell transistors MT are regarded as belonging to the threshold voltage distribution of the "Er" state, "A" state, "D" state or "E" state. In addition, the pre-error-correction middle data SRt_M becomes data "0" when the threshold voltage is not less than the voltage VB and is less than VD, or is not less than the voltage VF, and the corresponding memory cell transistors MT are regarded as belonging to the threshold voltage distribution of the "B" state, "C" state, "F" state or "G" state.

The single state read data SSRt_CR and SSRt_ER are the same as in the case of the lower page read and the case of the upper page read, respectively.

Thus, as illustrated in FIG. 28, the pre-error-correction separated data SEP_SRt_M1 classifies the memory cell transistors MT, which were regarded as belonging to the threshold voltage distributions of the "Er" state to "B" state, into two groups (data "1" when the threshold voltage is less than the voltage VB, and data "0" when the threshold voltage is not less than the voltage VB). Specifically, the memory cell transistors MT, in which the pre-error-correction separated data SEP_SRt_M1 is data "1", are regarded as belonging to the threshold voltage distribution of the "Er"

state or "A" state, and the memory cell transistors MT, in which the pre-error-correction separated data SEP_SRt_M1 is data "0", are regarded as belonging to the threshold voltage distribution of the "B" state. In addition, the pre-error-correction separated data SEP_SRt_M2 classifies the memory cell transistors MT, which were regarded as belonging to the threshold voltage distributions of the "C" state to "D" state, into two groups (data "0" when the threshold voltage is less than the voltage VD, and data "1" when the threshold voltage is not less than the voltage VD). Specifically, the memory cell transistors MT, in which the pre-error-correction separated data SEP_SRt_M2 is data "0", are regarded as belonging to the threshold voltage distribution of the "C" state, and the memory cell transistors MT, in which the pre-error-correction separated data SEP_SRt_M2 is data "1", are regarded as belonging to the threshold voltage distribution of the "D" state. Further, the pre-error-correction separated data SEP_SRt_M3 classifies the memory cell transistors MT, which were regarded as belonging to the threshold voltage distributions of the "E" state to "G" state, into two groups (data "1" when the threshold voltage is less than the voltage VF, and data "0" when the threshold voltage is not less than the voltage VF). Specifically, the memory cell transistors MT, in which the pre-error-correction separated data SEP_SRt_M3 is data "1", are regarded as belonging to the threshold voltage distribution of the "E" state, and the memory cell transistors MT, in which the pre-error-correction separated data SEP_SRt_M3 is data "0", are regarded as belonging to the threshold voltage distribution of the "F" state or "G" state.

On the other hand, the post-error-correction separated data SEP_EXPt_M1 to SEP_EXPt_M3 classify the memory cell transistors MT into two groups, without depending on the classification by the pre-error-correction separated data SEP_SRt_M1 to SEP_SRt_M3. Specifically, the memory cell transistors MT, in which the post-error-correction separated data SEP_EXPt_M1 to SEP_EXPt_M3 become data "1", are expected to belong to the threshold voltage distribution of the "Er" state, "A" state, "D" state or "E" state. The memory cell transistors MT, in which the post-error-correction separated data SEP_EXPt_M1 to SEP_EXPt_M3 become data "0", are expected to belong to the threshold voltage distribution of the "B" state, "C" state, "F" state or "G" state.

As described above, the post-error-correction separated data SEP_EXPt_M1 is a set of memory cell transistors MT which are regarded as belonging to the threshold voltage distributions of the "Er" state to "B" state, the post-error-correction separated data SEP_EXPt_M2 is a set of memory cell transistors MT which are regarded as belonging to the threshold voltage distribution of the "C" state or "D" state, and the post-error-correction separated data SEP_EXPt_M3 is a set of memory cell transistors MT which are regarded as belonging to the threshold voltage distributions of the "E" state to "G" state. Thus, the memory cell transistors MT, in which the post-error-correction separated data SEP_EXPt_M1 is data "1", can be regarded as being expected to belong to the threshold voltage distribution of the "Er" state or "A" state, and the memory cell transistors MT, in which the post-error-correction separated data SEP_EXPt_M1 is data "0", can be regarded as being expected to belong to the threshold voltage distribution of the "B" state. In addition, the memory cell transistors MT, in which the post-error-correction separated data SEP_EXPt_M2 is data "1", can be regarded as being expected to belong to the threshold voltage distribution of the "D" state, and the memory cell transistors MT, in which the post-error-correction separated data SEP_EXPt_M2 is data "0", can be regarded as being expected to belong to the threshold voltage distribution of the "C" state. Further, the memory cell transistors MT, in which the post-error-correction separated data SEP_EXPt_M3 is data "1", can be regarded as being expected to belong to the threshold voltage distribution of the "E" state, and the memory cell transistors MT, in which the post-error-correction separated data SEP_EXPt_M3 is data "0", can be regarded as being expected to belong to the threshold voltage distribution of the "F" state or "G" state.

Thus, the number of combinations of values, C3_M1=(SEP_SRt_M1, SEP_EXPt_M1), which the pre-error-correction separated data SEP_SRt_M1 and post-error-correction separated data SEP_EXPt_M1 can take, is 2×2=4. Similarly, the number of combinations of values, C3_M2=(SEP_SRt_M2, SEP_EXPt_M2), which the pre-error-correction separated data SEP_SRt_M2 and post-error-correction separated data SEP_EXPt_M2 can take, is 2×2=4. The number of combinations of values, C3_M3=(SEP_SRt_M3, SEP_EXPt_M3), which the pre-error-correction separated data SEP_SRt_M3 and post-error-correction separated data SEP_EXPt_M3 can take, is 2×2=4. The bit counter 182 counts the number of bits with respect to each of the four combinations C3_M1, four combinations C3_M2 and four combinations C3_M3 (i.e. each of the twelve combinations).

In the example of FIG. 28, the bit selector 183 selects one set of two combinations, i.e. combinations C3_M1=(1, 0) and (0, 1), from the four combinations C3_M1. The combination C3_M1=(1, 0) indicates that data of the "Er" state or "A" state is erroneously read from the memory cell transistor MT which stores data of the "B" state. The combination C3_M1=(0, 1) indicates that data of the "B" state is erroneously read from the memory cell transistor MT which stores data of the "Er" state or "A" state. The combination C3_M1=(1, 0) corresponds to the "B→Er or A" erroneous read pattern, and the combination C3_M1=(0, 1) corresponds to the "Er or A→B" erroneous read pattern.

Among the number of fail bits corresponding to "B→Er or A" erroneous read pattern, the number of fail bits corresponding to "B→A" erroneous read pattern can be regarded as being significantly greater than the number of fail bits corresponding to "B→Er" erroneous read pattern. Thus, the counted number of fail bits corresponding to the combination C3_M1=(1, 0) can be regarded as being substantially equal to the number of fail bits corresponding to "B→A" erroneous read pattern. Similarly, among the number of fail bits corresponding to "Er or A→B" erroneous read pattern, the number of fail bits corresponding to "A→B" erroneous read pattern can be regarded as being significantly greater than the number of fail bits corresponding to "Er→B" erroneous read pattern. Thus, the counted number of fail bits corresponding to the combination C3_M1=(0, 1) can be regarded as being substantially equal to the number of fail bits corresponding to "A→B" erroneous read pattern.

Similarly, the bit selector 183 selects one set of two combinations, i.e. combinations C3_M2=(0, 1) and (1, 0), from the four combinations C3_M2. The combination C3_M2=(0, 1) indicates that data of the "C" state is erroneously read from the memory cell transistor MT which stores data of the "D" state. The combination C3_M2=(1, 0) indicates that data of the "D" state is erroneously read from the memory cell transistor MT which stores data of the "C" state. Thus, the counted number of fail bits corresponding to the combination C3_M2=(0, 1) can be regarded as being substantially equal to the number of fail bits corresponding to "D→C" erroneous read pattern, and the counted number of fail bits corresponding to the combination C3_M2=(1, 0)

can be regarded as being substantially equal to the number of fail bits corresponding to "C→D" erroneous read pattern.

Likewise, the bit selector 183 selects one set of two combinations, i.e. combinations C3_M3=(1, 0) and (0, 1), from the four combinations C3_M3. The combination C3_M3=(1, 0) indicates that data of the "E" state is erroneously read from the memory cell transistor MT which stores data of the "F" state or "G" state. The combination C3_M3=(0, 1) indicates that data of the "F" state or "G" state is erroneously read from the memory cell transistor MT which stores data of the "E" state. The combination C3_M3=(1, 0) corresponds to the "F or G→E" erroneous read pattern, and the combination C3_M3=(0, 1) corresponds to the "E→F or G" erroneous read pattern.

Among the number of fail bits corresponding to "F or G→E" erroneous read pattern, the number of fail bits corresponding to "F→E" erroneous read pattern can be regarded as being significantly greater than the number of fail bits corresponding to "G→E" erroneous read pattern. Thus, the counted number of fail bits corresponding to the combination C3_M3=(1, 0) can be regarded as being substantially equal to the number of fail bits corresponding to "F→E" erroneous read pattern. Similarly, among the number of fail bits corresponding to "E→F or G" erroneous read pattern, the number of fail bits corresponding to "E→F" erroneous read pattern can be regarded as being significantly greater than the number of fail bits corresponding to "E→G" erroneous read pattern. Thus, the counted number of fail bits corresponding to the combination C3_M3=(0, 1) can be regarded as being substantially equal to the number of fail bits corresponding to "E→F" erroneous read pattern.

In consideration of the above-described approximation, the bit selector 183 selects, as one set, the counted number corresponding to the combination C3_M1=(1, 0), which substantially corresponds to the number of fail bits corresponding to the "B→A" erroneous read pattern, and the counted number corresponding to the combination C3_M1=(0, 1), which substantially corresponds to the number of fail bits corresponding to the "A→B" erroneous read pattern, in the case of calculating the shift amount Δ for the reference voltage VB. In addition, the bit selector 183 selects, as one set, the counted number of fail bits corresponding to the combination C3_M2=(0, 1), which substantially corresponds to the number of fail bits corresponding to the "D→C" erroneous read pattern, and the counted number of fail bits corresponding to the combination C3_M2=(1, 0), which substantially corresponds to the number of fail bits corresponding to the "C→D" erroneous read pattern, in the case of calculating the shift amount Δ for the reference voltage VD. Besides, the bit selector 183 selects, as one set, the counted number of fail bits corresponding to the combination C3_M3=(1, 0), which substantially corresponds to the number of fail bits corresponding to the "F→E" erroneous read pattern, and the counted number of fail bits corresponding to the combination C3_M3=(0, 1), which substantially corresponds to the number of fail bits corresponding to the "E→F" erroneous read pattern, in the case of calculating the shift amount Δ for the reference voltage VF.

For the read operation BR, DR, and FR, according to the above-described operations, the bit selector 183 can select the set of the two counted numbers for the "B→A" and "A→B" erroneous read patterns, the set of the two counted numbers for the "D→C" and "C→D" erroneous read patterns, and the set of the two counted numbers for the "F E" and "E→F" erroneous read patterns to be used in the shift amount calculation.

4.9 Advantageous Effects of the Fourth Embodiment

According to the fourth embodiment, even when 3-bit data can be stored in the memory cell transistors MT, the memory controller 100 can execute the error correction process by reading the single state read data in accordance with the random read operation. To be more specific, when the random read operation is the shift read operation using two kinds of read voltages as in the case of the lower page and upper page, the separated data generation circuit 186 separates each of the pre-error-correction read data and post-error-correction read data into two data by using one kind of single state read data. In addition, when the random read operation is the shift read operation using three kinds of read voltages as in the case of the middle page, the separated data generation circuit 186 separates each of the pre-error-correction read data and post-error-correction read data into three data by using two kinds of single state read data. Thereby, the bit counter 182 can count the number of bits with respect to each of the combinations of the pre-error-correction separated data and post-error-correction separated data, and the bit selector 183 can select two combinations of the estimation index calculation target with respect to each set of the pre-error-correction separated data and post-error-correction separated data. Thus, in the case of the random read operation, the shift amounts of the read voltages, which are used for reading the page of the random read operation target, can be calculated without executing a further shift read operation. Therefore, an increase of latency due to the read voltage correction can be suppressed.

5. Fifth Embodiment

In the fourth embodiment, the case was described in which 3-bit data can be stored in the memory cell transistors MT. However, this is not restrictive. For example, data of four or more bits can be stored in the memory cell transistors MT.

In the description below, a description of the same configuration and operation as in the fourth embodiment is omitted, and a different configuration and operation from the fourth embodiment will mainly be described.

5.1 Threshold Voltage Distributions of Memory Cell Transistors

Figure 29:
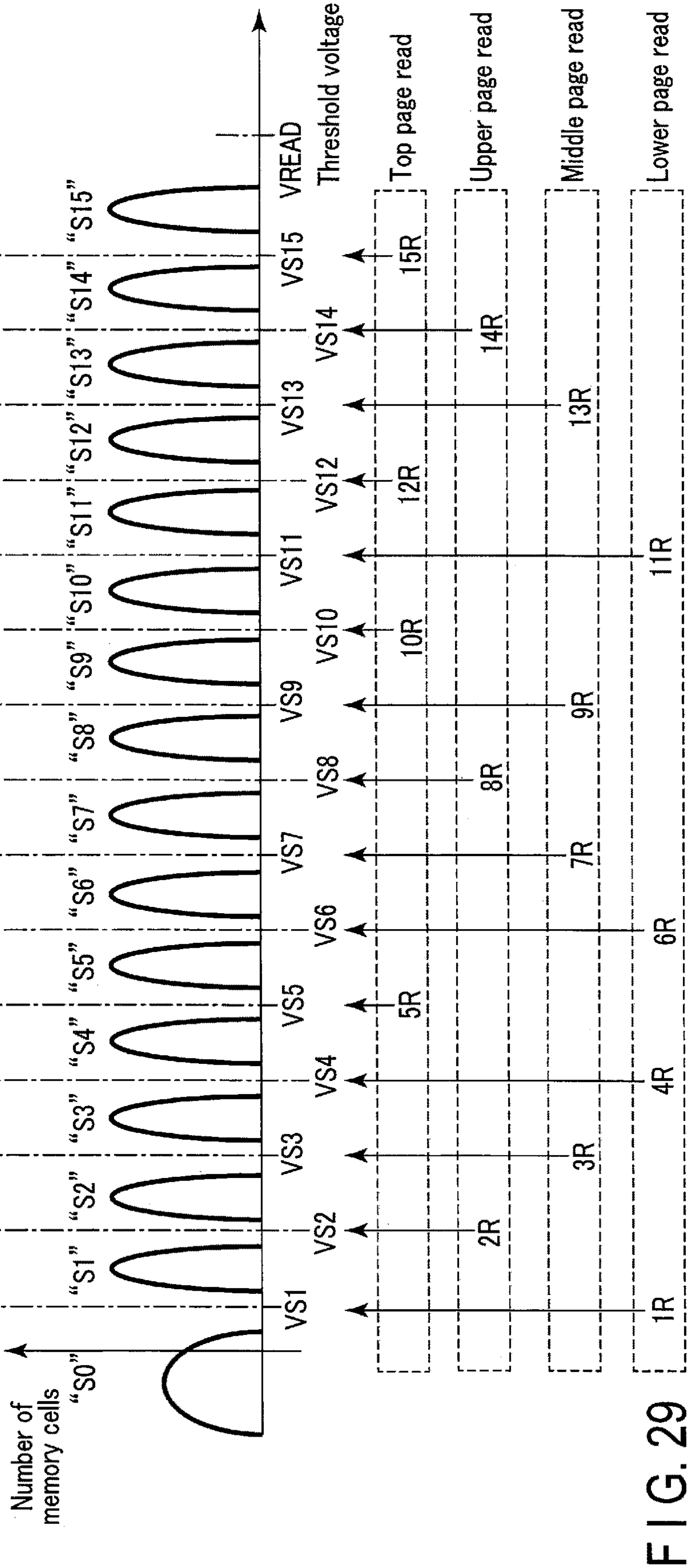
FIG. 29 schematically illustrates threshold voltage distribution of memory cells of a memory cell array for a memory system according to a fifth embodiment.

FIG. 29 is a diagram illustrating data which each memory cell transistor MT of a memory system according to a fifth embodiment can take, a threshold voltage distribution, and voltages used at a time of read. In the fifth embodiment, a case is assumed in which one memory cell transistor MT can store, for example, 4-bit data. It is assumed that the bits of the 4-bit data are called a lower bit, a middle bit, an upper bit and a top bit from the bit of the lower order. In addition, a set of lower bits, which are stored by the memory cells belonging to the same cell unit, is called "lower page", a set of middle bits is called "middle page", a set of upper bits is called "upper page", and a set of top bits is called "top page".

As described above, the memory cell transistor MT can store 4-bit data. Specifically, the memory cell transistor MT can take 16 states in accordance with threshold voltages. It is assumed that the 16 states are called an "S0" state, an "S1" state, an "S2" state, an "S3" state, an "S4" state, an "S5" state, an "S6" state, an "S7" state, an "S8" state, an "S9" state, an "S10" state, an "S11" state, an "S12" state, an "S13" state, an "S14" state, and an "S15" state in the order from the lowest threshold voltage.

The threshold voltage of the memory cell transistor MT in the "S0" is less than a voltage VS1, and corresponds to a data erase state. The threshold voltage of the memory cell transistor MT in the "Sk" is not less than a voltage VS(k) and is less than a voltage VS(k+1) (>VS(k)) (1≤k≤14). The threshold voltage of the memory cell transistor MT in the "S15" is not less than a voltage VS15 and is less than a voltage VREAD. Among the 16 states which are distributed in this manner, the "S15" state is a state with the highest threshold voltage.

The above-described threshold voltage distribution is realized by writing 4-bit (4-page) data which is composed of the above-described lower bit, middle bit, upper bit and top bit. Specifically, the relationship between the "S0" state to "S15" state, and the lower bit, middle bit, upper bit and top bit is, for example, as follows:

"S0" state: "1111" (expressed in the order of "top/upper/middle/lower"),
"S1" state: "1110",
"S2" state: "1010",
"S3" state: "1000",
"S4" state: "1001",
"S5" state: "0001",
"S6" state: "0000",
"S7" state: "0010",
"S8" state: "0110",
"S9" state: "0100",
"S10" state: "1100",
"S11" state: "1101",
"S12" state: "0101",
"S13" state: "0111",
"S14" state: "0011", and
"S15" state: "1011".

In this manner, only one bit of the four bits varies between data corresponding to two neighboring states in the threshold voltage distribution.

Accordingly, when the lower bit is read, a voltage corresponding to a boundary, at which the value ("0" or "1") of the lower bit changes, may be used. This also applies to the middle bit, upper bit and top bit.

Specifically, as illustrated in FIG. 29, the lower page read uses, as read voltages, the voltage VS1 which distinguishes the "S0" state and "S1" state, the voltage VS4 which distinguishes the "S3" state and "S4" state, the voltage VS6 which distinguishes the "S5" state and "S6" state, and the voltage VS11 which distinguishes the "S10" state and "S11" state. Read operations using the voltages V1, V4, V6 and V11 are referred to as read operations 1R, 4R, 6R and 11R, respectively.

The middle page read uses, as read voltages, the voltage VS3 which distinguishes the "S2" state and "S3" state, the voltage VS7 which distinguishes the "S6" state and "S7" state, the voltage VS9 which distinguishes the "S8" state and "S9" state, and the voltage VS13 which distinguishes the "S12" state and "S13" state. Read operations using the voltages V3, V7, V9 and V13 are referred to as read operations 3R, 7R, 9R and 13R, respectively.

The upper page read uses, as read voltages, the voltage VS2 which distinguishes the "S1" state and "S2" state, the voltage VS8 which distinguishes the "S7" state and "S8" state, and the voltage VS14 which distinguishes the "S13" state and "S14" state. Read operations using the voltages V2, V8 and V14 are referred to as read operations 2R, 8R and 14R, respectively.

In addition, the top page read uses, as read voltages, the voltage VS5 which distinguishes the "S4" state and "S5" state, the voltage VS10 which distinguishes the "S9" state and "S10" state, the voltage VS12 which distinguishes the "S11" state and "S12" state, and the voltage VS15 which distinguishes the "S14" state and "S15" state. Read operations using the voltages V5, V10, V12 and V15 are referred to as read operations 5R, 10R, 12R and 15R, respectively.

5.2 Lower Page Read Operation Including the Shift Amount Calculation

Figure 30:
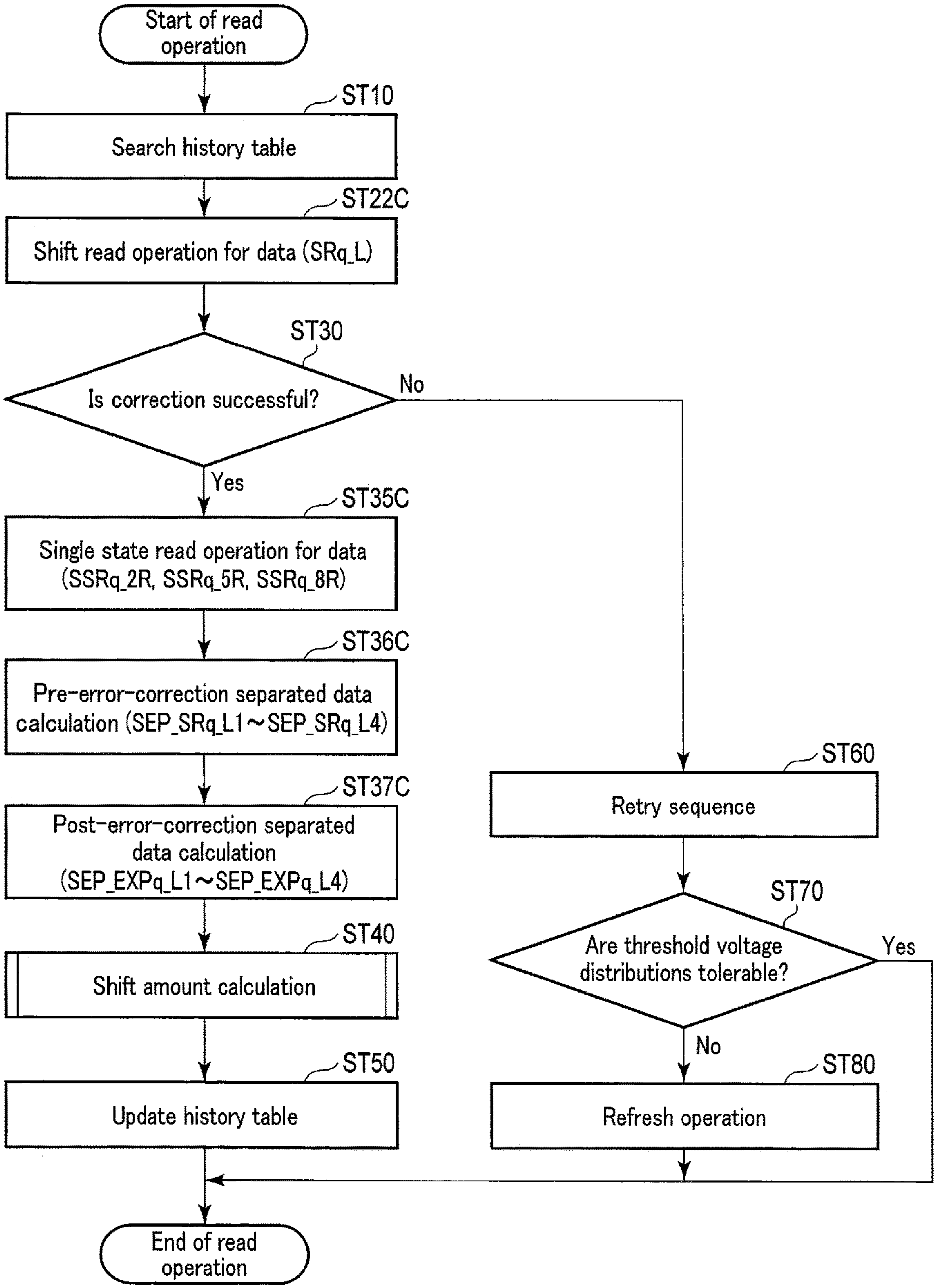
FIG. 30 is a flowchart of a lower page read operation which includes a shift amount calculation in the memory system according to the fifth embodiment.

In the fifth embodiment, referring to a flowchart of FIG. 30, a description is given of, by way of example, an operation at a time of executing the shift amount calculation in the case of reading the lower page of the four pages by the random read operation. FIG. 30 corresponds to FIG. 22 in the fourth embodiment. In FIG. 30, step ST22C is executed in place of step ST22, and steps ST35C to ST37C are executed in place of steps ST35 to ST37.

As illustrated in FIG. 30, in step ST10, the memory controller 100 searches the history table in the RAM 120, and grasps the shift amounts Δ of the read operations (in the case of FIG. 30, read operations 1R, 4R, 6R and 11R) corresponding to the page of the read target.

In step ST22C, the memory controller 100 issues a shift read command, based on the shift amounts Δ which were grasped in step ST10. Thereby, the chip Chip reads pre-error-correction lower read data SRq_L by read voltages to which the shift amounts of the history table are applied, and outputs the pre-error-correction lower read data SRq_L to the memory controller 100. In the memory controller 100, the pre-error-correction lower read data SRq_L is transferred to the ECC circuit 160, and is stored in the buffer memory 181 for read voltage correction.

In step ST30, the ECC circuit 160 executes an error correction process on the pre-error-correction lower read data SRq_L. When the error correction process by the ECC circuit 160 was successful (step ST30; yes), the ECC circuit 160 stores post-error-correction lower read data EXPq_L in the buffer memory 181 for read voltage correction. Then, the process advances to step ST35C. On the other hand, when the error correction process by the ECC circuit 160 failed (step ST30; no), the process advances to step ST60. Since the process of steps ST60 to ST80 is the same as in the case of FIG. 22, a description thereof is omitted.

In step ST35C, the memory controller 100 issues a single state read command using the voltages VS2, VS5 and VS8 as read voltages. Thereby, the chip Chip reads single state read data SSRq_2R, SSRq_5R and SSRq_8R and outputs the single state read data SSRq_2R, SSRq_5R and SSRq_8R to the memory controller 100. The single state read data SSRq_2R, SSRq_5R and SSRq_8R is stored in the buffer memory 181 for read voltage correction in the memory controller 100.

In step ST36C, the separated data generation circuit 186 generates pre-error-correction separated data SEP_SRq_L1, SEP_SRq_L2, SEP_SRq_L3 and SEP_SRq_L4, based on the pre-error-correction lower read data SRq_L and single state read data SSRq_2R, SSRq_5R and SSRq_8R, which are read from the buffer memory 181 for read voltage correction. Specifically, the separated data generation circuit 186 extracts, from the pre-error-correction lower read data SRq_L, bits corresponding to data "1" of the single state read data SSRq_2R as the pre-error-correction separated data SEP_SRq_L1, and extracts bits corresponding to data "0" and "1" of the single state read data SSRq_2R and SSRq_5R as the pre-error-correction separated data SEP_SRq_L2. The separated data generation circuit 186 extracts, from the pre-error-correction lower read data SRq_L, bits corresponding to data "0" and "1" of the single state read data SSRq_5R and SSRq_8R as the pre-error-correction separated data SEP_SRq_L3, and extracts bits corresponding to data "0" of the single state read data SSRq_8R as the pre-error-correction separated data SEP_SRq_L4. The extracted pre-error-correction separated data SEP_SRq_L1 to SEP_SRq_L4 are sent to the bit counter 182.

In step ST37C, the separated data generation circuit 186 generates post-error-correction separated data SEP_EXPq_L1, SEP_EXPq_L2, SEP_EXPq_L3 and SEP_EXPq_L4, based on the post-error-correction lower read data EXPq_L and single state read data SSRq_2R, SSRq_5R and SSRq_8R, which are read from the buffer memory 181 for read voltage correction. Specifically, the separated data generation circuit 186 extracts, from the post-error-correction lower read data EXPq_L, bits corresponding to data "1" of the single state read data SSRq_2R as the post-error-correction separated data SEP_EXPq_L1, and extracts bits corresponding to data "0" and "1" of the single state read data SSRq_2R and SSRq_5R as the post-error-correction separated data SEP_EXPq_L2. The separated data generation circuit 186 extracts, from the post-error-correction lower read data EXPq_L, bits corresponding to data "0" and "1" of the single state read data SSRq_5R and SSRq_8R as the post-error-correction separated data SEP_EXPq_L3, and extracts bits corresponding to data "0" of the single state read data SSRq_8R as the post-error-correction separated data SEP_EXPq_L4. The extracted post-error-correction separated data SEP_EXPq_L1 to SEP_EXPq_L4 are sent to the bit counter 182.

In step ST40, the read voltage correction circuit 180 executes a shift amount calculation, based on the pre-error-correction separated data SEP_SRq_L1 to SEP_SRq_L4, and the post-error-correction separated data SEP_EXPq_L1 to SEP_EXPq_L4. The details of the shift amount calculation will be described later.

In step ST50, the memory controller 100 updates the history table by storing the shift amounts Δ calculated in step ST40 in a corresponding area in the history table of the RAM 120.

Then, the read operation ends.

5.3 Shift Amount Calculation Based on the Lower Page Read Operation

Figure 31:
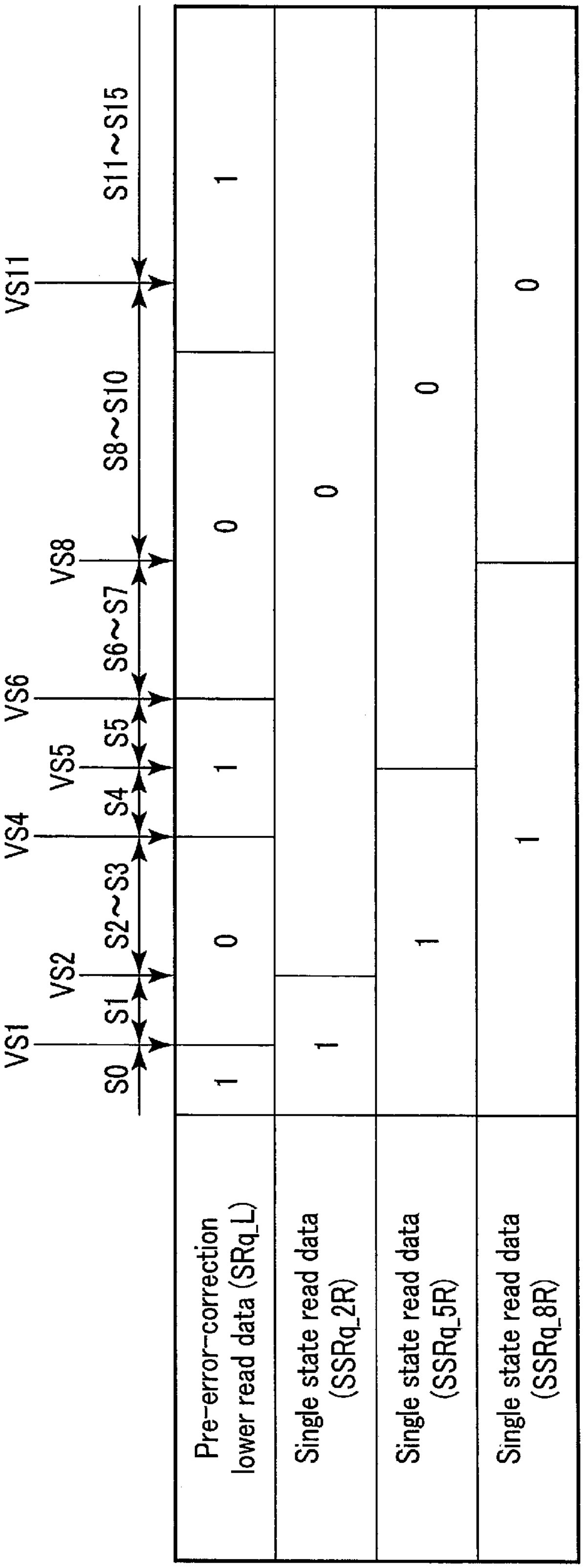
FIG. 31 schematically illustrates a process of the shift amount calculation in the lower page read operation in the memory system according to the fifth embodiment.
Figure 32:
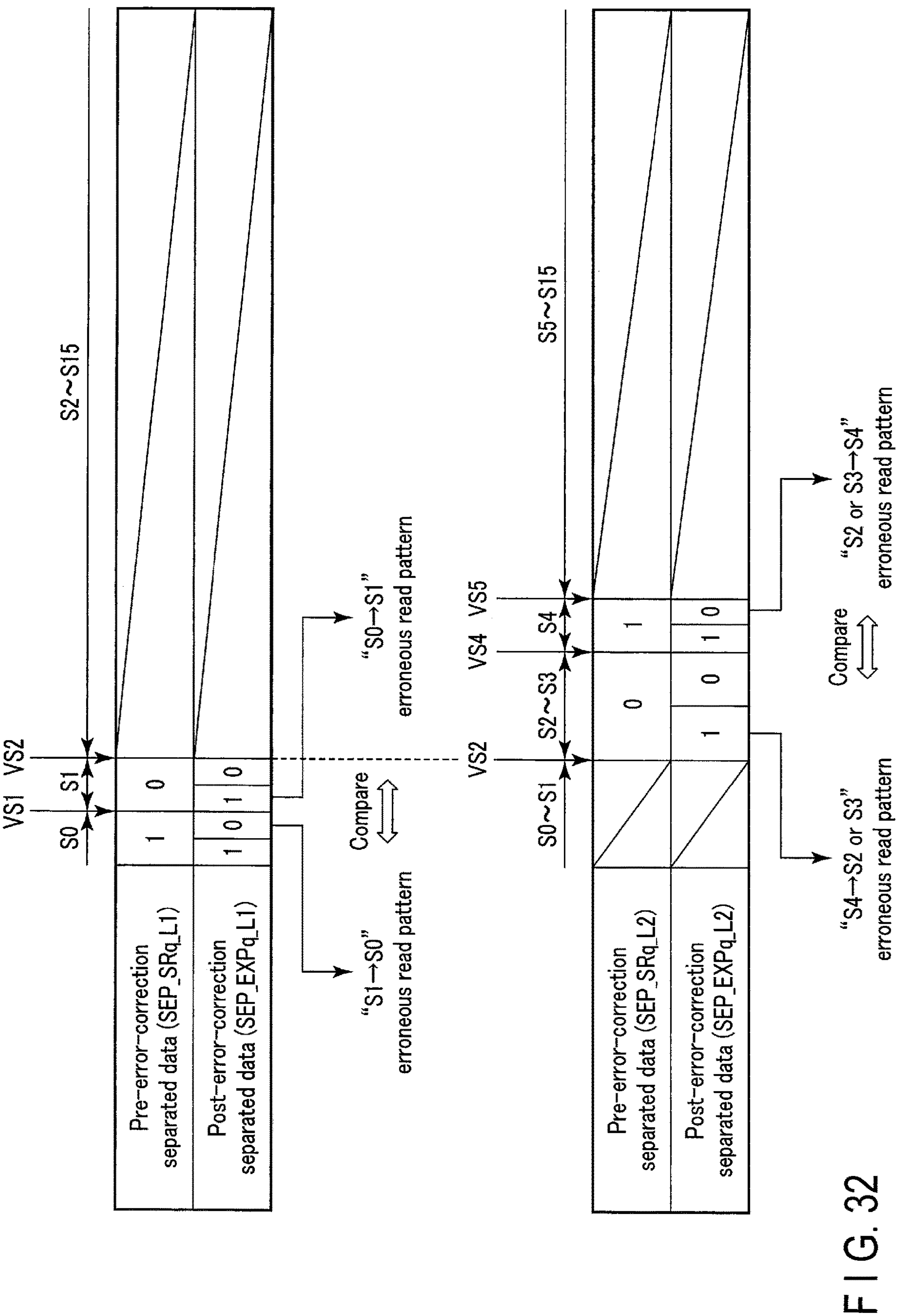
FIG. 32 schematically illustrates the process of the shift amount calculation in the lower page read operation in the memory system according to the fifth embodiment.
Figure 33:
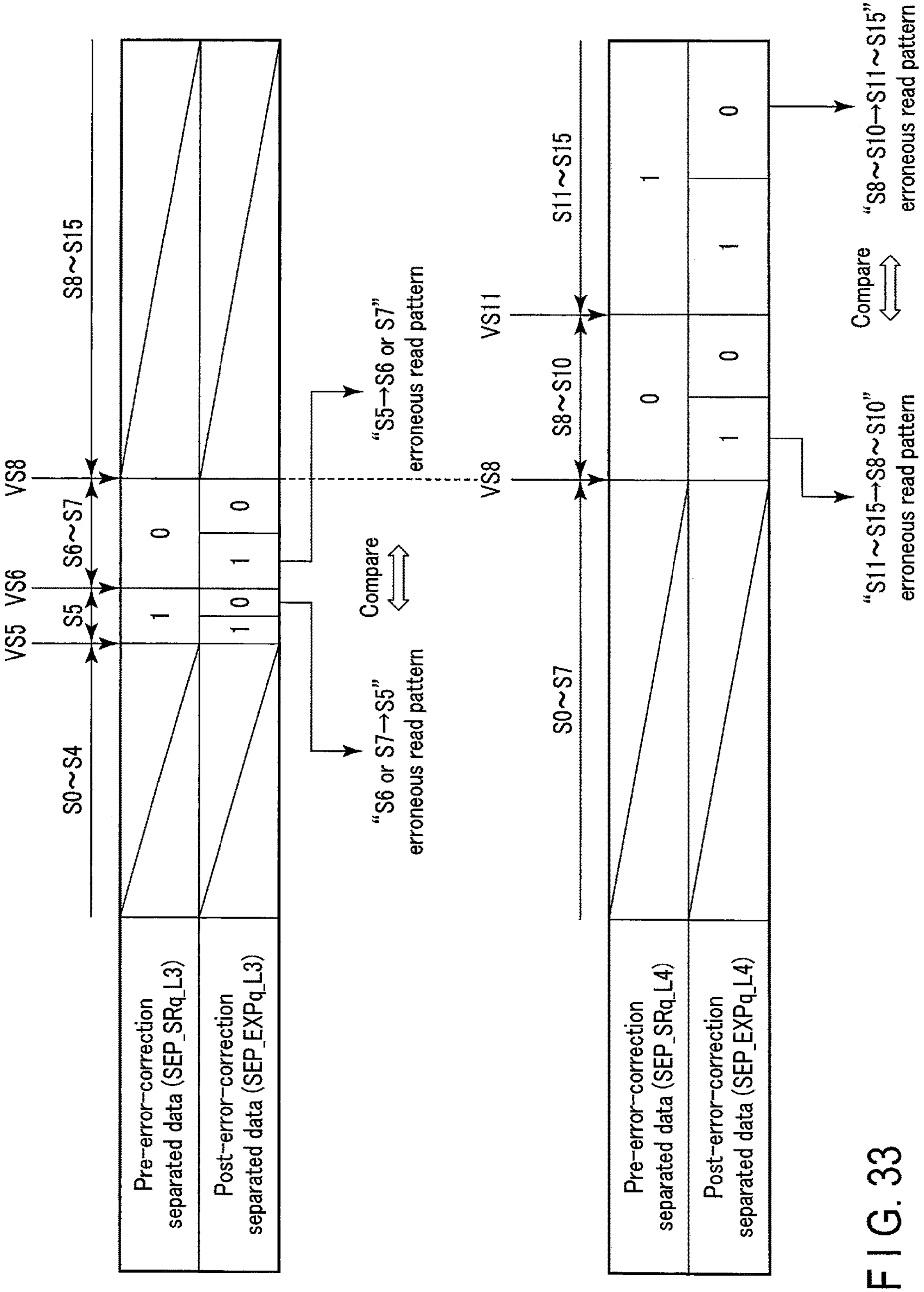
FIG. 33 schematically illustrates the process of the shift amount calculation in the lower page read operation in the memory system according to the fifth embodiment.

FIG. 31, FIG. 32 and FIG. 33 are schematic diagrams for describing the shift amount calculation based on the lower page read operation in the memory system according to the fifth embodiment. FIG. 31 illustrates data which is read by the shift read operation and single state read operation. FIG. 32 and FIG. 33 illustrate a process up to the selection of count values of the estimation index calculation target in the shift amount calculation, with respect to the read operations 1R and 4R and the read operations 6R and 11R.

As illustrated in FIG. 31, the pre-error-correction lower read data SRq_L classifies the threshold voltage distributions of the memory cell transistors MT in the cell unit CU into two groups. Specifically, the pre-error-correction lower read data SRq_L becomes data "1" when the threshold voltage is less than the voltage VS1, or is not less than the voltage VS4 and is less than VS6, or is not less than the voltage VS11, and the corresponding memory cell transistors MT are regarded as belonging to the threshold voltage distribution of the "S0" state, "S4" state, "S5" state, or the "S11" state to "S15" state. In addition, the pre-error-correction lower read data SRq_L becomes data "0" when the threshold voltage is not less than the voltage VS1 and is less than the voltage VS4, or is not less than the voltage VS6 and is less than the voltage VS11, and the corresponding memory cell transistors MT are regarded as belonging to the threshold voltage distributions of the "S1" state to "S3" state, or the "S6" state to "S10" state.

The single state read data SSRq_2R becomes data "1" when the threshold voltage is less than the voltage VS2, and the corresponding memory cell transistors MT are regarded as belonging to the threshold voltage distribution of the "S0" state or "S1" state. In addition, the single state read data SSRq_2R becomes data "0" when the threshold voltage is not less than the voltage VS2, and the corresponding memory cell transistors MT are regarded as belonging to the threshold voltage distributions of the "S2" state to "S15" state.

The single state read data SSRq_5R becomes data "1" when the threshold voltage is less than the voltage VS5, and the corresponding memory cell transistors MT are regarded as belonging to the threshold voltage distribution of the "S0" state to "S4" state. In addition, the single state read data SSRq_5R becomes data "0" when the threshold voltage is not less than the voltage VS5, and the corresponding memory cell transistors MT are regarded as belonging to the threshold voltage distributions of the "S5" state to "S15" state.

The single state read data SSRq_8R becomes data "1" when the threshold voltage is less than the voltage VS8, and the corresponding memory cell transistors MT are regarded as belonging to the threshold voltage distributions of the "S0" state to "S7" state. In addition, the single state read data SSRq_8R becomes data "0" when the threshold voltage is not less than the voltage VS8, and the corresponding memory cell transistors MT are regarded as belonging to the threshold voltage distributions of the "S8" state to "S15" state.

Thus, as illustrated in FIG. 32, the pre-error-correction separated data SEP_SRq_L1 classifies the memory cell transistors MT, which were regarded as belonging to the threshold voltage distributions of the "S0" state to "S1" state, into two groups (data "1" when the threshold voltage is less than the voltage VS1, and data "0" when the threshold voltage is not less than the voltage VS1). Specifically, the memory cell transistors MT, in which the pre-error-correction separated data SEP_SRq_L1 is data "1", are regarded as belonging to the threshold voltage distribution of the "S0" state, and the memory cell transistors MT, in which the pre-error-correction separated data SEP_SRq_L1 is data "0", are regarded as belonging to the threshold voltage distribution of the "S1" state. In addition, the pre-error-correction separated data SEP_SRq_L2 classifies the memory cell transistors MT, which were regarded as belonging to the threshold voltage distributions of the "S2" state to "S4" state, into two groups (data "0" when the threshold voltage is less than the voltage VS4, and data "1" when the threshold voltage is not less than the voltage VS4). Specifically, the memory cell transistors MT, in which the pre-error-correction separated data SEP_SRq_L2 is data "0", are regarded as belonging to the threshold voltage distribution of the "S2" state or "S3" state, and the memory cell transistors MT, in which the pre-error-correction separated data SEP_SRq_L2 is data "1", are regarded as belonging to the threshold voltage distribution of the "S4" state.

In addition, as illustrated in FIG. 33, the pre-error-correction separated data SEP_SRq_L3 classifies the memory cell transistors MT, which were regarded as belonging to the threshold voltage distributions of the "S5" state to "S7" state, into two groups (data "1" when the threshold voltage is less than the voltage VS6, and data "0" when the threshold voltage is not less than the voltage VS6). Specifically, the memory cell transistors MT, in which the pre-error-correction separated data SEP_SRq_L3 is data "1", are regarded as belonging to the threshold voltage distribution of the "S5" state, and the memory cell transistors MT, in which the pre-error-correction separated data SEP_SRq_L3 is data "0", are regarded as belonging to the threshold voltage distribution of the "S6" state or "S7" state. In addition, the pre-error-correction separated data SEP_SRq_L4 classifies the memory cell transistors MT, which were regarded as belonging to the threshold voltage distributions of the "S8" state to "S15" state, into two groups (data "0" when the threshold voltage is less than the voltage VS11, and data "1" when the threshold voltage is not less than the voltage VS11). Specifically, the memory cell transistors MT, in which the pre-error-correction separated data SEP_SRq_L4 is data "0", are regarded as belonging to the threshold voltage distributions of the "S8" state to "S10" state, and the memory cell transistors MT, in which the pre-error-correction separated data SEP_SRq_L4 is data "1", are regarded as belonging to the threshold voltage distributions of the "S11" state to "S15" state.

On the other hand, as illustrated in FIG. 32 and FIG. 33, the post-error-correction separated data SEP_EXPq_L1 to SEP_EXPq_L4 classify the memory cell transistors MT into two groups, without depending on the classification by the pre-error-correction separated data SEP_SRq_L1 to SEP_SRq_L4. Specifically, the memory cell transistors MT, in which the post-error-correction separated data SEP_EXPq_L1 to SEP_EXPq_L4 become data "1", are expected to belong to the threshold voltage distribution of the "S0" state, "S4" state, "S5" state, or "S11" state to "S15 state. The memory cell transistors MT, in which the post-error-correction separated data SEP_EXPq_L1 to SEP_EXPq_L4 become data "0", are expected to belong to the threshold voltage distributions of the "S1" state to "S3" state, or "S6" state to "S10" state.

As described above, the post-error-correction separated data SEP_EXPq_L1 is a set of memory cell transistors MT which are regarded as belonging to the threshold voltage distribution of the "S0" state or "S1" state, the post-error-correction separated data SEP_EXPq_L2 is a set of memory cell transistors MT which are regarded as belonging to the threshold voltage distributions of the "S2" state to "S4" state, the post-error-correction separated data SEP_EXPq_L3 is a set of memory cell transistors MT which are regarded as belonging to the threshold voltage distributions of the "S5" state to "S7" state, and the post-error-correction separated data SEP_EXPq_L4 is a set of memory cell transistors MT which are regarded as belonging to the threshold voltage distributions of the "S8" state to "S15" state. Thus, the memory cell transistors MT, in which the post-error-correction separated data SEP_EXPq_L1 is data "1", can be regarded as being expected to belong to the threshold voltage distribution of the "S0" state, and the memory cell transistors MT, in which the post-error-correction separated data SEP_EXPq_L1 is data "0", can be regarded as being expected to belong to the threshold voltage distribution of the "S1" state. In addition, the memory cell transistors MT, in which the post-error-correction separated data SEP_EXPq_L2 is data "1", can be regarded as being expected to belong to the threshold voltage distribution of the "S4" state, and the memory cell transistors MT, in which the post-error-correction separated data SEP_EXPq_L2 is data "0", can be regarded as being expected to belong to the threshold voltage distribution of the "S2" state or "S3" state. Besides, the memory cell transistors MT, in which the post-error-correction separated data SEP_EXPq_L3 is data "1", can be regarded as being expected to belong to the threshold voltage distribution of the "S5" state, and the memory cell transistors MT, in which the post-error-correction separated data SEP_EXPq_L3 is data "0", can be regarded as being expected to belong to the threshold voltage distribution of the "S6" state or "S7" state. Further, the memory cell transistors MT, in which the post-error-correction separated data SEP_EXPq_L4 is data "1", can be regarded as being expected to belong to the threshold voltage distributions of the "S11" state to "S15" state, and the memory cell transistors MT, in which the post-error-correction separated data SEP_EXPq_L4 is data "0", can be regarded as being expected to belong to the threshold voltage distributions of the "S8" state to "S10" state.

Thus, the number of combinations of values, C4_L1=(SEP_SRq_L1, SEP_EXPq_L1), which the pre-error-correction separated data SEP_SRq_L1 and post-error-correction separated data SEP_EXPq_L1 can take, is 2×2=4. The number of combinations of values, C4_L2=(SEP_SRq_L2, SEP_EXPq_L2), which the pre-error-correction separated data SEP_SRq_L2 and post-error-correction separated data SEP_EXPq_L2 can take, is 2×2=4. The number of combinations of values, C4_L3=(SEP_SRq_L3, SEP_EXPq_L3), which the pre-error-correction separated data SEP_SRq_L3 and post-error-correction separated data SEP_EXPq_L3 can take, is 2×2=4. The number of combinations of values, C4_L4=(SEP_SRq_L4, SEP_EXPq_L4), which the pre-error-correction separated data SEP_SRq_L4 and post-error-correction separated data SEP_EXPq_L4 can take, is 2×2=4. The bit counter 182 counts the number of bits with respect to each of the four combinations C4_L1, four combinations C4_L2, four combinations C4_L3 and four combinations C4_L4 (i.e. each of the 16 combinations).

In the example of FIG. 32, the bit selector 183 selects one set of two combinations, i.e. combinations C4_L1=(1, 0) and (0, 1), from the four combinations C4_L1. The combination C4_L1=(1, 0) indicates that data of the "S0" state is erroneously read from the memory cell transistor MT which stores data of the "S1" state. The combination C4_L1=(0, 1) indicates that data of the "S1" state is erroneously read from the memory cell transistor MT which stores data of the "S0" state. Thus, the counted number of fail bits corresponding to the combination C4_L1=(1, 0) is equal to the number of fail bits corresponding to "S1→S0" erroneous read pattern, and the counted number of fail bits corresponding to the combination C4_L1=(0, 1) is equal to the number of fail bits corresponding "S0→S1" erroneous read pattern, Similarly, the bit selector 183 selects one set of two combinations, i.e. combinations C4_L2=(0, 1) and (1, 0), from the four combinations C4_L2. The combination C4_L2=(0, 1) indicates that data of the "S2" state or "S3" state is erroneously read from the memory cell transistor MT which stores data of the "S4" state. The combination C4_L2=(1, 0) indicates that data of the "S4" state is erroneously read from the memory cell transistor MT which stores data of the "S2" state or "S3" state. The combination C4_L2=(0, 1) corresponds to the "S4→S2 or S3" erroneous read pattern, and the combination C4_L2=(1, 0) corresponds to the "S2 or S3→S4" erroneous read pattern.

Among the number of fail bits corresponding to the "S4→S2 or S3" erroneous read pattern, the number of fail bits corresponding to the "S4→S3" erroneous read pattern can be regarded as being significantly greater than the number of fail bits corresponding to the "S4→S2" erroneous read pattern. Thus, the counted number of fail bits corresponding to the combination C4_L2=(0, 1) can be regarded as being substantially equal to the number of fail bits corresponding to the "S4→S3" erroneous read pattern. Similarly, among the number of fail bits corresponding to the "S2 or S3→S4" erroneous read pattern, the number of fail bits corresponding to the "S3→S4" erroneous read pattern can be regarded as being significantly greater than the number of fail bits corresponding to the "S2→S4" erroneous read pattern. Thus, the counted number of fail bits corresponding to the combination C4_L2=(1, 0) can be regarded as being substantially equal to the number of fail bits corresponding to the "S3→S4" erroneous read pattern.

In the example of FIG. 33, the bit selector 183 selects one set of two combinations, i.e. combinations C4_L3=(1, 0) and (0, 1), from the four combinations C4_L3. The combination C4_L3=(1, 0) indicates that data of the "S5" is erroneously read from the memory cell transistor MT which stores data of the "S6" state or "S7" state. The combination C4_L3=(0, 1) indicates that data of the "S6" state or "S7" state is erroneously read from the memory cell transistor MT which stores data of the "S5" state. The combination C4_L3=(1, 0) corresponds to the "S6 or S7→S5" erroneous read pattern, and the combination C4_L3=(0, 1) corresponds to the "S5→S6 or S7" erroneous read pattern.

Among the number of fail bits corresponding to the "S6 or S7→S5" erroneous read pattern, the number of fail bits corresponding to the "S6→S5" erroneous read pattern can be regarded as being significantly greater than the number of fail bits corresponding to the "S7→S5" erroneous read pattern. Thus, the counted number of fail bits corresponding to the combination C4_L3=(1, 0) can be regarded as being substantially equal to the number of fail bits corresponding to the "S6→S5" erroneous read pattern. Similarly, among the number of fail bits corresponding to the "S5→S6 or S7" erroneous read pattern, the number of fail bits corresponding to the "S5→S6" erroneous read pattern can be regarded as being significantly greater than the number of fail bits corresponding to the "S5→S7" erroneous read pattern. Thus, the counted number of fail bits corresponding to the combination C4_L3=(0, 1) can be regarded as being substantially equal to the number of fail bits corresponding to the "S5→S6" erroneous read pattern.

Similarly, the bit selector 183 selects one set of two combinations, i.e. combinations C4_L4=(0, 1) and (1, 0), from the four combinations C4_L4. The combination C4_L4=(0, 1) indicates that data of the "S8" state to "S10" state is erroneously read from the memory cell transistor MT which stores data of the "S11" state to "S15" state. The combination C4_L4=(1, 0) indicates that data of the "S11" state to "S15" state is erroneously read from the memory cell transistor MT which stores data of the "S8" state to "S10" state. The combination C4_L4=(0, 1) corresponds to the "S11~S15→S8~S10" erroneous read pattern, and the combination C4_L4=(1, 0) corresponds to the "S8~S10→S11~S15" erroneous read pattern.

Among the number of fail bits corresponding to the "S11~S15→S8~S10" erroneous read pattern, the number of fail bits corresponding to the "S11→S10" erroneous read pattern can be regarded as being significantly greater than the number of fail bits corresponding to the "S12~S15→S8~S10" erroneous read pattern and the "S11→S8 or S9" erroneous read pattern. Thus, the counted number of fail bits corresponding to the combination C4_L4=(0, 1) can be regarded as being substantially equal to the number of fail bits corresponding to the "S11→S10" erroneous read pattern. Similarly, among the number of fail bits corresponding to the "S8~S10→S11~S15" erroneous read pattern, the number of fail bits corresponding to the "S10→S11" erroneous read pattern can be regarded as being significantly greater than the number of fail bits corresponding to the "S8 or S9→S11~S15" erroneous read pattern and the "S10→S12~S15" erroneous read pattern. Thus, the counted number of fail bits corresponding to the combination C4_L4=(1, 0) can be regarded as being substantially equal to the number of fail bits corresponding to the "S10→S11" erroneous read pattern.

By performing the above-described approximation, the bit selector 183 selects, as one set, the count value of the combination C4_L1=(1, 0), which substantially corresponds to the "S1→S0" erroneous read pattern, and the count value of the combination C4_L1=(0, 1), which substantially corresponds to the "S0→S1" erroneous read pattern, in the case of calculating the shift amount Δ for the reference voltage VS1. The bit selector 183 selects, as one set, the count value of the combination C4_L2=(0, 1), which substantially corresponds to the "S4→S3" erroneous read pattern, and the count value of the combination C4_L2=(1, 0), which substantially corresponds to the "S3→S4" erroneous read pattern, in the case of calculating the shift amount Δ for the reference voltage VS4. The bit selector 183 selects, as one set, the count value of the combination C4_L3=(1, 0), which substantially corresponds to the "S6→S5" erroneous read pattern, and the count value of the combination C4_L3=(0, 1), which substantially corresponds to the "S5→S6" erroneous read pattern, in the case of calculating the shift amount Δ for the reference voltage VS6. The bit selector 183 selects, as one set, the count value of the combination C4_L4=(0, 1), which substantially corresponds to the "S11→S10" erroneous read pattern, and the count value of the combination C4_L4=(1, 0), which substantially corresponds to the "S10→S11" erroneous read pattern, in the case of calculating the shift amount Δ for the reference voltage VS11.

By operating as described above, the bit selector 183 can select, with respect to the read operations 1R, 4R, 6R and 11R, the sets each including the two count values for use in the shift amount calculation.

5.4 Advantageous Effects of the Fifth Embodiment

According to the fifth embodiment, even when 4-bit data can be stored in the memory cell transistors MT, the memory controller 100 can execute the error correction process by reading the single state read data in accordance with the random read operation. To be more specific, when the random read operation is the shift read operation using four kinds of read voltages as in the case of the lower page, the separated data generation circuit 186 separates each of the pre-error-correction read data and post-error-correction read data into four data by using three kinds of single state read data. Thereby, the bit counter 182 can count the number of bits with respect to each set of the pre-error-correction separated data and post-error-correction separated data, and the bit selector 183 can select two combinations of the estimation index calculation target with respect to each set of the pre-error-correction separated data and post-error-correction separated data. Thus, in the case of the random read operation, the shift amounts of the read voltages, which are used for reading the page of the random read operation target, can be calculated without executing a further shift read operation. Therefore, an increase of latency due to the read voltage correction can be suppressed.

In the meantime, the shift amount calculation described in the fourth embodiment and fifth embodiment are applicable when the memory cell transistor MT can store a freely selected number of bits. Concretely, when the shift read operation using i kinds of read voltages is executed in the read operation of data from one page, the read data can be separated into an i-number of separated data by (i−1) kinds of single state read data (i is a natural number). The bit counter 182 counts the number of bits with respect to each separated data, and the bit selector 183 selects two combinations of the estimation index calculation target with respect to each separated data. Thereby, even when the number of kinds of read voltages, which are used in the read operation of data from one page, is greater than four, an increase of latency due to the read voltage correction can be suppressed as in the case of the fifth embodiment.

6. Sixth Embodiment

In the fifth embodiment, the case was described in which the shift amounts of the read voltages corresponding to the page, on which the shift read operation was executed, are calculated. However, this is not restrictive. For example, after calculating the shift amounts of the read voltages corresponding to the page on which the shift read operation was executed, shift amounts of read voltages corresponding to another page may be estimated based on the calculated shift amounts.

In the description below, a description of the same configuration and operation as in the fifth embodiment is omitted, and a different configuration and operation from the fifth embodiment will mainly be described.

Figure 34:
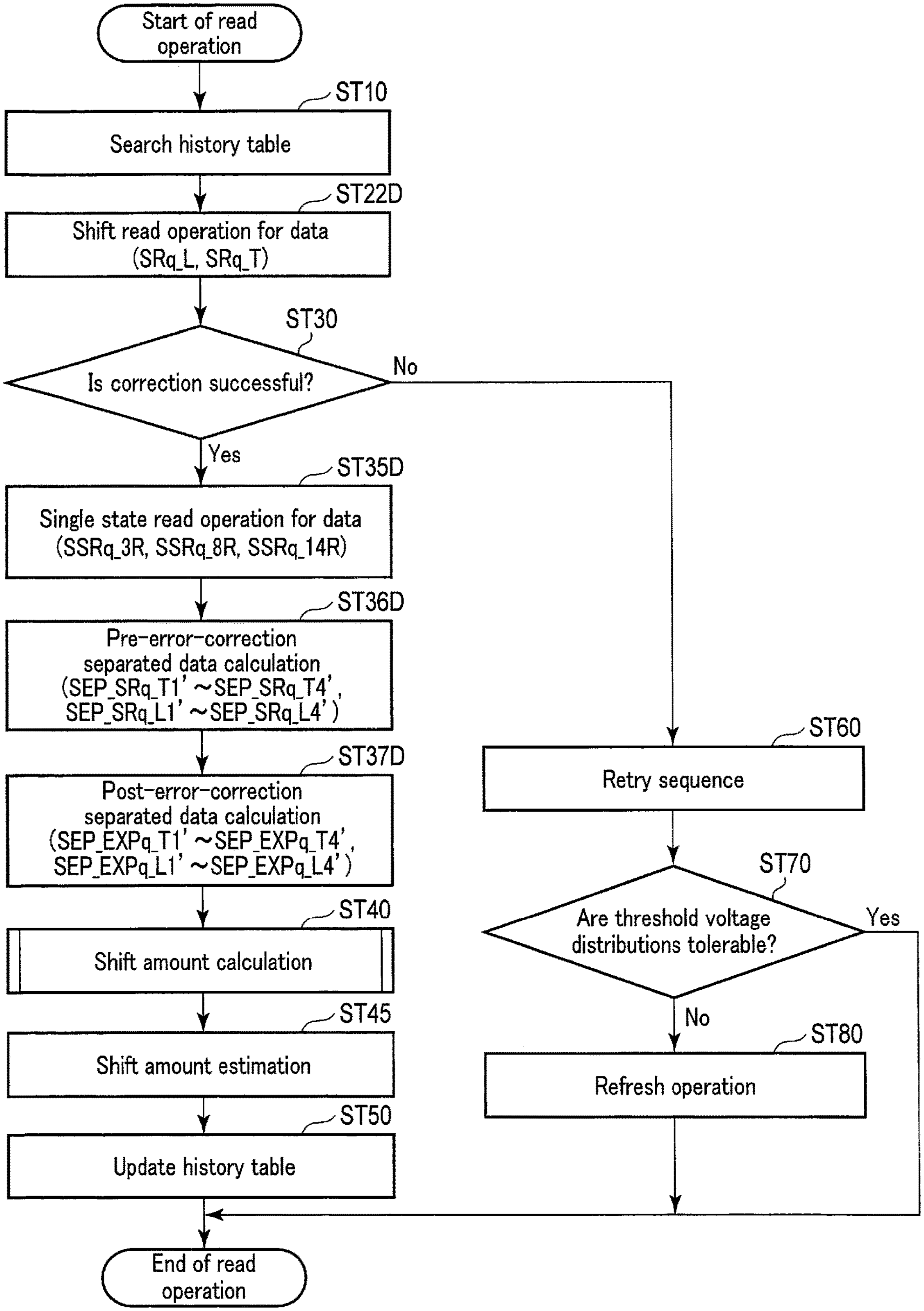
FIG. 34 is a flowchart of lower page and top page read operations which include a shift amount calculation and an estimation in a memory system according to a sixth embodiment.

6.1 Lower Page and Top Page Read Operations Including the Shift Amount Calculation and Estimation In a sixth embodiment, referring to a flowchart of FIG. 34, a description is given of, by way of example, an operation at a time of executing the shift amount calculation in the case of reading a lower page and a top page of four pages by the random read operation. FIG. 34 corresponds to FIG. 30 in the fifth embodiment. In FIG. 34, step ST22D is executed in place of step ST22C, and steps ST35D to ST37D are executed in place of steps ST35C to ST37C. Furthermore, step ST45 is executed between step ST40 and step ST50.

As illustrated in FIG. 34, in step ST10, the memory controller 100 searches the history table in the RAM 120, and grasps the shift amounts Δ of the respective read operations corresponding to the pages of the read target. In the example of FIG. 34, the read operations corresponding to the pages of the read target are read operations 1R, 4R, 6R and 11R corresponding to the lower page, and read operations 5R, 10R, 12R and 15R corresponding to the top page.

In step ST22D, the memory controller 100 issues a shift read command, based on the shift amounts Δ which were grasped in step ST10. Thereby, the chip Chip reads pre-error-correction lower read data SRq_L and pre-error-correction top read data SRq_T by read voltages to which the shift amounts of the history table are applied, and outputs the pre-error-correction lower read data SRq_L and pre-error-correction top read data SRq_T to the memory controller 100. In the memory controller 100, the pre-error-correction lower read data SRq_L and pre-error-correction top read data SRq_T is transferred to the ECC circuit 160, and is stored in the buffer memory 181 for read voltage correction.

In step ST30, the ECC circuit 160 executes an error correction process on the pre-error-correction lower read data SRq_L and pre-error-correction top read data SRq_T. When the error correction process by the ECC circuit 160 was successful (step ST30; yes), the ECC circuit 160 stores post-error-correction lower read data EXPq_L and post-error-correction top read data EXPq_T in the buffer memory 181 for read voltage correction. Then, the process advances to step ST35D. On the other hand, when the error correction process by the ECC circuit 160 failed (step ST30; no), the process advances to step ST60. Since the process of steps ST60 to ST80 is the same as in the case of FIG. 30, a description thereof is omitted.

In step ST35D, the memory controller 100 issues a single state read command using the voltages VS3, VS8 and VS14 as read voltages. Thereby, the chip Chip reads single state read data SSRq_3R, SSRq_8R and SSRq_14R and outputs the single state read data SSRq_3R, SSRq_8R and SSRq_14R to the memory controller 100. The single state read data SSRq_3R, SSRq_8R and SSRq_14R is stored in the buffer memory 181 for read voltage correction in the memory controller 100.

In step ST36D, the separated data generation circuit 186 generates pre-error-correction separated data SEP_SRq_L1', SEP_SRq_T1', SEP_SRq_L2', SEP_SRq_T2', SEP_SRq_L3', SEP_SRq_T3', SEP_SRq_L4', and SEP_SRq_T4', based on the pre-error-correction lower read data SRq_L and pre-error-correction top read data SRq_T, and single state read data SSRq_3R, SSRq_8R and SSRq_14R, which are read from the buffer memory 181 for read voltage correction. Specifically, the separated data generation circuit 186 extracts, from the pre-error-correction lower read data SRq_L and pre-error-correction top read data SRq_T, bits corresponding to data "1" of the single state read data SSRq_3R as the pre-error-correction separated data SEP_SRq_L1' and SEP_SRq_T1'. The separated data generation circuit 186 extracts, from the pre-error-correction lower read data SRq_L and pre-error-correction top read data SRq_T, bits corresponding to data "0" of the single state read data SSRq_3R and corresponding to data "1" of the single state read data SSRq_8R as the pre-error-correction separated data SEP_SRq_L2' and SEP_SRq_T2'. The separated data generation circuit 186 extracts, from the pre-error-correction lower read data SRq_L and pre-error-correction top read data SRq_T, bits corresponding to data "0" of the single state read data SSRq_8R and corresponding to data "1" of the single state read data SSRq_14R as the pre-error-correction separated data SEP_SRq_L3' and SEP_SRq_T3'. The separated data generation circuit 186 extracts, from the pre-error-correction lower read data SRq_L and pre-error-correction top read data SRq_T, bits corresponding to data "0" of the single state read data SSRq_14R as the pre-error-correction separated data SEP_SRq_L4' and SEP_SRq_T4'. The extracted pre-error-correction separated data SEP_SRq_L1' to SEP_SRq_L4' and SEP_SRq_T1' to SEP_SRq_T4' are sent to the bit counter 182.

In step ST37D, the separated data generation circuit 186 generates post-error-correction separated data SEP_EXPq_L1', SEP_EXPq_T1', SEP_EXPq_L2', SEP_EXPq_T2', SEP_EXPq_L3', SEP_EXPq_T3', SEP_EXPq_L4', and SEP_EXPq_T4', based on the post-error-correction lower read data EXPq_L and post-error-correction top read data EXPq_T, and single state read data SSRq_3R, SSRq_8R and SSRq_14R, which are read from the buffer memory 181 for read voltage correction. Specifically, the separated data generation circuit 186 extracts, from the post-error-correction lower read data EXPq_L and post-error-correction top read data EXPq_T, bits corresponding to data "1" of the single state read data SSRq_3R as the post-error-correction separated data SEP_EXPq_L1' and SEP_EXPq_T1'. The separated data generation circuit 186 extracts, from the post-error-correction lower read data EXPq_L and post-error-correction top read data EXPq_T, bits corresponding to data "0" of the single state read data SSRq_3R and corresponding to data "1" of the single state read data SSRq_8R as the post-error-correction separated data SEP_EXPq_L2' and SEP_EXPq_T2'. The separated data generation circuit 186 extracts, from the post-error-correction lower read data EXPq_L and post-error-correction top read data EXPq_T, bits corresponding to data "0" of the single state read data SSRq_8R and corresponding to data "1" of the single state read data SSRq_14R as the post-error-correction separated data SEP_EXPq_L3' and SEP_EXPq_T3'. The separated data generation circuit 186 extracts, from the post-error-correction lower read data EXPq_L and post-error-correction top read data EXPq_T, bits corresponding to data "0" of the single state read data SSRq_14R as the post-error-correction separated data SEP_EXPq_L4' and SEP_EXPq_T4'. The extracted post-error-correction separated data SEP_EXPq_L1' to SEP_EXPq_L4', and SEP_EXPq_T1' to SEP_EXPq_T4' are sent to the bit counter 182.

In step ST40, the read voltage correction circuit 180 executes a shift amount calculation, based on the pre-error-correction separated data SEP_SRq_L1' to SEP_SRq_L4', and SEP_SRq_T1' to SEP_SRq_T4', and the post-error-correction separated data SEP_EXPq_L1' to SEP_EXPq_L4', and SEP_EXPq_T1' to SEP_EXPq_T4'. Specifically, the read voltage correction circuit 180 calculates the shift amounts Δ of the read voltages VS1, VS4, VS6 and VS11 corresponding to the lower page and the read voltages VS5, VS10, VS12 and VS15 corresponding to the top page. The details of the shift amount calculation will be described later.

In step ST45, the read voltage correction circuit 180 estimates, based on the shift amounts Δ calculated in step ST40, shift amounts Δ of the read voltages VS3, VS7, VS9 and VS13 corresponding to the middle page and the read voltages VS2, VS8 and VS14 corresponding to the upper page. The details of the shift amount estimation will be described later.

In step ST50, the memory controller 100 updates the history table by storing the shift amounts Δ calculated in step ST40 and estimated in step ST45 in a corresponding area in the history table of the RAM 120.

Then, the read operation ends.

Figure 35:
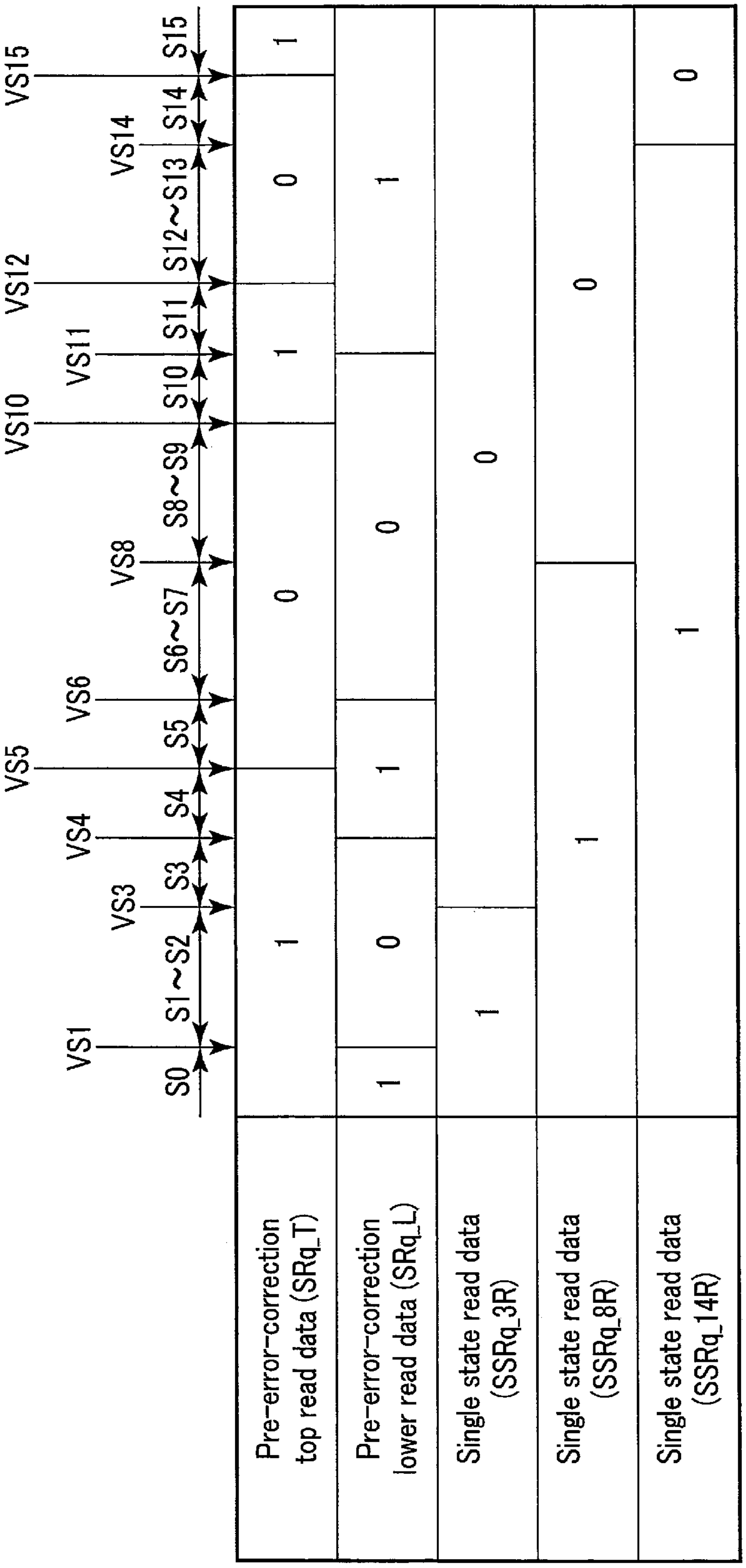
FIG. 35 schematically illustrates a process of the shift amount calculation the lower page and top page read operations in the memory system according to the sixth embodiment.

6.2 Shift Amount Calculation Based on the Lower Page and Top Page Read Operations FIG. 35, FIG. 36, FIG. 37, FIG. 38 and FIG. 39 are schematic diagrams for describing the shift amount calculation based on the lower page and top page read operation in the memory system according to the six embodiment. FIG. 35 illustrates data which is read by the shift read operation and single state read operation. FIG. 36 to FIG. 39 illustrate a process up to the selection of count values of the estimation index calculation target in the shift amount calculation, with respect to the read operation 1R, read operations 4R, 5R and 6R, read operations 10R, 11R and 12R, and read operation 15R.

As illustrated in FIG. 35, the set of the pre-error-correction lower read data SRq_L and pre-error-correction top read data SRq_T classifies the threshold voltage distributions of the memory cell transistors MT in the cell unit CU into four groups. Specifically, the set of data (SRq_T and SRq_L) becomes (1, 1) when the threshold voltage is less than the voltage VS1, or is not less than the voltage VS4 and is less than the voltage VS5, or is not less than the voltage VS11 and is less than the voltage VS12, or is not less than the voltage VS15, and the corresponding memory cell transistors MT are regarded as belonging to the threshold voltage distribution of the "S0" state, "S4" state, "S11" state, or the "S15" state. The set of data (SRq_T and SRq_L) becomes (1, 0) when the threshold voltage is not less than the voltage VS1 and is less than the voltage VS4, or is not less than the voltage VS10 and is less than the voltage VS11, and the corresponding memory cell transistors MT are regarded as belonging to the threshold voltage distributions of the "S1" state to "S3" state, or "S10" state. The set of data (SRq_T and SRq_L) becomes (0, 0) when the threshold voltage is not less than the voltage VS6 and is less than the voltage VS10, and the corresponding memory cell transistors MT are regarded as belonging to the threshold voltage distributions of the "S6" state to "S9" state. The set of data (SRq_T and SRq_L) becomes (0, 1) when the threshold voltage is not less than the voltage VS5 and is less than the voltage VS6, or is not less than the voltage VS12 and is less than the voltage VS15, and the corresponding memory cell transistors MT are regarded as belonging to the threshold voltage distribution of the "S5" state, or "S12 state to "S14" state.

The single state read data SSRq_3R becomes data "1" when the threshold voltage is less than the voltage VS3, and the corresponding memory cell transistors MT are regarded as belonging to the threshold voltage distributions of the "S0" state to "S2" state. In addition, the single state read data SSRq_3R becomes data "0" when the threshold voltage is not less than the voltage VS3, and the corresponding memory cell transistors MT are regarded as belonging to the threshold voltage distributions of the "S3" state to "S15" state.

The single state read data SSRq_8R becomes data "1" when the threshold voltage is less than the voltage VS8, and the corresponding memory cell transistors MT are regarded as belonging to the threshold voltage distributions of the "S0" state to "S7" state. In addition, the single state read data SSRq_8R becomes data "0" when the threshold voltage is not less than the voltage VS8, and the corresponding memory cell transistors MT are regarded as belonging to the threshold voltage distributions of the "S8" state to "S15" state.

The single state read data SSRq_14R becomes data "1" when the threshold voltage is less than the voltage VS14, and the corresponding memory cell transistors MT are regarded as belonging to the threshold voltage distributions of the "S0" state to "S13" state. In addition, the single state read data SSRq_14R becomes data "0" when the threshold voltage is not less than the voltage VS14, and the corresponding memory cell transistors MT are regarded as belonging to the threshold voltage distributions of the "S14" state to "S15" state.

Figure 36:
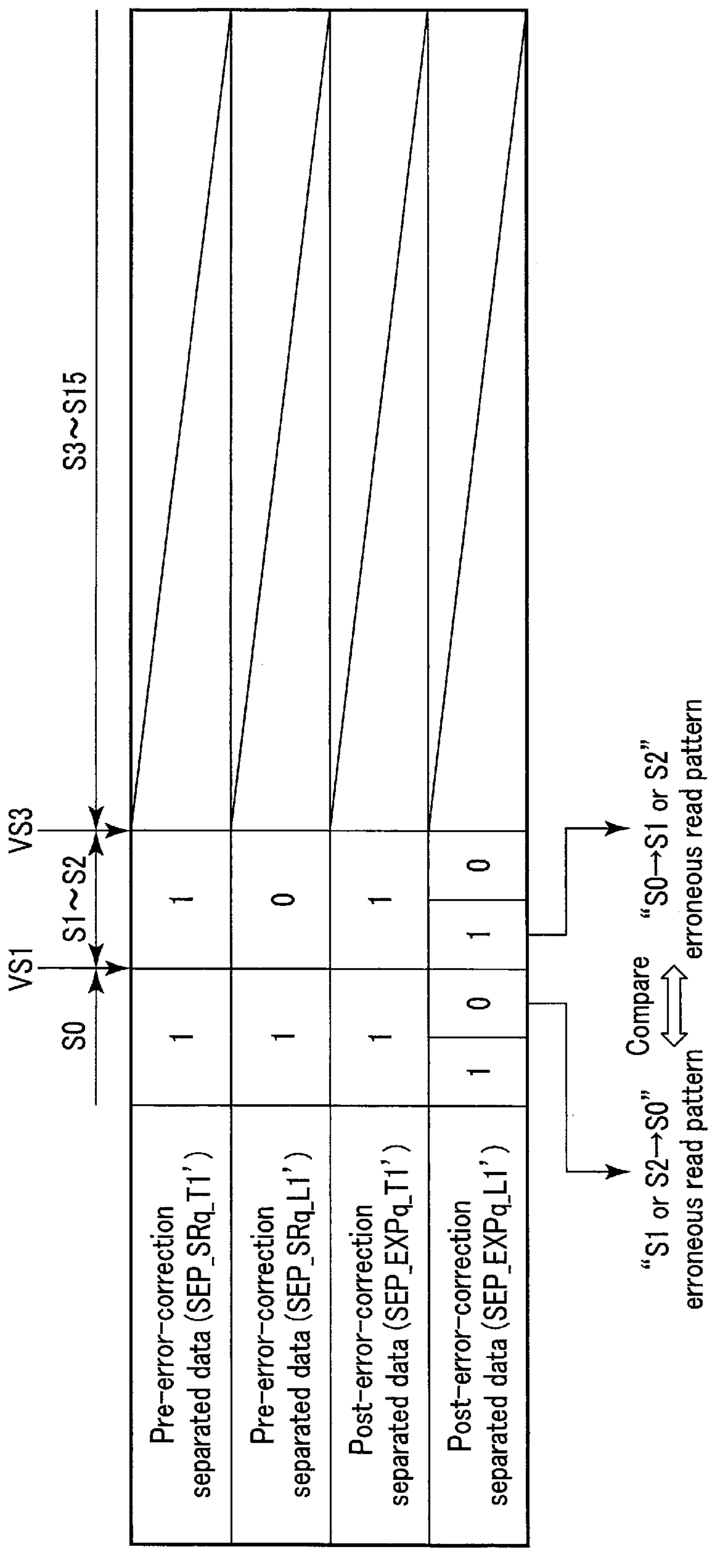
FIG. 36 schematically illustrates the process of the shift amount calculation in the lower page and top page read operations in the memory system according to the sixth embodiment.

Thus, as illustrated in FIG. 36, the set of pre-error-correction separated data SEP_SRq_T1' and SEP_SRq_L1' classifies the memory cell transistors MT, which were regarded as belonging to the threshold voltage distributions of the "S0" state to "S2" state, into two groups. Specifically, the set of data (SEP_SRq_T1' and SEP_SRq_L1') becomes (1, 1) when the threshold voltage is less than the voltage VS1, and the corresponding memory cell transistors are regarded as belonging to the threshold voltage distribution of the "S0" state. The set of data (SEP_SRq_T1' and SEP_SRq_L1') becomes (1, 0) when the threshold voltage is not less than the voltage VS1, and the corresponding memory cell transistors are regarded as belonging to the threshold voltage distribution of the "S1" state or "S2" state.

Figure 37:
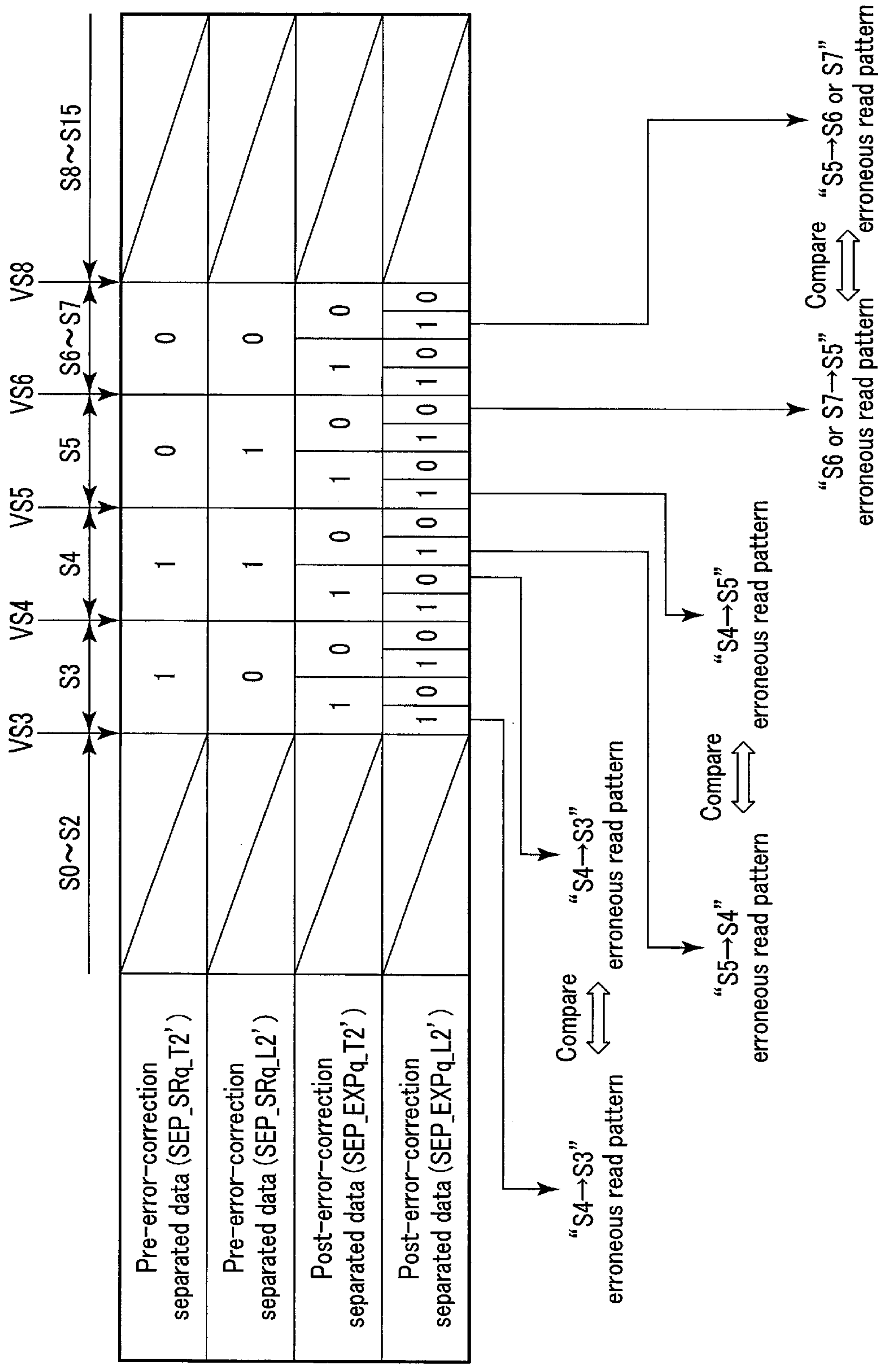
FIG. 37 schematically illustrates the process of the shift amount calculation in the lower page and top page read operations in the memory system according to the sixth embodiment.

In addition, as illustrated in FIG. 37, the set of pre-error-correction separated data SEP_SRq_T2' and SEP_SRq_L2' classifies the memory cell transistors MT, which were regarded as belonging to the threshold voltage distributions of the "S3" state to "S7" state, into four groups. Specifically, the set of data (SEP_SRq_T2' and SEP_SRq_L2') becomes (1, 0) when the threshold voltage is not less than the voltage VS3 and is less than the voltage VS4, and the corresponding memory cell transistors are regarded as belonging to the threshold voltage distribution of the "S3" state. The set of data (SEP_SRq_T2' and SEP_SRq_L2') becomes (1, 1) when the threshold voltage is not less than the voltage VS4 and is less than the voltage VS5, and the corresponding memory cell transistors are regarded as belonging to the threshold voltage distribution of the "S4" state. The set of data (SEP_SRq_T2' and SEP_SRq_L2') becomes (0, 1) when the threshold voltage is not less than the voltage VS5 and is less than the voltage VS6, and the corresponding memory cell transistors are regarded as belonging to the threshold voltage distribution of the "S5" state. The set of data (SEP_SRq_T2' and SEP_SRq_L2') becomes (0, 0) when the threshold voltage is not less than the voltage VS6 and is less than the voltage VS8, and the corresponding memory cell transistors are regarded as belonging to the threshold voltage distributions of the "S6" to "S7" state.

Figure 38:
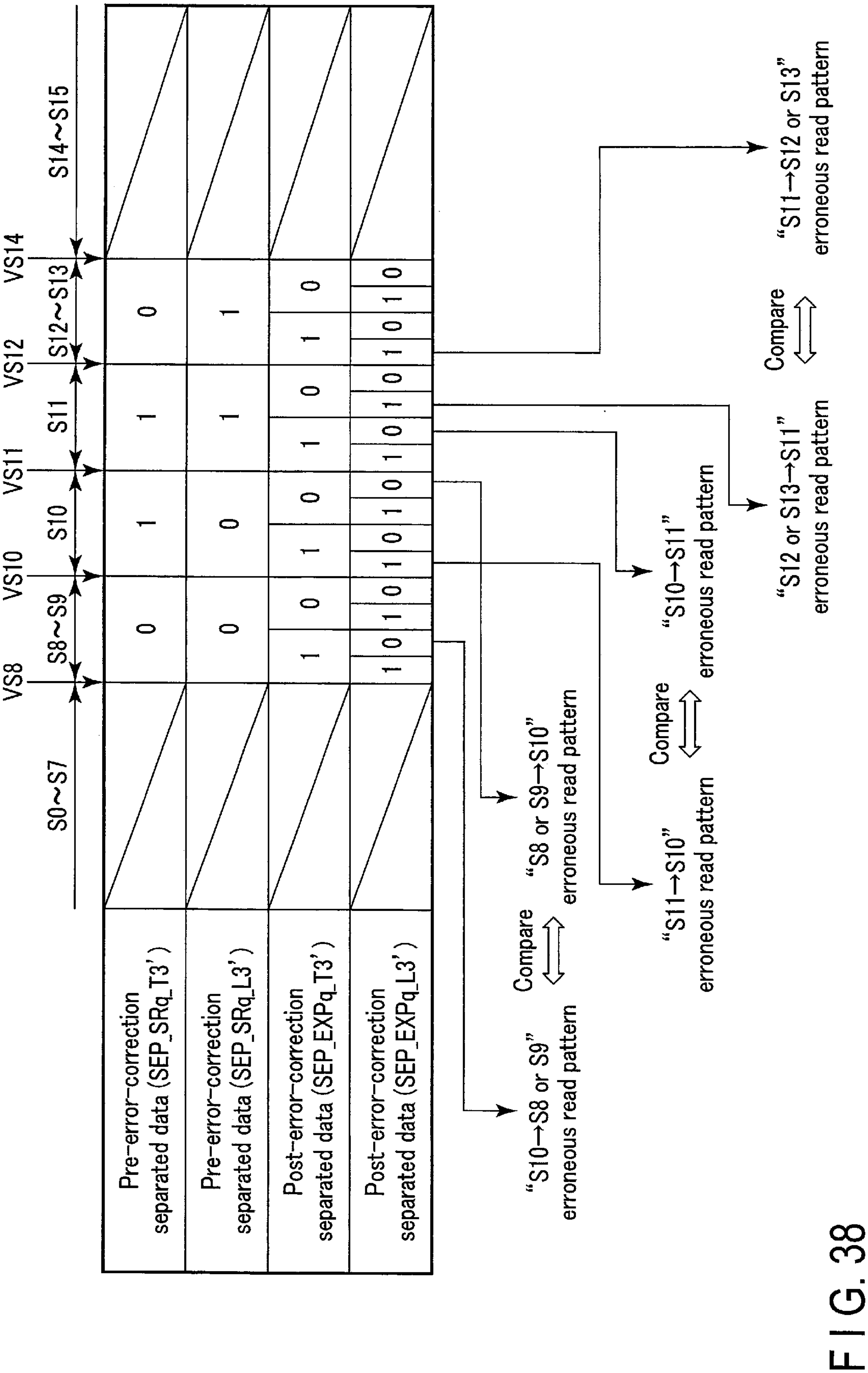
FIG. 38 schematically illustrates the process of the shift amount calculation in the lower page and top page read operations in the memory system according to the sixth embodiment.

Besides, as illustrated in FIG. 38, the set of pre-error-correction separated data SEP_SRq_T3' and SEP_SRq_L3' classifies the memory cell transistors MT, which were regarded as belonging to the threshold voltage distributions of the "S8" state to "S13" state, into four groups. Specifically, the set of data (SEP_SRq_T3' and SEP_SRq_L3') becomes (0, 0) when the threshold voltage is not less than the voltage VS8 and is less than the voltage VS10, and the corresponding memory cell transistors are regarded as belonging to the threshold voltage distribution of the "S8" state or "S9" state. The set of data (SEP_SRq_T3' and SEP_SRq_L3') becomes (1, 0) when the threshold voltage is not less than the voltage VS10 and is less than the voltage VS11, and the corresponding memory cell transistors are regarded as belonging to the threshold voltage distribution of the "S10" state. The set of data (SEP_SRq_T3' and SEP_SRq_L3') becomes (1, 1) when the threshold voltage is not less than the voltage VS11 and is less than the voltage VS12, and the corresponding memory cell transistors are regarded as belonging to the threshold voltage distribution of the "S11" state. The set of data (SEP_SRq_T3' and SEP_SRq_L3') becomes (0, 1) when the threshold voltage is not less than the voltage VS12 and is less than the voltage VS14, and the corresponding memory cell transistors are regarded as belonging to the threshold voltage distribution of the "S12" state or "S13" state.

Figure 39:
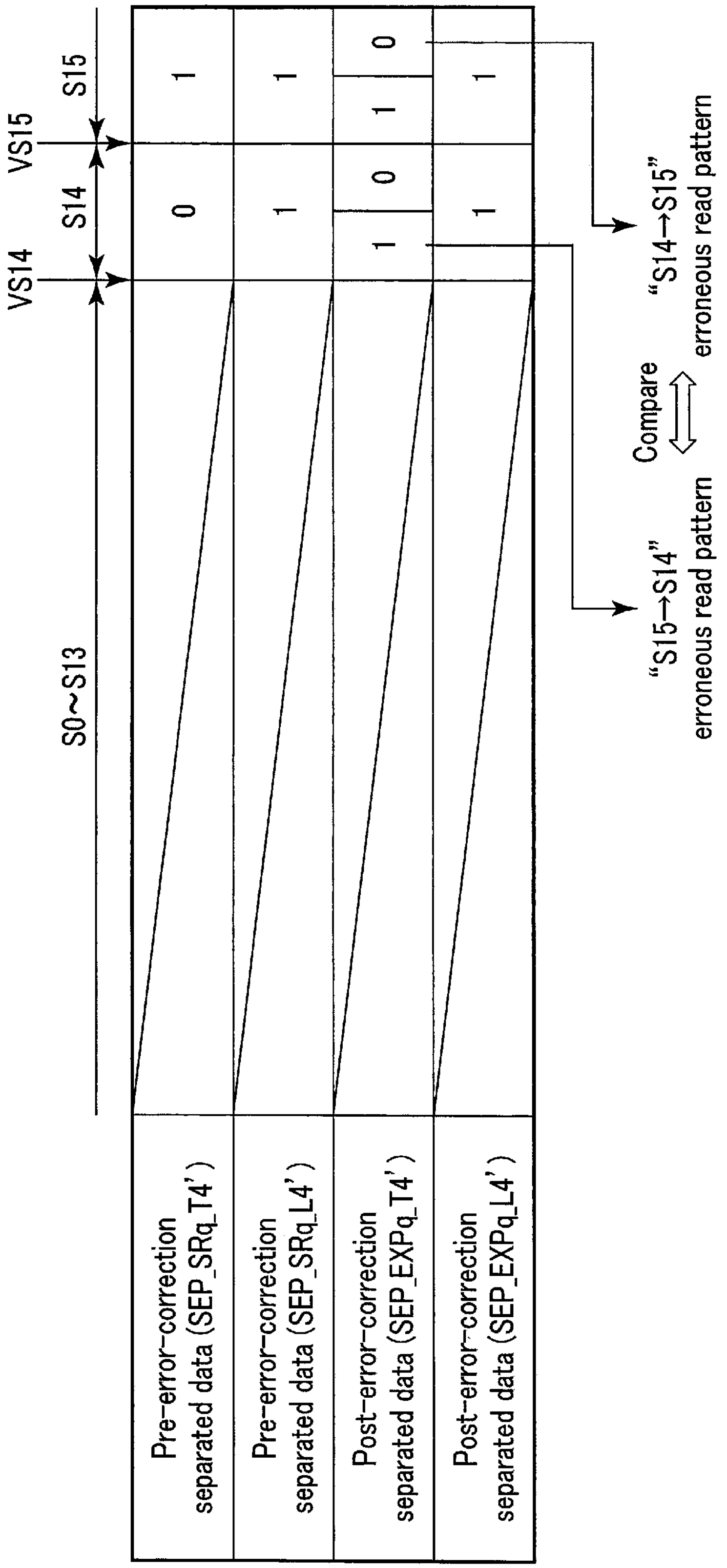
FIG. 39 schematically illustrates the process of the shift amount calculation in the lower page and top page read operations in the memory system according to the sixth embodiment.

Furthermore, as illustrated in FIG. 39, the set of pre-error-correction separated data SEP_SRq_T4' and SEP_SRq_L4' classifies the memory cell transistors MT, which were regarded as belonging to the threshold voltage distributions of the "S14" state to "S15" state, into two groups. Specifically, the set of data (SEP_SRq_T4' and SEP_SRq_L4') becomes (0, 1) when the threshold voltage is less than the voltage VS15, and the corresponding memory cell transistors are regarded as belonging to the threshold voltage distribution of the "S14" state. The set of data (SEP_SRq_T4' and SEP_SRq_L4') becomes (1, 1) when the threshold voltage is not less than the voltage VS15, and the corresponding memory cell transistors are regarded as belonging to the threshold voltage distribution of the "S15" state.

On the other hand, as illustrated in FIG. 36 to FIG. 39, each set of post-error-correction separated data (SEP_EXPq_Tj' and SEP_EXPq_Lj') classifies the memory cell transistors MT into four groups, without depending on the classification by the pre-error-correction separated data SEP_SRq_Tj' to SEP_SRq_Lj' (1≤j≤4). Specifically, the memory cell transistors MT, in which the set of data (SEP_EXPq_Tj' and SEP_EXPq_Lj') becomes (1, 1), are expected to belong to the threshold voltage distribution of the "S0" state, "S4" state, "S11" state, or "S15" state. The memory cell transistors MT, in which the set of data (SEP_EXPq_Tj' and SEP_EXPq_Lj') becomes (1, 0), are expected to belong to the threshold voltage distributions of the "S1" state to "S3" state, or "S10" state. The memory cell transistors MT, in which the set of data (SEP_EXPq_Tj' and SEP_EXPq_Lj') becomes (0, 0), are expected to belong to the threshold voltage distributions of the "S6" state to "S9" state. The memory cell transistors MT, in which the set of data (SEP_EXPq_Tj' and SEP_EXPq_Lj') becomes (0, 1), are expected to belong to the threshold voltage distribution of the "S5" state, or "S12" state to "S14" state.

As described above, the set of data (SEP_EXPq_T1' and SEP_EXPq_L1') is a set of memory cell transistors MT which are regarded as belonging to the threshold voltage distributions of the "S0" state to "S2" state, the set of data (SEP_EXPq_T2' and SEP_EXPq_L2') is a set of memory cell transistors MT which are regarded as belonging to the threshold voltage distributions of the "S3" state to "S7" state, the set of data (SEP_EXPq_T3' and SEP_EXPq_L3') is a set of memory cell transistors MT which are regarded as belonging to the threshold voltage distributions of the "S8" state to "S13" state, and the set of data (SEP_EXPq_T4' and SEP_EXPq_L4') is a set of memory cell transistors MT which are regarded as belonging to the threshold voltage distribution of the "S14" state or "S15" state.

Thus, the memory cell transistors MT, in which the set of data (SEP_EXPq_T1' and SEP_EXPq_L1')=(1, 1), are expected to belong to the threshold voltage distribution of the "S0" state, and the memory cell transistors MT, in which the set of (SEP_EXPq_T1' and SEP_EXPq_L1')=(1, 0), are expected to belong to the threshold voltage distribution of the "S1" state or "S2" state. It can be considered that there is substantially no memory cell transistor MT in which the set of data (SEP_EXPq_T1' and SEP_EXPq_L1')=(0, 0) or (0, 1).

In addition, the memory cell transistors MT, in which the set of data (SEP_EXPq_T2' and SEP_EXPq_L2')=(1, 1), are expected to belong to the threshold voltage distribution of the "S4" state, the memory cell transistors MT, in which the set of (SEP_EXPq_T2' and SEP_EXPq_L2')=(1, 0), are expected to belong to the threshold voltage distribution of the "S3" state, the memory cell transistors MT, in which the set of (SEP_EXPq_T2' and SEP_EXPq_L2')=(0, 0), are expected to belong to the threshold voltage distribution of the "S6" state or "S7" state, and the memory cell transistors MT, in which the set of (SEP_EXPq_T2' and SEP_EXPq_L2')=(0, 1), are expected to belong to the threshold voltage distribution of the "S5" state.

Further, the memory cell transistors MT, in which the set of data (SEP_EXPq_T3' and SEP_EXPq_L3')=(1, 1), are expected to belong to the threshold voltage distribution of the "S11" state, the memory cell transistors MT, in which the set of (SEP_EXPq_T3' and SEP_EXPq_L3')=(1, 0), are expected to belong to the threshold voltage distribution of the "S10" state, the memory cell transistors MT, in which the set of (SEP_EXPq_T3' and SEP_EXPq_L3')=(0, 0), are expected to belong to the threshold voltage distribution of the "S8" state or "S9" state, and the memory cell transistors MT, in which the set of (SEP_EXPq_T3' and SEP_EXPq_L3')=(0, 1), are expected to belong to the threshold voltage distribution of the "S12" state or "S13" state.

Besides, the memory cell transistors MT, in which the set of data (SEP_EXPq_T4' and SEP_EXPq_L4')=(1, 1), are expected to belong to the threshold voltage distribution of the "S15" state, and the memory cell transistors MT, in which the set of (SEP_EXPq_T4' and SEP_EXPq_L4')=(0, 1), are expected to belong to the threshold voltage distribution of the "S14" state. It can be considered that there is substantially no memory cell transistor MT in which the set of data (SEP_EXPq_T4' and SEP_EXPq_L4')=(1, 0) or (0, 0).

Thus, the number of combinations of values, C5_TL1=(SEP_SRq_T1', SEP_SRq_L1', SEP_EXPq_T1', SEP_EXPq_L1'), which the pre-error-correction separated data SEP_SRq_L1' and SEP_SRq_T1', and post-error-correction separated data SEP_EXPq_L1' and SEP_EXPq_T1' can take, is 2×2=4. The number of combinations of values, C5_TL2=(SEP_SRq_T2', SEP_SRq_L2', SEP_EXPq_T2', SEP_EXPq_L2'), which the pre-error-correction separated data SEP_SRq_L2' and SEP_SRq_T2', and post-error-correction separated data SEP_EXPq_L2' and SEP_EXPq_T2' can take, is 4×4=16. The number of combinations of values, C5_TL3=(SEP_SRq_T3', SEP_SRq_L3', SEP_EXPq_T3', SEP_EXPq_L3'), which the pre-error-correction separated data SEP_SRq_L3' and SEP_SRq_T3', and post-error-correction separated data SEP_EXPq_L3' and SEP_EXPq_T3' can take, is 4×4=16. The number of combinations of values, C5_TL4=(SEP_SRq_T4', SEP_SRq_L4', SEP_EXPq_T4', SEP_EXPq_L4'), which the pre-error-correction separated data SEP_SRq_L4' and SEP_SRq_T4', and post-error-correction separated data SEP_EXPq_L4' and SEP_EXPq_T4' can take, is 2×2=4. The bit counter 182 counts the number of bits with respect to each of the combinations C5_TL1 to C5_TL4 (i.e. each of the 40 combinations).

In the example of FIG. 36, the bit selector 183 selects one set of two combinations, i.e. combinations C5_TL1=(1, 1, 1, 0) and (1, 0, 1, 1), from the four combinations C5_TL1. The combination C5_TL1=(1, 1, 1, 0) indicates that data of the “S0” state is erroneously read from the memory cell transistor MT which stores data of the “S1” state or “S2” state. The combination C5_TL1=(1, 0, 1, 1) indicates that data of the “S1” state or “S2” state is erroneously read from the memory cell transistor MT which stores data of the “S0” state. The combination C5_TL1=(1, 1, 1, 0) corresponds to the “S1 or S2→S0” erroneous read pattern, and the combination C5_TL1=(1, 0, 1, 1) corresponds to the “S0→S1 or S2” erroneous read pattern.

Among the number of fail bits corresponding to the “S1 or S2→S0” erroneous read pattern, the number of fail bits corresponding to the “S1→S0” erroneous read pattern can be regarded as being significantly greater than the number of fail bits corresponding to the “S2→S0” erroneous read pattern. Thus, the counted number of fail bits corresponding to the combination C5_TL1=(1, 1, 1, 0) can be regarded as being substantially equal to the number of fail bits corresponding to the “S1→S0” erroneous read pattern. Similarly, among the number of fail bits corresponding to the “S0→S1 or S2” erroneous read pattern, the number of fail bits corresponding to the “S0 S1” erroneous read pattern can be regarded as being significantly greater than the number of fail bits corresponding to the “S0→S2” erroneous read pattern. Thus, the counted number of fail bits corresponding to the combination C5_TL1=(1, 0, 1, 1) can be regarded as being substantially equal to the number of fail bits corresponding to the “S0→S1” erroneous read pattern.

In the example of FIG. 37, the bit selector 183 selects three sets from the 16 combinations C5_TL2, namely one set of two combinations, i.e. combinations C5_TL2=(1, 0, 1, 1) and (1, 1, 1, 0), another set of two combinations, i.e. combinations C5_TL2=(1, 1, 0, 1) and (0, 1, 1, 1), and the other set of two combinations, i.e. combinations C5_TL2=(0, 1, 0, 0) and (0, 0, 0, 1).

The combination C5_TL2=(1, 0, 1, 1) indicates that data of the “S3” state is erroneously read from the memory cell transistor MT which stores data of the “S4” state. The combination C5_TL2=(1, 1, 1, 0) indicates that data of the “S4” state is erroneously read from the memory cell transistor MT which stores data of the “S3” state. Thus, the counted number of fail bits corresponding to the combination C5_TL2=(1, 0, 1, 1) becomes equal to the number of fail bits corresponding to the “S4→S3” erroneous read pattern, and the counted number of fail bits corresponding to the combination C5_TL2=(1, 1, 1, 0) becomes equal to the number of fail bits corresponding to the “S3→S4” erroneous read pattern.

The combination C5_TL2=(1, 1, 0, 1) indicates that data of the “S4” state is erroneously read from the memory cell transistor MT which stores data of the “S5” state. The combination C5_TL2=(0, 1, 1, 1) indicates that data of the “S5” state is erroneously read from the memory cell transistor MT which stores data of the “S4” state. Thus, the counted number of fail bits corresponding to the combination C5_TL2=(1, 1, 0, 1) becomes equal to the number of fail bits corresponding to the “S5→S4” erroneous read pattern, and the counted number of fail bits corresponding to the combination C5_TL2=(0, 1, 1, 1) becomes equal to the number of fail bits corresponding to the “S4→S5” erroneous read pattern.

The combination C5_TL2=(0, 1, 0, 0) indicates that data of the “S5” state is erroneously read from the memory cell transistor MT which stores data of the “S6” state or “S7” state. The combination C5_TL2=(0, 0, 0, 1) indicates that data of the “S6” state or “S7” state is erroneously read from the memory cell transistor MT which stores data of the “S5” state. The combination C5_TL2=(0, 1, 0, 0) corresponds to the “S6 or S7→S5” erroneous read pattern, and the combination C5_TL2=(0, 0, 0, 1) corresponds to the “S5→S6 or S7” erroneous read pattern.

Among the number of fail bits corresponding to the “S6 or S7→S5” erroneous read pattern, the number of fail bits corresponding to the “S6→S5” erroneous read pattern can be regarded as being significantly greater than the number of fail bits corresponding to the “S7→S5” erroneous read pattern. Thus, the counted number of fail bits corresponding to the combination C5_TL2=(0, 1, 0, 0) can be regarded as being substantially equal to the number of fail bits corresponding to the “S6→S5” erroneous read pattern. Similarly, among the number of fail bits corresponding to the “S5→S6 or S7” erroneous read pattern, the number of fail bits corresponding to the “S5→S6” erroneous read pattern can be regarded as being significantly greater than the number of fail bits corresponding to the “S5→S7” erroneous read pattern. Thus, the counted number of fail bits corresponding to the combination C5_TL2=(0, 0, 0, 1) can be regarded as being substantially equal to the number of fail bits corresponding to the “S5→S6” erroneous read pattern.

In the example of FIG. 38, the bit selector 183 selects three sets from the 16 combinations C5_TL3, namely one set of two combinations, i.e. combinations C5_TL3=(0, 0, 1, 0) and (1, 0, 0, 0), another set of two combinations, i.e. combinations C5_TL3=(1, 0, 1, 1) and (1, 1, 1, 0), and the other set of two combinations, i.e. combinations C5_TL3=(1, 1, 0, 1) and (0, 1, 1, 1).

The combination C5_TL3=(0, 0, 1, 0) indicates that data of the “S8” state or “S9” state is erroneously read from the memory cell transistor MT which stores data of the “S10” state. The combination C5_TL3=(1, 0, 0, 0) indicates that data of the “S10” state is erroneously read from the memory cell transistor MT which stores data of the “S8” state or “S9” state. The combination C5_TL3=(0, 0, 1, 0) corresponds to the “S10→S8 or S9” erroneous read pattern, and the combination C5_TL3=(1, 0, 0, 0) corresponds to the "S8 or S9→S10" erroneous read pattern.

Among the number of fail bits corresponding to the "S10→S8 or S9" erroneous read pattern, the number of fail bits corresponding to the "S10→S9" erroneous read pattern can be regarded as being significantly greater than the number of fail bits corresponding to the "S10→S8" erroneous read pattern. Thus, the counted number of fail bits corresponding to the combination C5_TL3=(0, 0, 1, 0) can be regarded as being substantially equal to the number of fail bits corresponding to the "S10→S9" erroneous read pattern. Similarly, among the number of fail bits corresponding to the "S8 or S9→S10" erroneous read pattern, the number of fail bits corresponding to the "S9 S10" erroneous read pattern can be regarded as being significantly greater than the number of fail bits corresponding to the "S8→S10" erroneous read pattern. Thus, the counted number of fail bits corresponding to the combination C5_TL3=(1, 0, 0, 0) can be regarded as being substantially equal to the number of fail bits corresponding to the "S9→S10" erroneous read pattern.

The combination C5_TL3=(1, 0, 1, 1) indicates that data of the "S10" state is erroneously read from the memory cell transistor MT which stores data of the "S11" state. The combination C5_TL3=(1, 1, 1, 0) indicates that data of the "S11" state is erroneously read from the memory cell transistor MT which stores data of the "S10" state. Thus, the counted number of fail bits corresponding to the case of the combination C5_TL3=(1, 0, 1, 1) becomes equal to the number of fail bits corresponding to the "S11→S10" erroneous read pattern, and the counted number of fail bits corresponding to the combination C5_TL3=(1, 1, 1, 0) becomes equal to the number of fail bits corresponding to the "S10→S11" erroneous read pattern.

The combination C5_TL3=(1, 1, 0, 1) indicates that data of the "S11" state is erroneously read from the memory cell transistor MT which stores data of the "S12" state or "S13" state. The combination C5_TL3=(0, 1, 1, 1) indicates that data of the "S12" state or "S13" state is erroneously read from the memory cell transistor MT which stores data of the "S11" state. The combination C5_TL3=(1, 1, 0, 1) corresponds to the "S12 or S13→S11" erroneous read pattern, and the combination C5_TL3=(0, 1, 1, 1) corresponds to the "S11→S12 or S13" erroneous read pattern.

Among the number of fail bits corresponding to the "S12 or S13→S11" erroneous read pattern, the number of fail bits corresponding to the "S12→S11" erroneous read pattern can be regarded as being significantly greater than the number of fail bits corresponding to the "S13→S11" erroneous read pattern. Thus, the counted number of fail bits corresponding to the combination C5_TL3=(1, 1, 0, 1) can be regarded as being substantially equal to the number of fail bits corresponding to the "S12→S11" erroneous read pattern. Similarly, among the number of fail bits corresponding to the "S11→S12 or S13" erroneous read pattern, the number of fail bits corresponding to the "S11 S12" erroneous read pattern can be regarded as being significantly greater than the number of fail bits corresponding to the "S11→S13" erroneous read pattern. Thus, the counted number of fail bits corresponding to the combination C5_TL3=(0, 1, 1, 1) can be regarded as being substantially equal to the number of fail bits corresponding to the "S11→S12" erroneous read pattern.

In the example of FIG. 39, the bit selector 183 selects one set of two combinations, i.e. combinations C5_TL4=(0, 1, 1, 1) and (1, 1, 0, 1) from the four combinations C5_TL4. The combination C5_TL4=(0, 1, 1, 1) indicates that data of the "S14" state is erroneously read from the memory cell transistor MT which stores data of the "S15" state. The combination C5_TL4=(1, 1, 0, 1) indicates that data of the "S15" state is erroneously read from the memory cell transistor MT which stores data of the "S14" state. Thus, the counted number of fail bits corresponding to the combination C5_TL4=(0, 1, 1, 1) becomes equal to the number of fail bits corresponding to the "S15→S14" erroneous read pattern, and the counted number of fail bits corresponding to the combination C5_TL4=(1, 1, 0, 1) becomes equal to the number of fail bits corresponding to the "S14→S15" erroneous read pattern.

By performing the above-described approximation, the bit selector 183 selects, as one set, the count value of the combination C5_TL1=(1, 1, 1, 0), which substantially corresponds to the "S1→S0" erroneous read pattern, and the count value of the combination C5_TL1=(1, 0, 1, 1), which substantially corresponds to the "S0→S1" erroneous read pattern, in the case of calculating the shift amount Δ for the reference voltage VS1.

The bit selector 183 selects, as one set, the count value of the combination C5_TL2=(1, 0, 1, 1), which substantially corresponds to the "S4→S3" erroneous read pattern, and the count value of the combination C5_TL2=(1, 1, 1, 0), which substantially corresponds to the "S3→S4" erroneous read pattern, in the case of calculating the shift amount Δ for the reference voltage VS4. The bit selector 183 selects, as one set, the count value of the combination C5_TL2=(1, 1, 0, 1), which substantially corresponds to the "S5→S4" erroneous read pattern, and the count value of the combination C5_TL2=(0, 1, 1, 1), which substantially corresponds to the "S4→S5" erroneous read pattern, in the case of calculating the shift amount Δ for the reference voltage VS5. The bit selector 183 selects, as one set, the count value of the combination C5_TL2=(0, 1, 0, 0), which substantially corresponds to the "S6→S5" erroneous read pattern, and the count value of the combination C5_TL2=(0, 0, 0, 1), which substantially corresponds to the "S5→S6" erroneous read pattern, in the case of calculating the shift amount Δ for the reference voltage VS6.

The bit selector 183 selects, as one set, the count value of the combination C5_TL3=(0, 0, 1, 0), which substantially corresponds to the "S10→S9" erroneous read pattern, and the count value of the combination C5_TL3=(1, 0, 0, 0), which substantially corresponds to the "S9 S10" erroneous read pattern, in the case of calculating the shift amount Δ for the reference voltage VS10. The bit selector 183 selects, as one set, the count value of the combination C5_TL3=(1, 0, 1, 1), which substantially corresponds to the "S11→S10" erroneous read pattern, and the count value of the combination C5_TL3=(1, 1, 1, 0), which substantially corresponds to the "S10→S11" erroneous read pattern, in the case of calculating the shift amount Δ for the reference voltage VS11. The bit selector 183 selects, as one set, the count value of the combination C5_TL3=(1, 1, 0, 1), which substantially corresponds to the "S12→S11" erroneous read pattern, and the count value of the combination C5_TL3=(0, 1, 1, 1), which substantially corresponds to the "S11→S12" erroneous read pattern, in the case of calculating the shift amount Δ for the reference voltage VS12.

The bit selector 183 selects, as one set, the count value of the combination C5_TL4=(0, 1, 1, 1), which substantially corresponds to the "S15→S14" erroneous read pattern, and the count value of the combination C5_TL4=(1, 1, 0, 1), which substantially corresponds to the "S14→S15" erroneous read pattern, in the case of calculating the shift amount Δ for the reference voltage VS15.

By operating as described above, the bit selector 183 can select, with respect to the read operations 1R, 4R to 6R, 10R to 12R, and 15R, the sets each including the two count values for use in the shift amount calculation.

By the above, the estimation index calculation circuit 184 can calculate eight kinds of estimation indices r with respect to the read operations 1R, 4R to 6R, 10R to 12R, and 15R, and the shift amount calculation circuit 185 can calculate the shift amounts Δ corresponding to the eight kinds of read operations.

Figure 40:
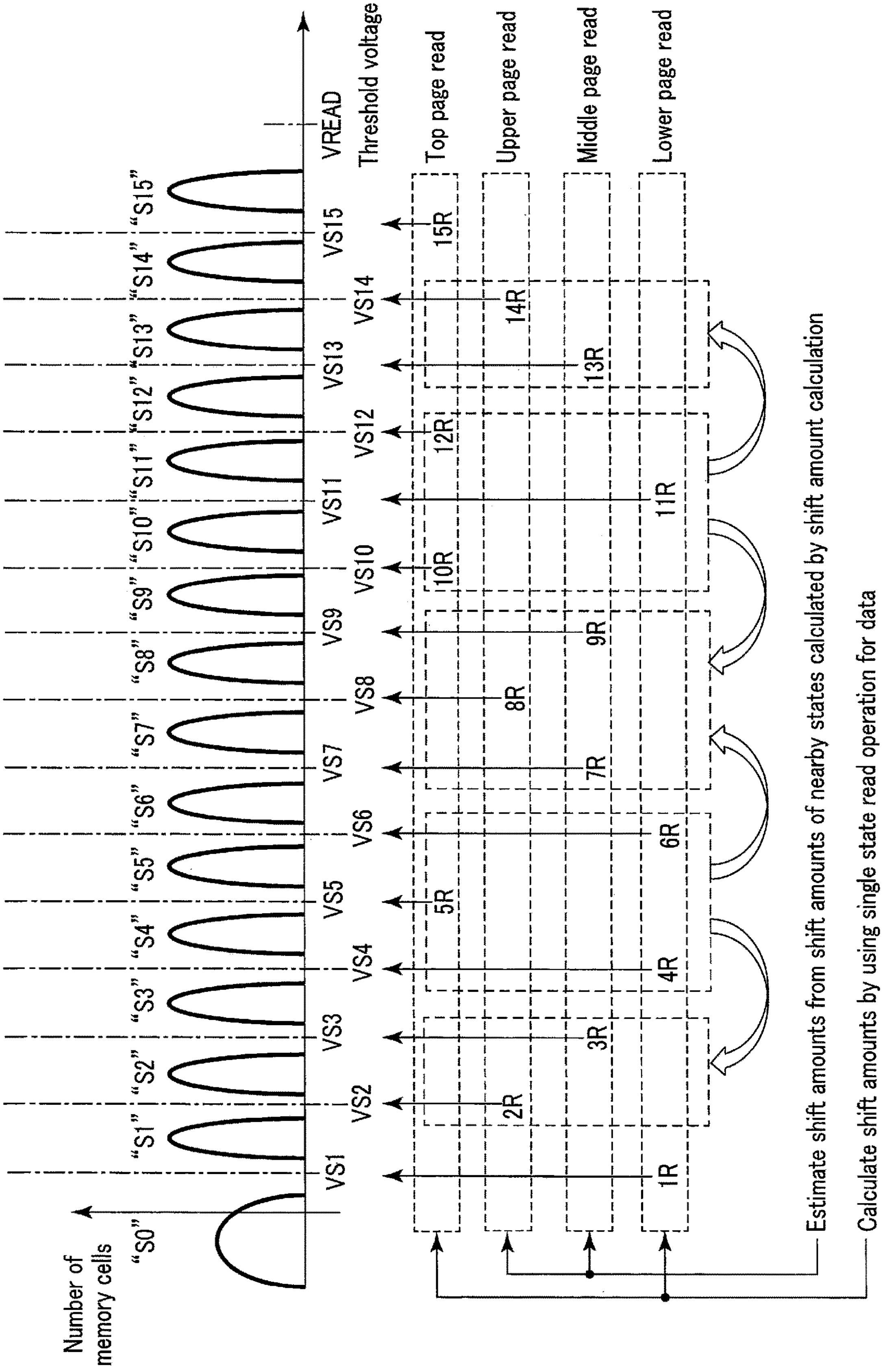
FIG. 40 schematically illustrates a process of the shift amount estimation in the lower page and top page read operations in the memory system according to the sixth embodiment.

6.3 Shift Amount Estimation Based on the Lower Page and Top Page Read Operations FIG. 40 is a schematic diagram for describing the shift amount estimation based on the lower page and top page read operations in the memory system according to the sixth embodiment.

As illustrated in FIG. 40, the shift amount estimation is a process of estimating the shift amounts Δ of seven kinds of read voltages which are used in the middle page and upper page read operations, based on the eight kinds of read voltages which were calculated by the shift amount calculation for the use in the lower page and top page read operations. Specifically, in the shift amount estimation, the shift amounts Δ of the read voltages VS2, VS3, VS7 to VS9, VS13 and VS14 are estimated based on the shift amounts Δ of the read operation VS1, VS4 to VS6, VS10 to VS12, and VS15.

Note that, among the threshold voltage distributions of the "S0" state to "S15" state, the distribution of the "S0" state with the lowest threshold voltage and the distribution of the "S15" state with the highest threshold voltage may vary with different tendencies from the other threshold voltage distributions. Thus, in the shift amount estimation, it is preferable to give no consideration to the shift amounts Δ of the voltages VS1 and VS15 which define the widths of the threshold voltage distributions of the "S0" state and "S15" state. Specifically, in the shift amount estimation, it is preferable to estimate the shift amounts Δ of the read voltages VS2, VS3, VS7 to VS9, VS13 and VS14, based on the shift amounts Δ of the read operations VS4 to VS6, and VS10 to VS12. Hereinafter, an example of the shift amount estimation will be illustrated.

The widths (ranges of dominant threshold voltages) of the threshold voltage distributions of the "S4" state, "S5" state, "S10" state and "S11" state can be defined, respectively, by the difference between the voltages VS4 and VS5 to which the corresponding shift amounts Δ were applied, the difference between the voltages VS5 and VS6 to which the corresponding shift amounts Δ were applied, the difference between the voltages VS10 and VS11 to which the corresponding shift amounts Δ were applied, and the difference between the voltages VS11 and VS12 to which the corresponding shift amounts Δ were applied. Thus, the widths of the threshold voltage distributions of the "S4" state, "S5" state, "S10" state and "S11" state can be defined by the shift amounts Δ calculated by the shift amount calculation.

On the other hand, the widths of the threshold voltage distributions of the "S3" state, "S6" state, "S9" state and "S12" state, which neighbor the "S4" state, "S5" state, "S10" state and "S11" state, respectively, can be defined, respectively, by the difference between the voltages VS3 and VS4 to which the corresponding shift amounts Δ were applied, the difference between the voltages VS6 and VS7 to which the corresponding shift amounts Δ were applied, the difference between the voltages VS9 and VS10 to which the corresponding shift amounts Δ were applied, and the difference between the voltages VS12 and VS13 to which the corresponding shift amounts Δ were applied.

In addition, the widths of the threshold voltage distributions of the "S2" state, "S7" state or "S8" state, and "S13" state, which neighbor the "S4" state, "S5" state, "S10" state and "S11" state with one threshold voltage distribution interposed, respectively, can be defined, respectively, by the difference between the voltages VS2 and VS3 to which the corresponding shift amounts Δ were applied, the difference between the voltages VS7 and VS8 to which the corresponding shift amounts Δ were applied or the difference between the voltages VS8 and VS9 to which the corresponding shift amounts Δ were applied, and the difference between the voltages VS13 and VS14 to which the corresponding shift amounts Δ were applied.

In one example of the shift amount estimation according to the sixth embodiment, it is assumed that, for instance, two mutually neighboring threshold voltage distributions among the "S1" state to "14" state have an equal width. Specifically, the threshold voltage distributions of the "S3" state, "S6" state, "S9" state and "S12" state can be regarded as being distributed with the same widths as the "S4" state, "S5" state, "S10" state and "S11" state, respectively. Thereby, the difference between the voltages VS3 and VS4 to which the corresponding shift amounts Δ were applied, the difference between the voltages VS6 and VS7 to which the corresponding shift amounts Δ were applied, the difference between the voltages VS9 and VS10 to which the corresponding shift amounts Δ were applied, and the difference between the voltages VS12 and VS13 to which the corresponding shift amounts Δ were applied, can be regarded as being equal to the difference between the voltages VS4 and VS5 to which the corresponding shift amounts Δ were applied, the difference between the voltages VS5 and VS6 to which the corresponding shift amounts Δ were applied, the difference between the voltages VS10 and VS11 to which the corresponding shift amounts Δ were applied, and the difference between the voltages VS11 and VS12 to which the corresponding shift amounts Δ were applied. Accordingly, the shift amounts Δ of the voltages VS3, VS7, VS9 and VS13 can be estimated based on the shift amounts Δ of the voltages VS4 to VS6, and VS10 to VS12.

In addition, the threshold voltage distributions of the "S2" state, "S7" state, "S8" state and "S13" state can be regarded as being distributed with the same widths as the "S3" state, "S6" state, "S9" state and "S12" state, respectively. Thereby, the difference between the voltages VS2 and VS3 to which the corresponding shift amounts Δ were applied, the difference between the voltages VS7 and VS8 to which the corresponding shift amounts Δ were applied, the difference between the voltages VS8 and VS9 to which the corresponding shift amounts Δ were applied, and the difference between the voltages VS13 and VS14 to which the corresponding shift amounts Δ were applied, can similarly be regarded as being equal to the difference between the voltages VS4 and VS5 to which the corresponding shift amounts Δ were applied, the difference between the voltages VS5 and VS6 to which the corresponding shift amounts Δ were applied, the difference between the voltages VS10 and VS11 to which the corresponding shift amounts Δ were applied, and the difference between the voltages VS11 and VS12 to which the corresponding shift amounts Δ were applied. Accordingly, the shift amounts Δ of the voltages VS2, VS8 and VS13 can further be estimated based on the shift amounts Δ of the voltages VS4 to VS6, and VS10 to VS12.

In the shift amount estimation, aside from the above-described example, other examples are applicable. For example, the variation ratio of the width between mutually neighboring threshold voltage distributions among the “S1” state to “S14” state may be regarded as being equal. In this case, for example, the variation ratio of the width between the threshold voltage distributions of the “S4” state and “S5” state is regarded as being equal to the variation ratio of the width between the threshold voltage distributions of the “S3” state and “S4” state, and thereby the shift amount Δ of the voltage VS3 can be estimated. In addition, the variation ratio of the width between the threshold voltage distributions of the “S3” state and “S4” state can be regarded as being equal to the variation ratio of the width between the threshold voltage distributions of the “S2” state and “S3” state, and thereby the shift amount Δ of the voltage VS2 can further be estimated.

6.4 Advantageous Effects of the Sixth Embodiment

According to the sixth embodiment, the memory controller 100 executes the shift read operation for two pages, i.e. the lower page and top page, and executes the three kinds of single state read operations. Thereby, the read voltage correction circuit 180 can calculate the shift amounts Δ of the eight kinds of read voltages and can estimate the shift amounts Δ of the other seven kinds of read voltages. Thus, the read voltages for the four pages can be corrected by the read operations for substantially two pages. Thereby, an increase of latency due to the read voltage correction can be suppressed.

Among the read voltages whose shift amounts Δ are estimated by the shift amount estimation, the four kinds of voltages VS3, VS7, VS9 and VS13 corresponding to the middle page neighbor the voltages VS4, VS6, VS10 and VS12 which are calculated by the shift amount calculation. Thus, the shift amounts Δ can be estimated with relatively high precision. On the other hand, among the read voltages whose shift amounts Δ are estimated by the shift amount estimation, the three kinds of voltages VS2, VS8 and VS14 corresponding to the upper page are separated by two levels from the voltages VS4, VS6 or VS10, and VS12 which are calculated by the shift amount calculation. Thus, there is a possibility that the precision of estimation of the shift amounts Δ becomes lower than in the case of the four voltages corresponding to the middle page. However, as described above, the data of the upper page can be determined by dividing the threshold voltages into four regions by the three kinds of read voltages. Thus, a margin for errors of read voltages can be made greater than in the case of the other pages in which data needs to be determined by dividing the threshold voltages into five regions by the four kinds of read voltages. Accordingly, the shift amounts Δ of the seven kinds of read voltages can be estimated with proper precision in relation to tolerable errors which the respective read voltages have.

7. Modifications

The various embodiments and modifications have been described above. However, the embodiments and modifications are not restrictive, and further various modifications can be applied as needed.

7.1. Another First Modification

For example, in the first embodiment to sixth embodiment, the case was described in which, at the time of executing the error correction process by the ECC circuit 160, the shift amount calculation is executed when the error correction was successful. However, this is not restrictive. Specifically, when an error correction process by hard bit decoding using LDPC codes or soft bit decoding using error correction codes including LDPC codes was executed in the ECC circuit 160, the read voltage correction circuit 180 may execute the shift amount calculation even when the error correction failed. Hereinafter, an example using soft bit decoding will be described, but this is not restrictive.

Figure 41:
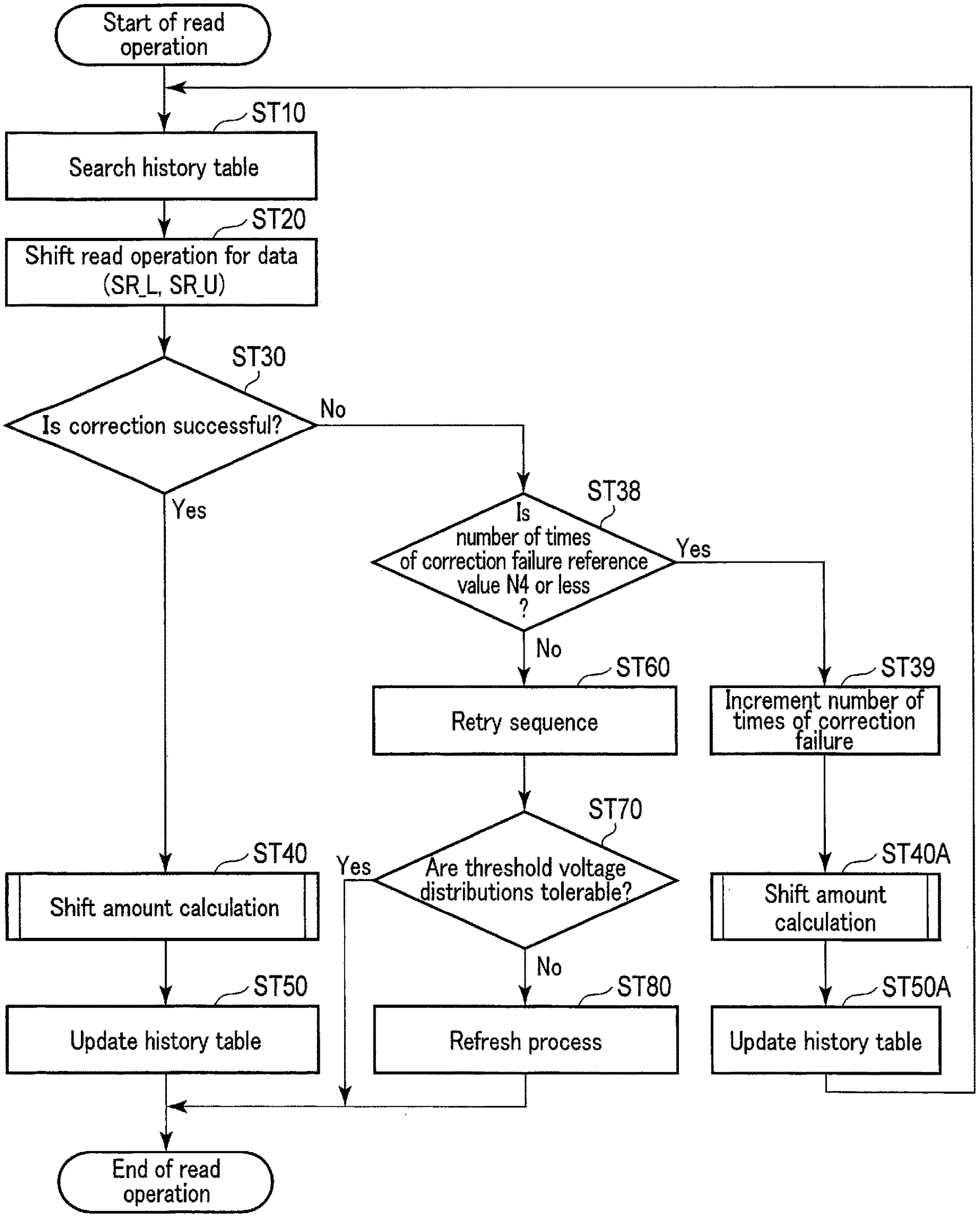
FIG. 41 is a flowchart of another read operation which includes a shift amount calculation in a memory system according to another first modification.

FIG. 41 is a flowchart for describing a read operation which includes a shift amount calculation in a memory system according to another first modification. FIG. 41 corresponds to FIG. 9 which was described in the first embodiment, and steps ST38, ST39, ST40A and ST50A are added. In FIG. 41, the case is assumed in which the ECC circuit 160 executes an error correction process by soft bit decoding.

As illustrated in FIG. 41, since the process up to step ST20 is the same as in the case of FIG. 9, a description thereof is omitted.

In step ST30, when the error correction process by soft bit decoding was successful (step ST30; yes), the ECC circuit 160 stores post-error-correction read data EXP in the buffer memory 181 for read voltage correction. Then, the process advances to step ST40. On the other hand, in step ST30, when the error correction process by soft bit decoding failed (step ST30; no), the ECC circuit 160 stores post-error-correction-trial read data EXP' in the buffer memory 181 for read voltage correction. Then, the process advances to step ST38.

The post-error-correction-trial read data EXP' is data in which some bits with data, which was determined to be highly possibly erroneous by the soft bit decoding, are inverted. In other words, the post-error-correction-trial read data EXP' is data in which some of erroneously read bits were error-corrected.

In step ST38, the memory controller 100 determines whether or not to execute the shift amount calculation, in accordance with the number of times of failure in error correction (“correction failure number”). Specifically, when the correction failure number is a reference value N4 or less (step ST38; yes), the memory controller 100 determines that a correction effect of read voltages can be expected by the shift amount calculation, and the process advances to step ST39. Then, in step ST39, the memory controller 100 increments the correction failure number, and the process advances to steps ST40A and ST50A. Since the process of steps ST40A and ST50A is the same as the process of steps ST40 and ST50, a description thereof is omitted. After the end of step ST50A, the process returns to step ST10.

On the other hand, when the correction failure number is greater than the reference value N4 (step ST38; no), the memory controller 100 determines that a correction effect of read voltages cannot be expected by the execution of the shift amount calculation, and the process advances to step ST60.

Since the process of steps ST40 to ST80 is the same as in the case of FIG. 9, a description thereof is omitted.

By the above-described operation, even when the error correction process failed, the shift amount calculation can be executed. In addition, the refresh process can be executed when the read voltages are not improved by the shift amount calculation using the post-error-correction-trial data EXP'.

Note that although the example in FIG. 41 was described as a modification of the first embodiment, this is not restrictive. For example, the soft bit decoding may also be executed in the error correction processes of the second embodiment to the sixth embodiment, and thereby the shift amount calculation can be executed even when the error correction process failed.

7.2 Another Second Modification

In the first to sixth embodiment and the another first modification, the case was described in which one read voltage correction circuit is provided for a plurality of channels CH. However, this is not restrictive. Specifically, one read voltage correction circuit may be provided for each of channels CH.

Figure 42:
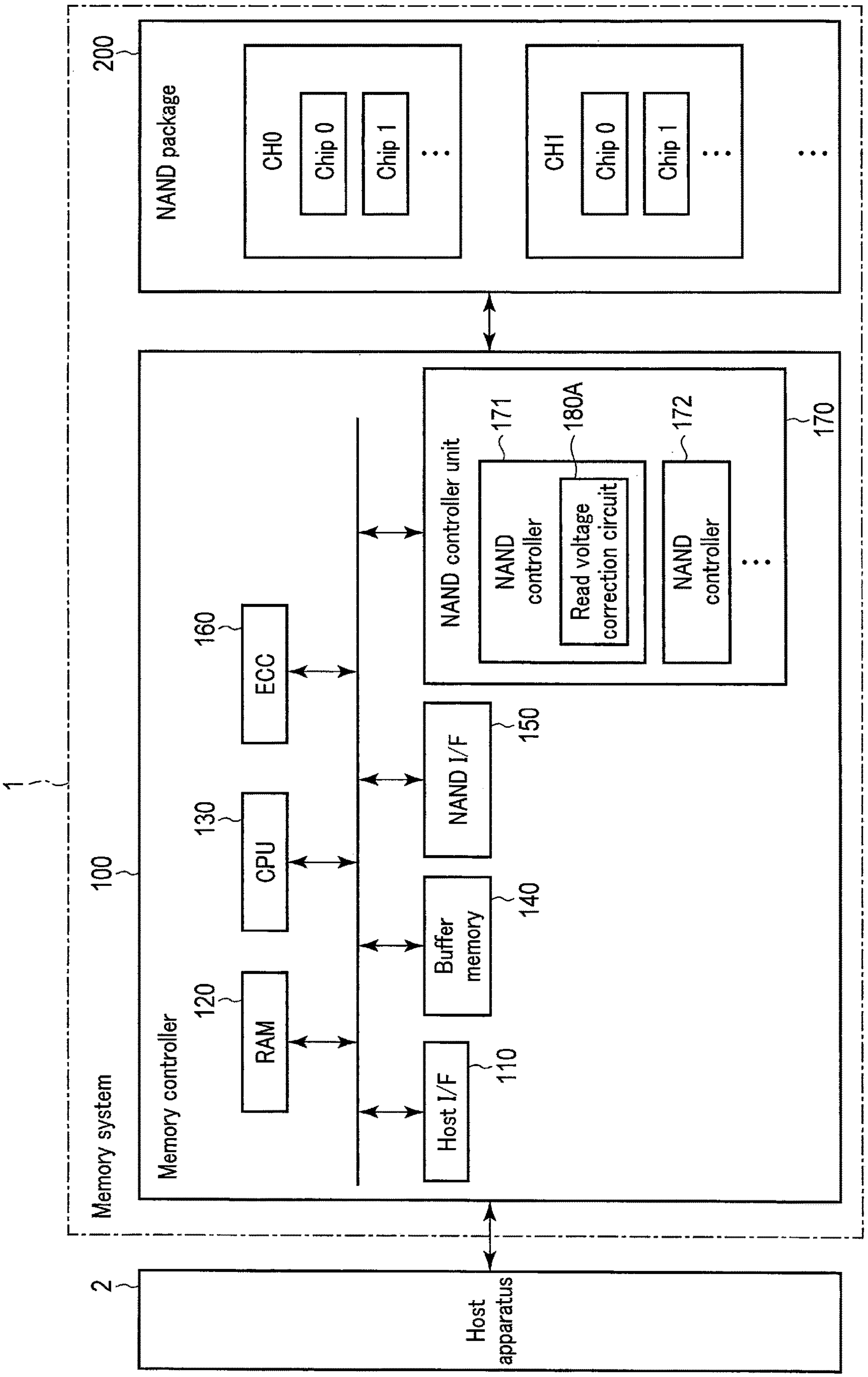
FIG. 42 illustrates a block diagram of a memory system according to another second modification.

FIG. 42 is a block diagram for describing a configuration including a memory system according to another second modification.

As illustrated in FIG. 42, one read voltage correction circuit 180A is provided in each of a plurality of NAND controllers 171, 172, . . . , in the controllers 170.

By the above configuration, for example, when an instruction (host read operation instruction) to simultaneously read data for a plurality of channels CH was received, shift amounts Δ can be calculated in parallel for each data which was read from the channels CH.

7.3 Others

Moreover, in the first embodiment to sixth embodiment, the another first modification and the another second modification, the configuration was described in which the read voltage correction circuit 180 or 180A includes the estimation index calculation circuit 184 and shift amount calculation circuit 185. However, this is not restrictive. For example, the read voltage correction circuit 180 or 180A may be configured not to include the estimation index calculation circuit 184 and shift amount calculation circuit 185. In this case, the functions of the estimation index calculation circuit 184 and shift amount calculation circuit 185 may be realized, for example, by the processor 130 executing the firmware stored in the RAM 120.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A memory system comprising:

a nonvolatile memory including first to x-th word lines and first to x-th memory groups, a y-th memory group of the first to the x-th memory groups being connected to a y-th word line of the first to x-th word lines, each of the memory groups including a plurality of memory cells, each of the plurality of memory cells being capable of storing m-bit data, x being a natural number of two or more, y being a natural number of one or more and x or less, m being a natural number of two or more; and a memory controller configured to store the m-bit data in the memory cell by correlating the m-bit data with first to n-th threshold voltage regions, a (k+1)-th threshold voltage region having a higher voltage level than a k-th threshold voltage region, n being a natural number of m-th power of two, k being a natural number of one or more and (n−1) or less, wherein the memory controller is configured to repeat a first processing, the first processing includes first to x-th internal processing, a y-th internal processing of the first to the x-th internal processing includes reading data from the y-th memory group as a first data set using a read voltage, generating a second data set by an error correction on the read first data set, and executing a second processing, the second processing includes counting a first number and a second number, the first number being a number of first memory cells corresponding to a first combination of first data in the first data set and second data in the second data set, the second number being a number of second memory cells corresponding to a second combination of third data in the first data set and fourth data in the second data set, the first memory cells being among the y-th memory group, the second memory cells being among the y-th memory group, the second data corresponding to the first data, the fourth data corresponding to the third data, calculating a ratio of the second number to the first number to calculate a shift amount of the read voltage, determining a polarity of the shift amount according to the ratio, determining a magnitude of an absolute value of shift according to a magnitude of an absolute value of the ratio, and determining the read voltage based on the calculated shift amount of the read voltage, the memory controller is, in a next first processing, configured to read data from the y-th memory group as the first data set using the determined read voltage, and the memory controller is configured:

to calculate a number of fail bits using the read first data set and the second data set, and not to perform the second processing when the calculated number of fail bits is smaller than a certain value.

2. A memory system comprising:

a nonvolatile memory including first to x-th word lines and first to x-th memory groups, a y-th memory group of the first to the x-th memory groups being connected to a y-th word line of the first to x-th word lines, each of the memory groups including a plurality of memory cells, each of the plurality of memory cells being capable of storing m-bit data, x being a natural number of two or more, y being a natural number of one or more and x or less, m being a natural number of two or more; and a memory controller configured to store the m-bit data in the memory cell by correlating the m-bit data with first to n-th threshold voltage regions, a (k+1)-th threshold voltage region having a higher voltage level than a k-th threshold voltage region, n being a natural number of m-th power of two, k being a natural number of one or more and (n−1) or less, wherein the memory controller is configured to repeat a first processing, the first processing includes first to x-th internal processing, a y-th internal processing of the first to the x-th internal processing includes reading data from the y-th memory group as a first data set using a read voltage, generating a second data set by an error correction on the read first data set, and executing a second processing, the second processing includes counting a first number and a second number, the first number being a number of first memory cells corresponding to a first combination of first data in the first data set and second data in the second data set, the second number being a number of second memory cells corresponding to a second combination of third data in the first data set and fourth data in the second data set, the first memory cells being among the y-th memory group, the second memory cells being among the y-th memory group, the second data corresponding to the first data, the fourth data corresponding to the third data, calculating a ratio of the second number to the first number to calculate a shift amount of the read voltage, determining a polarity of the shift amount according to the ratio, determining a magnitude of an absolute value of shift according to a magnitude of an absolute value of the ratio, and determining the read voltage based on the calculated shift amount of the read voltage, the memory controller is, in a next first processing, configured to read data from the y-th memory group as the first data set using the determined read voltage, and each of the memory groups corresponds to m pages.

3. A memory system comprising:

a nonvolatile memory including first to x-th word lines and first to x-th memory groups, a y-th memory group of the first to the x-th memory groups being connected to a y-th word line of the first to x-th word lines, each of the memory groups including a plurality of memory cells, each of the plurality of memory cells being capable of storing m-bit data, x being a natural number of two or more, y being a natural number of one or more and x or less, m being a natural number of two or more; and a memory controller configured to store the m-bit data in the memory cell by correlating the m-bit data with first to n-th threshold voltage regions, a (k+1)-th threshold voltage region having a higher voltage level than a k-th threshold voltage region, n being a natural number of m-th power of two, k being a natural number of one or more and (n−1) or less, wherein the memory controller is configured to repeat a first processing, the first processing includes first to x-th internal processing, a y-th internal processing of the first to the x-th internal processing includes reading data from the y-th memory group as a first data set using a read voltage, generating a second data set by an error correction on the read first data set, and executing a second processing, the second processing includes counting a first number and a second number, the first number being a number of first memory cells corresponding to a first combination of first data in the first data set and second data in the second data set, the second number being a number of second memory cells corresponding to a second combination of third data in the first data set and fourth data in the second data set, the first memory cells being among the y-th memory group, the second memory cells being among the y-th memory group, the second data corresponding to the first data, the fourth data corresponding to the third data, calculating a ratio of the second number to the first number to calculate a shift amount of the read voltage, determining a polarity of the shift amount according to the ratio, determining a magnitude of an absolute value of shift according to a magnitude of an absolute value of the ratio, and determining the read voltage based on the calculated shift amount of the read voltage, the memory controller is, in a next first processing, configured to read data from the y-th memory group as the first data set using the determined read voltage, and the read voltage is applied to the y-th word line to read the data from the y-th memory group.

4. A memory system comprising:

a nonvolatile memory including first to x-th word lines and first to x-th memory groups, a y-th memory group of the first to the x-th memory groups being connected to a y-th word line of the first to x-th word lines, each of the memory groups including a plurality of memory cells, each of the plurality of memory cells being capable of storing m-bit data, x being a natural number of two or more, y being a natural number of one or more and x or less, m being a natural number of two or more; and a memory controller configured to store the m-bit data in the memory cell by correlating the m-bit data with first to n-th threshold voltage regions, a (k+1)-th threshold voltage region having a higher voltage level than a k-th threshold voltage region, n being a natural number of m-th power of two, k being a natural number of one or more and (n−1) or less, wherein the memory controller is configured to repeat a first processing, the first processing includes first to x-th internal processing, a y-th internal processing of the first to the x-th internal processing includes reading data from the y-th memory group as a first data set using a read voltage, generating a second data set by an error correction on the read first data set, and executing a second processing, the second processing includes counting a first number and a second number, the first number being a number of first memory cells corresponding to a first combination of first data in the first data set and second data in the second data set, the second number being a number of second memory cells corresponding to a second combination of third data in the first data set and fourth data in the second data set, the first memory cells being among the y-th memory group, the second memory cells being among the y-th memory group, the second data corresponding to the first data, the fourth data corresponding to the third data, calculating a ratio of the second number to the first number to calculate a shift amount of the read voltage, determining a polarity of the shift amount according to the ratio, determining a magnitude of an absolute value of shift according to a magnitude of an absolute value of the ratio, and determining the read voltage based on the calculated shift amount of the read voltage, the memory controller is, in a next first processing, configured to read data from the y-th memory group as the first data set using the determined read voltage, the memory controller includes a buffer memory, the y-th internal processing includes storing the read first data set in the buffer memory, and storing the generated second data set in the buffer memory, the first number is counted using the first data set in the buffer memory and the second data set in the buffer memory, and the second number is counted using the first data set in the buffer memory and the second data set in the buffer memory.

5. The memory system of claim 4, wherein the buffer memory is SRAM.

6. A memory system of comprising:

a nonvolatile memory including first to x-th word lines and first to x-th memory groups, a y-th memory group of the first to the x-th memory groups being connected to a y-th word line of the first to x-th word lines, each of the memory groups including a plurality of memory cells, each of the plurality of memory cells being capable of storing m-bit data, x being a natural number of two or more, y being a natural number of one or more and x or less, m being a natural number of two or more; and a memory controller configured to store the m-bit data in the memory cell by correlating the m-bit data with first to n-th threshold voltage regions, a (k+1)-th threshold voltage region having a higher voltage level than a k-th threshold voltage region, n being a natural number of m-th power of two, k being a natural number of one or more and (n−1) or less, wherein the memory controller is configured to repeat a first processing, the first processing includes first to x-th internal processing, a y-th internal processing of the first to the x-th internal processing includes reading data from the y-th memory group as a first data set using a read voltage, generating a second data set by an error correction on the read first data set, and executing a second processing, the second processing includes counting a first number and a second number, the first number being a number of first memory cells corresponding to a first combination of first data in the first data set and second data in the second data set, the second number being a number of second memory cells corresponding to a second combination of third data in the first data set and fourth data in the second data set, the first memory cells being among the y-th memory group, the second memory cells being among the y-th memory group, the second data corresponding to the first data, the fourth data corresponding to the third data, calculating a ratio of the second number to the first number to calculate a shift amount of the read voltage, determining a polarity of the shift amount according to the ratio, determining a magnitude of an absolute value of shift according to a magnitude of an absolute value of the ratio, and determining the read voltage based on the calculated shift amount of the read voltage, the memory controller is, in a next first processing, configured to read data from the y-th memory group as the first data set using the determined read voltage, and the reading data from the y-th memory group as the first data set includes:

reading a third data set from the y-th memory group by using a first voltage and a second voltage;

reading a first single state data set from the y-th memory group by using a third voltage between the first voltage and the second voltage; and extracting, from the third data set, bits corresponding to a first value of the first single state data set as the first data set.

7. The memory system of claim 6, wherein the reading data from the y-th memory group as the first data set further includes:

generating a first expected data set by an error correction on the third data set; and extracting, from the first expected data set, bits corresponding to the first value of the first single state data set as the second data set.

8. The memory system of claim 7, wherein the memory controller includes a buffer memory, and the reading data from the y-th memory group as the first data set further includes:

storing, in the buffer memory, the third data set, the first expected data set, and the first single state data set.

9. The memory system of claim 6, wherein the memory controller includes a buffer memory, the reading data from the y-th memory group as the first data set further includes:

storing the third data set in the buffer memory;

storing the first single state data set in the buffer memory;

generating a first expected data set by an error correction on the third data set in the buffer memory;

storing the first expected data set in the buffer memory; and extracting, from the first expected data set in the buffer memory, bits corresponding to the first value of the first single state data set in the buffer memory as the second data set.

10. The memory system of claim 6, wherein the m is three.

11. The memory system of claim 10, wherein the first voltage is between a first threshold voltage region and a second threshold voltage region, and the second voltage is between a fifth threshold voltage region and a sixth threshold voltage region.

12. The memory system of claim 6, wherein the m is four.

13. The memory system of claim 12, wherein the first voltage is between a first threshold voltage region and a second threshold voltage region, and the second voltage is between a fourth threshold voltage region and a fifth threshold voltage region.

* * * * *